United States Patent
Bai et al.

(10) Patent No.: US 10,461,921 B2
(45) Date of Patent: *Oct. 29, 2019

(54) APPARATUS AND METHOD FOR CLOCK RECOVERY

(71) Applicant: PHOTONIC TECHNOLOGIES (SHANGHAI) CO., LTD., Shanghai (CN)

(72) Inventors: Rui Bai, Shanghai (CN); Xuefeng Chen, Shanghai (CN); Wenzong Pan, Shanghai (CN); Xin Wang, Shanghai (CN); Tao Xia, Shanghai (CN); Shang Hu, Shanghai (CN); Zhichun Wang, Shanghai (CN); Yuanxi Zhang, Shanghai (CN); Wenjun He, Shanghai (CN); Juncheng Wang, Shanghai (CN); Patrick Yin Chiang, Shanghai (CN)

(73) Assignee: PHOTONIC TECHNOLOGIES (SHANGHAI) CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/386,283

(22) Filed: Apr. 17, 2019

(65) Prior Publication Data

US 2019/0243408 A1 Aug. 8, 2019

Related U.S. Application Data

(63) Continuation of application No. PCT/CN2017/096827, filed on Aug. 10, 2017.

(51) Int. Cl.
    *H04L 7/033* (2006.01)
    *H04L 7/02* (2006.01)
    (Continued)

(52) U.S. Cl.
    CPC .............. *H04L 7/0331* (2013.01); *G06F 1/06* (2013.01); *G06F 1/12* (2013.01); *H03K 19/21* (2013.01);
    (Continued)

(58) Field of Classification Search
    CPC ... H04L 7/033; H04L 25/4902; H04L 7/0331; H04L 7/0037; H04L 7/0087; H04L 7/02;
    (Continued)

(56) References Cited

U.S. PATENT DOCUMENTS

| 6,219,380 B1 | 4/2001 | Wang et al. |
| 7,570,721 B2 * | 8/2009 | Sander ................. G01R 23/005 375/343 |

(Continued)

FOREIGN PATENT DOCUMENTS

| CN | 1790950 A | 6/2006 |
| CN | 102340346 A | 2/2012 |
| WO | 0176166 A2 | 10/2001 |

*Primary Examiner* — Kenneth T Lam
(74) *Attorney, Agent, or Firm* — Rui Wu

(57) ABSTRACT

An apparatus comprises a plurality of sampling circuits configured to receive a non-Non Return to Zero (non-NRZ) data signal; and a control circuit coupled to the plurality of sampling circuits, wherein the control circuit is configured to provide one or more control signals indicating whether to decrease or increase a frequency of a clock signal associated with the non-NRZ data signal based on the non-NRZ data signal.

17 Claims, 26 Drawing Sheets

(51) Int. Cl.
*H03L 7/08* (2006.01)
*H03K 19/21* (2006.01)
*H03L 7/099* (2006.01)
*H03L 7/087* (2006.01)
*G06F 1/06* (2006.01)
*G06F 1/12* (2006.01)
*H03L 7/091* (2006.01)
*H03L 7/093* (2006.01)
*H04B 14/02* (2006.01)
*H04L 25/49* (2006.01)
*H04L 7/00* (2006.01)
*H04B 10/25* (2013.01)
*H04B 10/548* (2013.01)
*H03L 7/089* (2006.01)
*H03K 19/20* (2006.01)

(52) U.S. Cl.
CPC ............ *H03L 7/0807* (2013.01); *H03L 7/087* (2013.01); *H03L 7/091* (2013.01); *H03L 7/093* (2013.01); *H03L 7/099* (2013.01); *H04B 10/25* (2013.01); *H04B 10/548* (2013.01); *H04B 14/026* (2013.01); *H04L 7/0037* (2013.01); *H04L 7/0087* (2013.01); *H04L 7/02* (2013.01); *H04L 7/033* (2013.01); *H04L 25/4902* (2013.01); *H03K 19/20* (2013.01); *H03L 7/0891* (2013.01)

(58) Field of Classification Search
CPC ....... H03L 7/091; H03L 7/0807; H03L 7/093; H03L 7/099; H03L 7/087; H03L 7/0891; H04B 14/026; H04B 10/25; H04B 10/548; G06F 1/06; G06F 1/12; H03K 19/20; H03K 19/21
See application file for complete search history.

(56) References Cited

U.S. PATENT DOCUMENTS

| | | | | |
|---|---|---|---|---|
| 2003/0102928 A1* | 6/2003 | d'Haene | ............... | H03D 13/003 331/172 |
| 2006/0067452 A1* | 3/2006 | Xu | ........................ | H03L 7/091 375/376 |
| 2007/0166047 A1* | 7/2007 | Berger | ................... | H04B 10/67 398/155 |
| 2008/0048904 A1* | 2/2008 | Lee | ........................ | H03L 7/0891 341/187 |
| 2011/0311010 A1* | 12/2011 | Huang | .................. | H03L 7/0807 375/359 |
| 2012/0062291 A1* | 3/2012 | Saitoh | ..................... | H04L 7/033 327/157 |
| 2012/0139593 A1* | 6/2012 | Saito | ........................ | H03L 7/087 327/156 |
| 2013/0120036 A1* | 5/2013 | Zhu | ........................ | H03L 7/0805 327/156 |
| 2017/0244416 A1* | 8/2017 | Lakshmikumar | ..... | H03L 7/0807 |

* cited by examiner

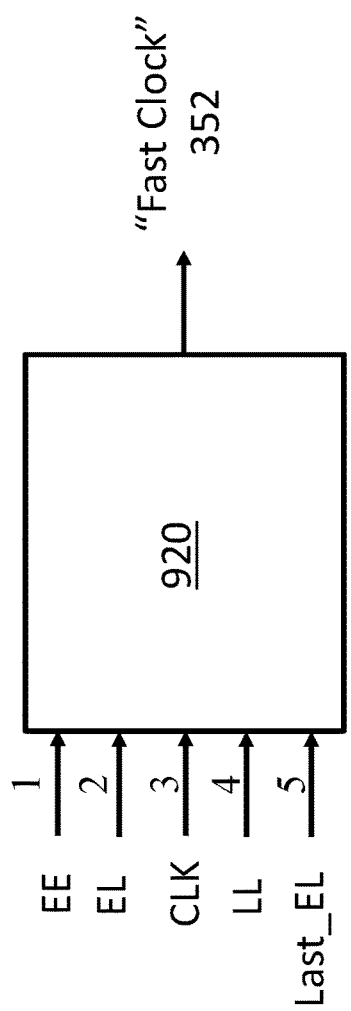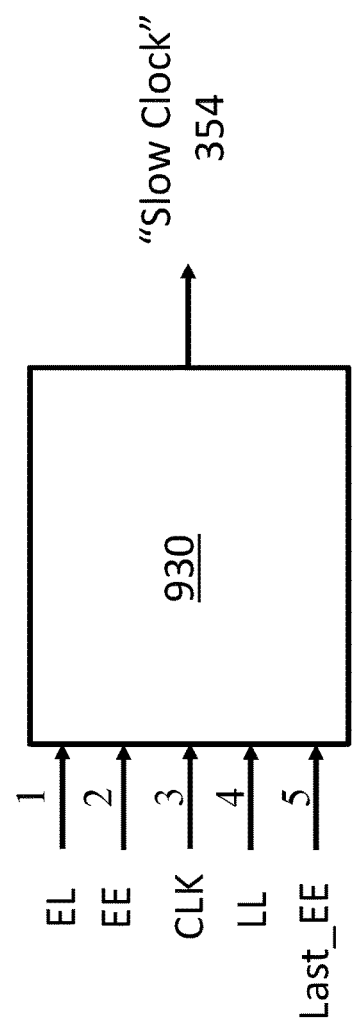

APPARATUS AND METHOD FOR CLOCK RECOVERY

CROSS REFERENCE TO RELATED APPLICATION

This application is a continuation of PCT patent application No. PCT/CN2017/096827, filed Aug. 10, 2017, entitled "A Clock and Data Recovery Circuit," which is hereby incorporated by reference in its entirety.

BACKGROUND

1. Technical Field

The present disclosure relates generally to methods and apparatuses for clock and data recovery (CDR). In particular, the present disclosure relates to methods and apparatuses suitable for recovering a clock signal upon receipt of an input data signal, and further providing a retimed data signal based on the clock signal and the input data signal.

2. Discussion of Technical Background

A CDR circuit has been widely used in a telecommunication system. Upon receipt of a Non Return to Zero (NRZ) data signal, the CDR circuit may be used to recover a clock signal associated with the NRZ data signal, and further retime the received NRZ data signal based on the recovered clock signal. Alternatively or in addition to a phase-locked loop (PLL) circuit, a frequency-locked loop (FLL) circuit may be included in the CDR circuit to perform the clock recovery operation. The FLL circuit may be used to lock a frequency of the clock signal to a frequency of the NRZ data signal. Alternatively, the FLL circuit, in some other configurations, may be used to lock the frequency of the clock signal to a division of the frequency of the NRZ data signal.

SUMMARY

A regular approach to implement the FLL circuit may be based on a reference clock signal provided to the FLL circuit. The reference clock signal may have a frequency which is close to the frequency of the input data signal. Alternatively, the reference clock may have the frequency which is close to the division of the frequency of the input data signal. The requirement for the reference clock signal may, however, add complexity and cost to the FLL circuit. Therefore, a need exists for an improved approach to implement the reference-less CDR circuit, or the FLL circuit without the requirement for the reference clock signal (i.e., a reference-less FLL circuit).

The existing approach to implement the reference-less CDR circuit, or the reference-less FLL circuit may be based on sampling the clock signal provided by a voltage controlled oscillator (VCO) in the FLL circuit according to the input data signal. In this approach, the clock signal may be sampled by one or more D-type flip flops at the transition edge (e.g., the rising edge or the falling edge) of the input data signal. Alternatively or in addition, the clock signal may be further sampled by one or more D-type flip flops at the transition edge of a delayed copy of the input data signal. Then the clock signal may be recovered based on the sampled clock signals. As such, the input data signal may be limited to the NRZ data signal in order to appropriately trigger the D-type flip flop. In other words, this approach can only be applied to recover the clock signal associated with the input NRZ data signal, not other input data signals. Thus, a need exists for an improved approach that applies to a non-limiting input data signal.

The present disclosure describes methods and apparatuses for reference-less clock and data recovery. In particular, the present disclosure relates to methods and apparatuses suitable for recovering a clock signal upon receipt of an input data signal, and further providing a retimed data signal based on the clock signal and the input data signal. The input data signal can be any input signal having any modulation format. For example, the input data signal may be an NRZ data signal. For another example, the input data signal may not be an NRZ data signal.

In an exemplary embodiment, there is provided an apparatus comprising: a plurality of sampling circuits configured to receive a non-NRZ data signal; and a control circuit coupled to the plurality of sampling circuits, wherein the control circuit is configured to provide one or more control signals indicating whether to decrease or increase a frequency of a clock signal associated with the non-NRZ data signal based on the non-NRZ data signal.

In another exemplary embodiment, there is provided an apparatus comprising: a plurality of sampling circuits configured to generate a plurality of sampled signals by sampling a data signal according to different clock signals; and a control circuit coupled to the plurality of sampling circuits, wherein the control circuit is configured to provide one or more control signals indicating whether to decrease or increase a frequency of one of the different clock signals based on the plurality of sampled signals.

In yet another exemplary embodiment, there is provided a method comprising: generating a plurality of sampled signals by sampling a data signal according to different clock signals; and providing one or more control signals indicating whether to decrease or increase a frequency of one of the different clock signals based on the plurality of sampled signals.

In yet another exemplary embodiment, there is provided an apparatus comprising: a plurality of sampling circuits configured to receive a non-NRZ data signal; and a signal generator coupled to the plurality of sampling circuits, wherein the signal generator is configured to generate a recovered clock signal based on the non-NRZ data signal, a frequency of the recovered clock signal being within a threshold range associated with a frequency of the non-NRZ data signal or a division of the frequency of the non-NRZ data signal.

In yet another exemplary embodiment, there is provided an apparatus comprising: a plurality of sampling circuits configured to generate a plurality of sampled signals by sampling a data signal according to different clock signals; and a signal generator coupled to the plurality of sampling circuits, wherein the signal generator is configured to generate a recovered clock signal based on the plurality of sampled signals, a frequency of the recovered clock signal being within a threshold range associated with a frequency of the data signal or a division of the frequency of the data signal.

In yet another exemplary embodiment, there is provided a method comprising: providing one or more control signals indicating whether to decrease or increase a frequency of a clock signal associated with a non-NRZ data signal based on the non-NRZ data signal.

In yet another exemplary embodiment, there is provided a method comprising: generating a recovered clock signal based on a non-NRZ data signal, a frequency of the recovered clock signal being within a threshold range associated with a frequency of the non-NRZ data signal or a division of the frequency of the non-NRZ data signal.

Other concepts relate to a software product, in accord with this concept, includes at least one machine-readable non-transitory medium and information carried by the medium.

In one exemplary embodiment, there is provided a machine-readable tangible and non-transitory medium having information, wherein the information, when read by a hardware processor system, causes the hardware processor system to perform following: generating a plurality of sampled signals by sampling a data signal according to different clock signals; and providing one or more control signals indicating whether to decrease or increase a frequency of one of the different clock signals based on the plurality of sampled signals.

BRIEF DESCRIPTION OF THE DRAWINGS

The embodiments will be more readily understood in view of the following description when accompanied by the below figures and wherein like reference numerals represent like elements, wherein:

FIG. 12A is a schematic diagram of a first sub-control signal generator according to an embodiment of the disclosure;

FIG. 12B is a schematic diagram of a second sub-control signal generator according to an embodiment of the disclosure;

DETAILED DESCRIPTION

Reference will now be made in detail to the embodiments of the present disclosure, examples of which are illustrated in the accompanying drawings. While the present disclosure will be described in conjunction with the embodiments, it will be understood that they are not intended to limit the present disclosure to these embodiments. On the contrary, the present disclosure is intended to cover alternatives, modifications, and equivalents, which may be included within the spirit and scope of the present disclosure as defined by the appended claims.

In addition, in the following detailed description of embodiments of the present disclosure, numerous specific details are set forth in order to provide a thorough understanding of the present disclosure. However, it will be recognized by one of ordinary skill in the art that the present disclosure may be practiced without these specific details. In other instances, well-known methods, procedures, components, and circuits have not been described in detail as not to unnecessarily obscure aspects of the embodiments of the present disclosure.

Figure 1:
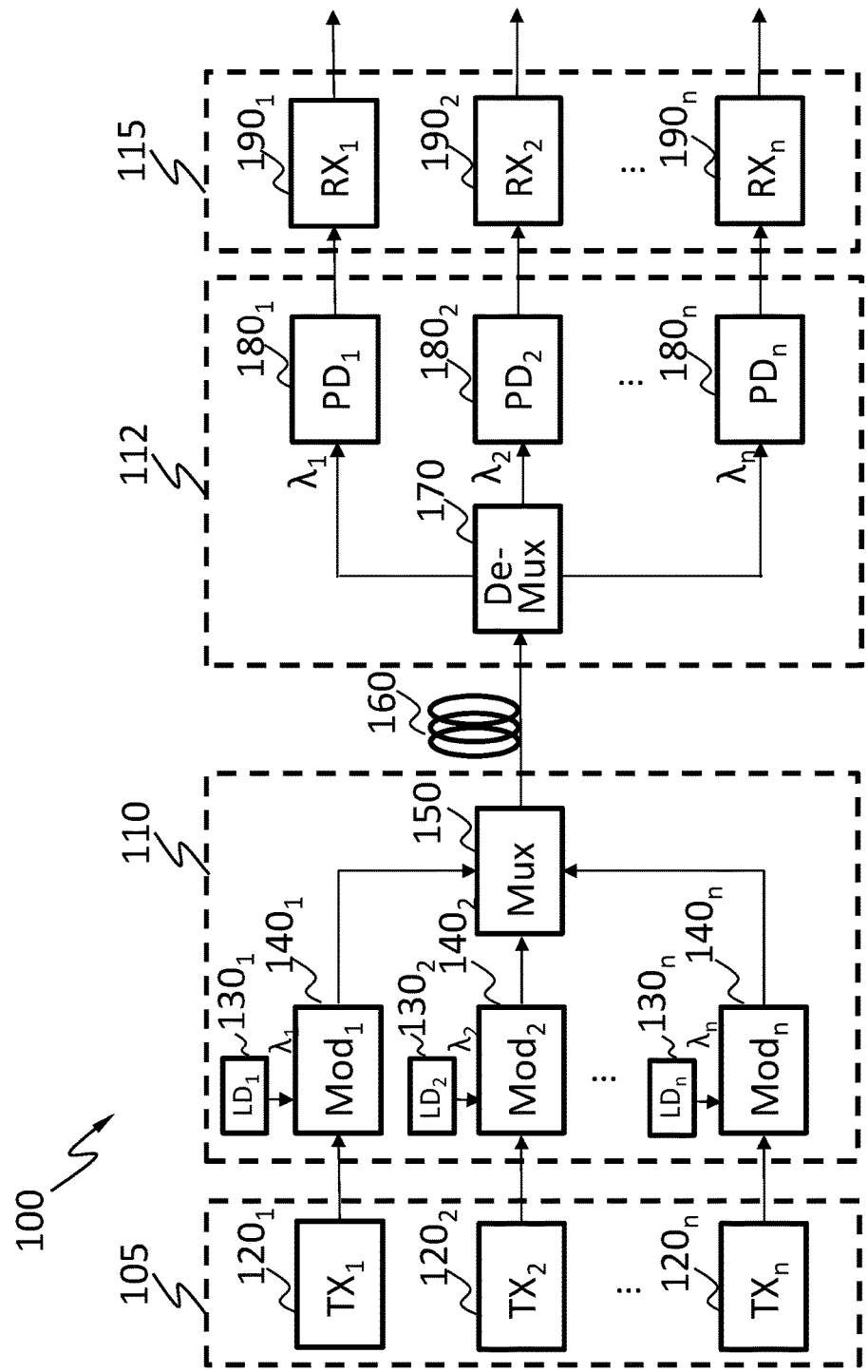
FIG. 1 is a high level depiction of an exemplary optical communication system, according to an embodiment of the disclosure.

FIG. 1 is a high level depiction of an exemplary optical communication system 100, according to an embodiment of the present disclosure. As shown, the optical communication system 100 may include an optical fiber 160 with a suitable length (e.g., 5 meters, 10 meters, 100 meters, 1,000 meters, 10,000 meters, 100,000 meters, and the like) for long haul transmission. The optical communication system 100 may further include a transmitter chip 105, an encoder chip 110, a detector chip 112, and a receiver chip 115, each formed on a substrate (for example, a silicon substrate). Various components may be arranged as shown or in any other suitable manners.

The coupling between chips, for example, between the transmitter chip 105 and the encoder chip 110, and between the detector chip 112 and the receiver chip 115, may be achieved via wire bonding, flip chip packaging, or any other suitable means. The chip-to-fiber coupling, for example, between the encoder chip 110 and the optical fiber 160, or the fiber-to-chip coupling, for example, between the optical fiber 160 and the detector chip 112, may be achieved through a fiber grating, a fiber lens, any other suitable component or device.

The transmitter chip 105 may be configured to provide data to be transmitted in the optical communication system 100. As shown, the transmitter chip 105 includes a plurality of transmitters $120_{1-n}$ on a silicon substrate, where n can be any positive integer. Each of the transmitters $120_{1-n}$ may be configured to transmit a binary data sequence to a corresponding modulator $140_{1-n}$ of the encoder chip 110.

The encoder chip 110 may be configured to modulate the data provided by the transmitter chip 105 on lights with different wavelengths or frequencies, and combine the lights to be transmitted through the optical fiber 160. Specifically, the encoder chip 110 may include a plurality of laser diodes $130_{1-n}$, a plurality of modulators $140_{1-n}$ coupled to the plurality of laser diodes $130_{1-n}$ and a multiplexer 150 coupled to the plurality of modulators $140_{1-n}$, all formed on a silicon substrate. In an embodiment, the number of the laser diodes $130_{1-n}$ is equal to the number of modulators $140_{1-n}$, which is no less than the number of transmitters $120_{1-n}$ in the transmitter chip 105. The plurality of laser diodes $130_{1-n}$ may be configured to provide a plurality of lights with different wavelengths $\lambda_1$-$\lambda_n$. Although not shown, each of the plurality of laser diodes $130_{1-n}$ may be driven by a respective laser diode driver, configured to provide the laser diode $130_{1-n}$ with required electrical currents to operate. Each of the plurality of modulators $140_1$-$140_n$ may be configured to modulate date provided by one of the transmitters $120_{1-n}$ on a respective light inputted to the modulator $140_{1-n}$. The multiplexer 150 may be configured to combine the lights with various wavelengths into a single stream of lights to be transmitted to the optical fiber 160.

The detector chip 112 may be configured to receive the single stream of lights after transmitting through the optical fiber 160 and split the single stream of lights to a plurality of lights each with a different wavelength than others. The detector chip 112 may be further configured to convert each of the plurality of lights to an electrical current. Specifically, the detector chip 112 may include a de-multiplexer 170 and a plurality of photodiodes $180_{1-n}$ coupled to the de-multiplexer 170, all formed on a silicon substrate. In an embodiment, the number of photodiodes $180_{1-n}$ may be equal to, or no less than, the number of modulators $140_{1-n}$ and the number of laser diodes $130_{1-n}$ in the encoder chip 110. The de-multiplexer 170 may be configured to split the single stream of lights received from the optical fiber 160 to a plurality of lights each with a different wavelength than others. Each of the plurality of photodiodes $180_{1-n}$ may be configured to convert a corresponding received light to an electrical current, and transmit the electrical current to a corresponding receiver $190_{1-n}$.

The receiver chip 115 may be configured to recover the data provided by the transmitter chip 105 based on the plurality of electrical currents provided by the detector chip 112. Although not shown, each of the receivers $190_{1-n}$ may be further coupled to an electrical circuit for further operations through an appropriate driver in the receiver chip 115 or a separate chip.

Figure 2:
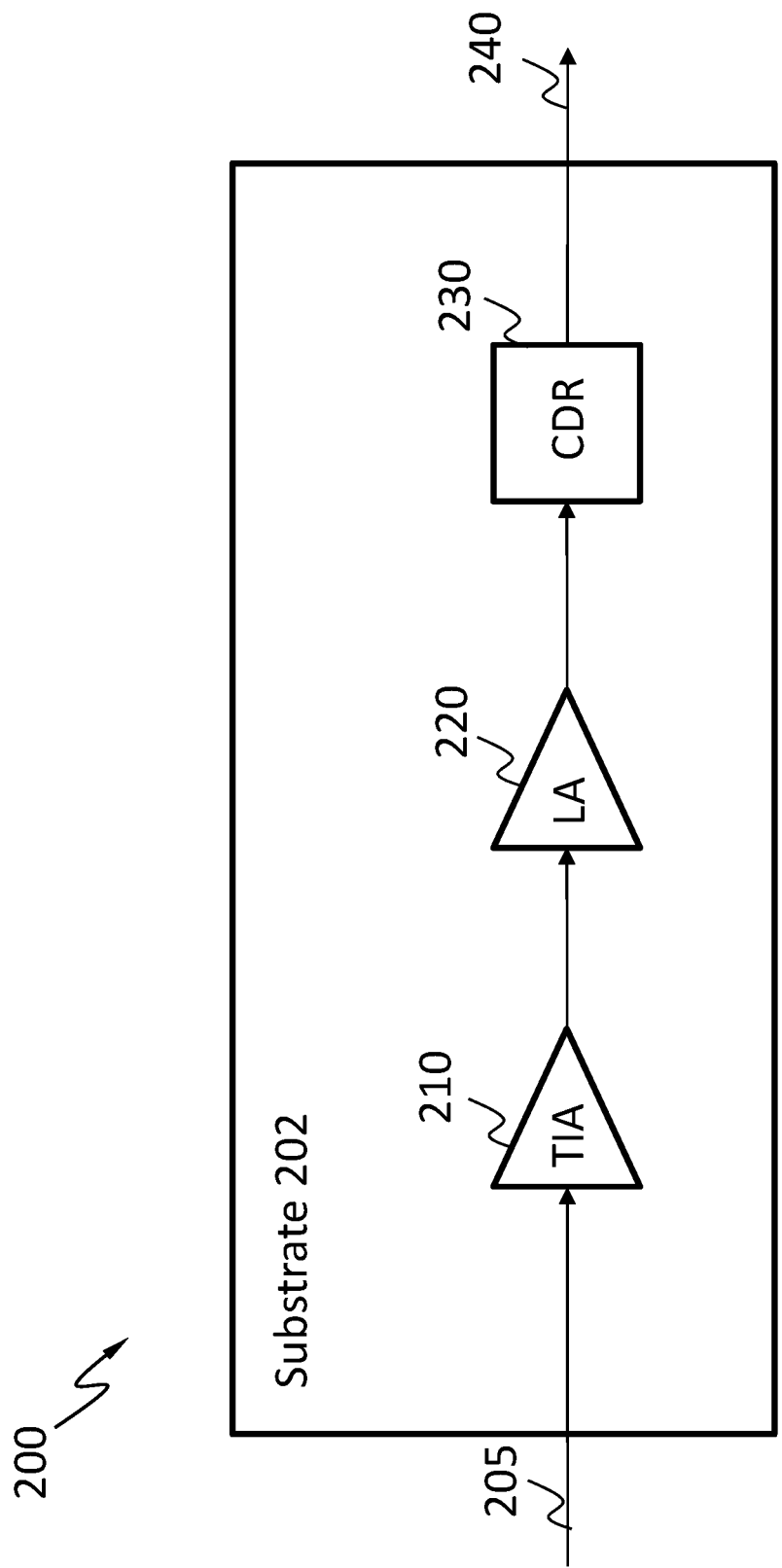
FIG. 2 is a schematic diagram of a receiver, according to an embodiment of the disclosure.

FIG. 2 is a schematic diagram of a receiver 200, according to an embodiment of the present disclosure. The receiver 200 may be any one of the receivers $190_{1-n}$ in the receiver chip 115 in FIG. 1. As shown, the receiver 200 may be formed on a substrate 202, for example, a silicon substrate. The receiver 200 includes one or more amplifiers to convert an electrical signal 205 generated by an photodiode, e.g., one of the photodiodes $180_{1-n}$ in the detector chip 112 in FIG. 1, which can be a weak or a strong signal, into a fixed-amplitude voltage signal. In an embodiment, the electrical signal 205 may be an electrical current signal. Further, the one or more amplifiers may include a trans-impedance amplifier (TIA) 210 which amplifies and converts the electrical signal 205 into a voltage signal. The one or more amplifiers may further include a limiting amplifier (LA) 220 configured to receive the voltage signal, which may have weak and strong voltage values, and convert the voltage signal into a fixed-amplitude voltage signal.

In an embodiment, the one or more amplifiers, such as the TIA 210 and the LA 220, may be configured as differential amplifiers. For example, the TIA 210 may generate differential output voltage signals, Tout and −Tout, at the same time. In addition, the LA 220 may generate differential output voltage signals, Lout and −Lout, having fixed amplitude at the same time.

The receiver 200 further includes a CDR circuit 230 configured to extract timing clock information from the fixed-amplitude voltage signal Lout and −Lout. The CDR circuit 230 may be further configured to reshapes the Lout signal waveform using the extracted clock signal to generate a retimed data signal 240. In an embodiment, the CDR circuit 230 may generates the timing clock information by employing a frequency-locked loop (FLL) and/or a phase-locked loop (PLL) to frequency-align and/or phase-align the clock to the transitions in the data stream, e.g., the Lout signal waveform. The timing clock information may have a frequency which is equal to the frequency of the data stream, or equal to a division of the data stream depending on different configurations of the CDR circuit 230. More details of the CDR circuit 230 may be described in FIG. 3A and FIG. 3B.

It should be noted although the CDR circuit 230 is used as a part of the receiver 200 in this example, the applications of the CDR circuit 230 are not limiting. In other words, the CDR circuit 230 may be used in any suitable device or component for recovering the clock signal associated with an input data stream, and further providing a retimed data stream based on the recovered clock signal and the input data stream. For example, the CDR circuit 230, in some examples, may also be used in the transmitters $120_{1-n}$ as shown in FIG. 1.

Figure 3A:
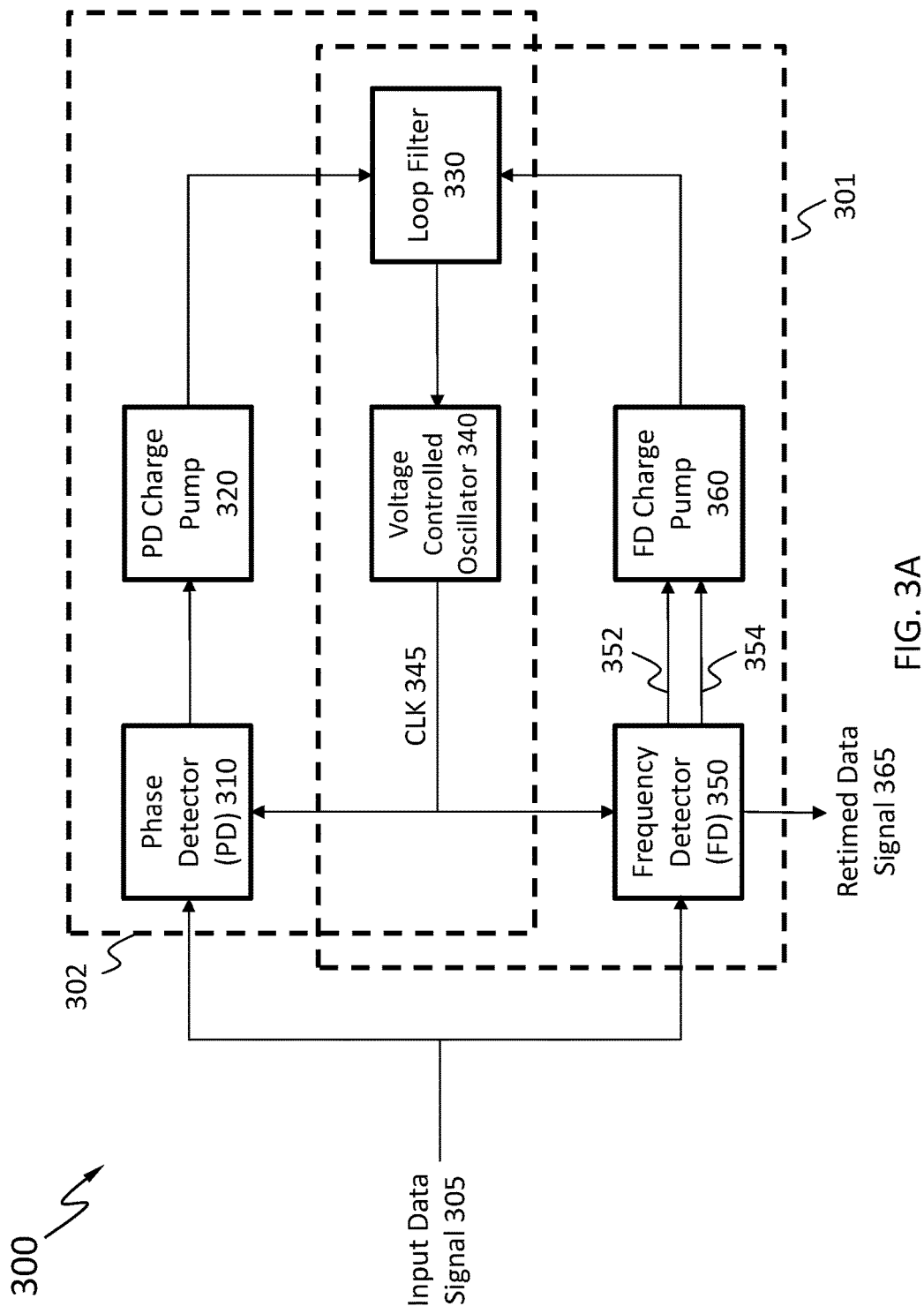
FIG. 3A is a schematic diagram of a clock and data recovery (CDR) circuit according to an embodiment of the disclosure.

Referring to FIG. 3A, a schematic diagram of a CDR circuit 300 is depicted according to an embodiment of the disclosure. In an embodiment, the CDR circuit 300 may be similar to the CDR circuit 230 in FIG. 2. The CDR circuit 300 may be configured to receive an input data signal 305, and determine a frequency of a clock signal 345 (denoted by "CLK") associated with the input data signal 305. The CDR circuit 300 may be further configured to provide a retimed data signal 365 based on the input data signal 305 and the clock signal 345 (denoted by "CLK"). In some examples, the frequency of the clock signal 345 (denoted by "CLK") may also be referred to as a clock rate. The input data signal 305 may be any suitable data signal. The input data signal 305 may be an analog data signal. The input data signal 305 may be a digital data signal. The input data signal 305 may have any modulation format. For example, the input data signal 305 may be an NRZ data signal. Accordingly, each NRZ data signal may be represented by, or correspond to one bit, e.g., "0" or "1". For example, the input data signal 305 may be a non-NRZ data signal. The non-NRZ data signal may include, but not limited to, a pulse amplitude modulation (PAM) data signal, with which $2^N$ distinct pulse amplitude levels may be used to convey the information, where N is an integer that is equal to or greater than 2.

Accordingly, each non-NRZ data signal may be represented by N bits, each of which may be 0 or 1. For example, the input data signal 305 may be a PAM4 data signal, when four distinct pulse amplitude levels may be used. Accordingly, each PAM4 data signal may be represented by two bits, e.g., 00, 01, 10, or 11. For another example, the input data signal 305 may be a PAM8 data signal, when eight distinct pulse amplitude levels may be used. Accordingly, each PAM8 data signal may be represented by three bits, e.g., 000, 001, 010, 011, 100, 101, 110, or 111. The examples are non-limiting.

In an embodiment, the CDR circuit 300, as shown in FIG. 3A, is a reference-less CDR circuit. This is because the CDR circuit 300 receives only the input data signal 305 without a need for a separate reference clock signal. This is beneficial because an external crystal oscillator for providing the separate reference clock signal may not be required, thereby reducing the cost and system complexity.

In some other examples, the CDR circuit 300 may not be a reference-less CDR circuit. For example, the CDR circuit 300 may receive the separate reference clock signal (not shown) in addition to the input data signal 305 in order to perform clock and data recovery. As such, the external crystal oscillator may be required to provide the separate reference clock signal to the CDR circuit 300. In an embodiment, the external crystal oscillator may be calibrated according to the voltage controlled oscillator 340, for example, upon receipt of the separate reference clock signal from the external crystal oscillator. This is done so that the clock signal 345 (denoted by "CLK") may have an initial frequency which is equal to the frequency of the separate reference clock signal provided by the external crystal oscillator.

In an embodiment, the CDR circuit 300 includes an FLL circuit 301. The FLL circuit 301, as shown in FIG. 3A, may be configured to recover a clock signal 345 (denoted by "CLK") by locking the frequency of the clock signal 345 within a first threshold range of the frequency of the input data signal 305. Accordingly, the recovered clock signal 345 may be referred to as a full rate clock signal. The first threshold range may be 20% of the frequency of the input data signal 305, 10% of the frequency of the input data signal 305, 5% of the frequency of the input data signal 305, 1% of the frequency of the input data signal 305, or less. The FLL circuit 301 may be further configured to provide a retimed data signal 365 by sampling the input data signal 305 according to the clock signal 345. Specifically, the FLL circuit 301 may be further configured to provide the retimed data signal 365 by sampling the input data signal 305 at the transition edge (e.g., the rising edge or the falling edge) of the clock signal 345 (denoted by "CLK").

The FLL circuit 301 may include a frequency detector (FD) 350, a FD charge pump 360, a loop filter 330, and a voltage controlled oscillator 340. The FD 350 may be configured to generate one or more control signals indicating whether to decrease or increase the frequency of the clock signal 345 provided by the voltage controlled oscillator 340 upon receipt of the input data signal 305 and the clock signal 345. Specifically, the one or more control signals may include a first control signal 352, which may be denoted by "fast clock," indicating whether to decrease the frequency of the clock signal 345 provided by the voltage controlled oscillator 340. For example, it is indicated to decrease the frequency of the clock signal 345 when the first control signal 352 is represented by the bit of "1" (or a high voltage). Alternatively, it is indicated not to decrease the frequency of the clock signal 345 when the first control signal 352 is denoted by the bit of "0" (or a low voltage). It should be noted the first control signal 352 represented by the bit of "0" (or having the low voltage), in this example, may not indicate to increase the frequency of the clock signal 345.

The one or more control signals may further include a second control signal 354, which may be denoted by "slow clock," indicating whether to increase the frequency of the clock signal 345 provided by the voltage controlled oscillator 340. For example, it is indicated to increase the frequency of the clock signal 345 when the second control signal 354 is represented by the bit of "1" (or the high voltage). Alternatively, it is indicated not to increase the frequency of the clock signal 345 when the second control signal 354 is represented by the bit of "0" (or the low voltage). It should be noted the second control signal 354 represented by the bit of "0" (or having the low voltage), in this example, may not indicate to decrease the frequency of the clock signal 345.

The first control signal 352 indicating to decrease the frequency of the clock signal 345 and the second control signal 354 indicating to increase the frequency of the clock signal 345 may not be provided at the same time. For example, the first control signal 352 and the second control signal 354, as described above, may not be represented by the bit of "1" or have the high voltages at the same time. On the other hand, the first control signal 352 indicating not to decrease the frequency of the clock signal 345 and the second control signal 354 indicating not to increase the frequency of the clock signal 345 may be provided at the same time. For example, the first control signal 352 and the second control signal 354, as described above, may be represented by the bits of "0" (or have the low voltages) at the same time, which may indicate that the frequency of the clock signal 345 provided by the voltage controlled oscillator 340 may be locked to the threshold range of the frequency of the input data signal 305.

The FD charge pump 360 may be configured to receive the one or more control signals provided by the FD 350, e.g., the first control signal 352 and the second control signal 354. The FD charge pump 360 may be further configured to convert the one or more control signals received from the FD 350 to a control current flowing to or from the loop filter 330. Accordingly, the loop filter 330 may be charged when the control current flows to the loop filter 330. As a result, the loop filter 330 may provide a positive voltage to the voltage controlled oscillator 340, which may subsequently increase or decrease the frequency of the clock signal 345 depending on the configuration of the voltage controlled oscillator 340. Alternatively, the loop filter 330 may be discharged when the control current flows from the loop filter 330. As a result, the loop filter 330 may provide a negative voltage to the voltage controlled oscillator 340, which may subsequently decrease or increase the frequency of the clock signal 345 depending on the configuration of the voltage controlled oscillator 340. More details about the FD 350, the FD charge pump 360, the loop filter 330, and the voltage controlled oscillator 340 will be described in FIGS. 6, 16 and 17, respectively.

In addition to the FLL circuit 301, the CDR circuit 300 may further include a phase-locked loop (PLL) circuit 302. The PLL circuit 302, as shown in FIG. 3A, may be configured to recover the clock signal 345, denoted by "C"LK, by locking the phase of the clock signal 345 within a second threshold range of the phase of the input data signal 305. The second threshold range may be 20% of the phase of the input data signal 305, 10% of the phase of the input data signal 305, 5% of the phase of the input data signal 305, 1% of the phase of the input data signal 305, or less. Since the frequency is the time derivative of the phase, the frequency of the clock signal 345 provided by the voltage controlled oscillator 340, in this example, may be further locked to the frequency of the input data signal 305 when the phase of the clock signal 345 is locked to the phase of the input data signal 305 by the PLL circuit 302. In an embodiment, the second threshold range is smaller than the first threshold range.

The PLL circuit 302, as shown in FIG. 3A, may include a phase detector (PD) 310, a PD charge pump 320, the loop filter 330, and the voltage controlled oscillator 340. In this example, the PLL circuit 302 and the FLL circuit 301 share the loop filter 330 and the voltage controlled oscillator 340. In an embodiment, the PD charge pump 320 may be similar to the FD charge pump 360. Accordingly, the PLL circuit 302 and the FLL circuit 301 may further share the charge pump (i.e., the PD charge pump 320 or the FD charge pump 360). In an embodiment, either of the FLL circuit 301 and the PLL circuit 302 may include a separate loop filter 330 and/or a separate voltage controlled oscillator 340. Therefore, the FLL circuit 301 and the PLL The FD 350, in this example, may not share the loop filter 330 and/or the voltage controlled oscillator 340.

The PD 310 may be configured to generate one or more control signals by continuously comparing the phase of the clock signal 345 provided by the voltage controlled oscillator 340 and the phase of the input data signal 305. Similar to the FD charge pump 360, the PD charge pump 360 may be configured to provide a control current to charge or discharge the loop filter 330 based on the one or more control signals generated by the PD 310. When the loop filter 330 is charged, the loop filter 330 may provide a positive voltage to the voltage controlled oscillator 340, which may subsequently increase or decrease the frequency of the clock signal 345 depending on the configuration of the voltage controlled oscillator 340. Alternatively, when the loop filter 330 is discharged, the loop filter 330 may provide a negative voltage to the voltage controlled oscillator 340, which may subsequently decrease or increase the frequency of the clock signal 345 depending on the configuration of the voltage controlled oscillator 340.

Figure 3B:
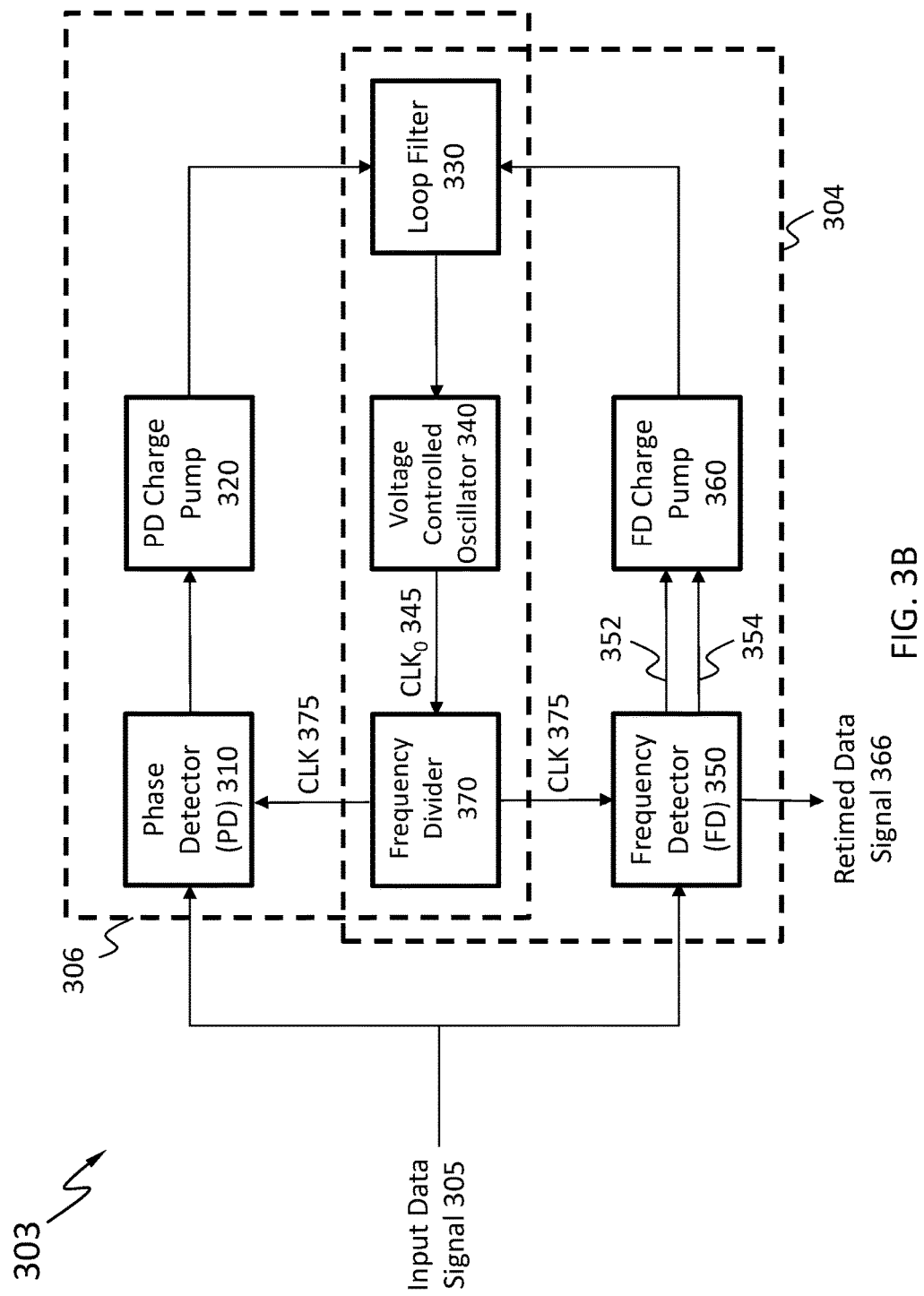
FIG. 3B is a schematic diagram of a CDR circuit according to an embodiment of the disclosure.

Referring to FIG. 3B, another CDR circuit 303 is depicted according to an embodiment of the disclosure. The CDR circuit 303 may be similar to the CDR circuit 230 in FIG. 2. Different than the CDR circuit 300, the CDR circuit 303 includes a frequency divider 370 as shown in FIG. 3B. The frequency divider 370 may be configured to divide the frequency of the clock signal 345, provided by the voltage controlled oscillator 340 and denoted by "C"LK$_0$, by an integer greater than 1. The frequency divider 370 may be further configured to provide the divided clock signal 375, denoted by "C"LK as shown in FIG. 3B, to both the FD 350 and the PD 310.

Similar to the CDR circuit 300, the CDR circuit 303 includes an FLL circuit 304 and a PLL circuit 306. However, each of the FLL circuit 304 and the PLL circuit 306 further includes the frequency divider 370 compared with the FLL circuit 301 and the PLL circuit 302, respectively. As such, the FLL circuit 304, as shown in FIG. 3B, may be configured to lock the frequency of the clock signal 375 within the first threshold range of a division of the frequency of the input data signal 305. Further, the PLL circuit 306, as shown in FIG. 3B, may be configured to further adjust the clock signal 375, denoted by "CLK," by locking the phase of the clock signal 375 within the second threshold range of the same division of the phase of the input data signal 305. The division of the frequency of the input data signal 305 may be determined by the frequency divider 370. For example, when the frequency divider 370 divides the clock signal 345 (denoted by "CLK$_0$") provided by the voltage controlled oscillator 340, by a factor of two, the FLL circuit 304 may be configured to lock the frequency of the clock signal 375 within the first threshold range of a half of the frequency of the input data signal 305. In addition, the PLL circuit 306 may be configured to further adjust the clock signal 375 (denoted by "CLK") by locking the phase of the clock signal 375 within the second threshold range of a half of the phase of the input data signal 305. Accordingly, the recovered clock signal 375 (after adjustment by the FLL circuit 304 and/or the PLL circuit 306) may be sometimes referred to as a half rate clock signal. The FLL circuit 304 may be further configured to provide the retimed data signal 366 by sampling the input data signal 305 according to the recovered clock signal 375 (denoted by "CLK"). Specifically, the FLL circuit 304 may be further configured to provide the retimed data signal 366 by sampling the input data signal 305 at the transition edge (e.g., the rising edge or the falling edge) of the recovered clock signal 375 (denoted by "CLK").

For another example, when the frequency divider 370 divides the clock signal 345, i.e., CLK$_0$, provided by the voltage controlled oscillator 340, by a factor of four, the FLL circuit 304 may be configured to lock the frequency of the clock signal 375 (denoted by "CLK") within the first threshold range of a quarter of the frequency of the input data signal 305. In addition, the PLL circuit 306 may be configured to adjust the clock signal 375 (denoted by "CLK") by locking the phase of the clock signal 375 within the second threshold range of a quarter of the phase of the input data signal 305. Accordingly, the recovered clock signal 375 may be sometimes referred to as a quarter rate clock signal. The FLL circuit 304 may be further configured to provide the retimed data signal 366 by sampling the input data signal 305 according to the recovered clock signal 375 (denoted by "CLK"). Specifically, the FLL circuit 304 may be further configured to provide the retimed data signal 366 by sampling the input data signal 305 at the transition edge (e.g., the rising edge or the falling edge) of the recovered clock signal 375 (denoted by "CLK"). The examples are non-limiting.

Figure 4:
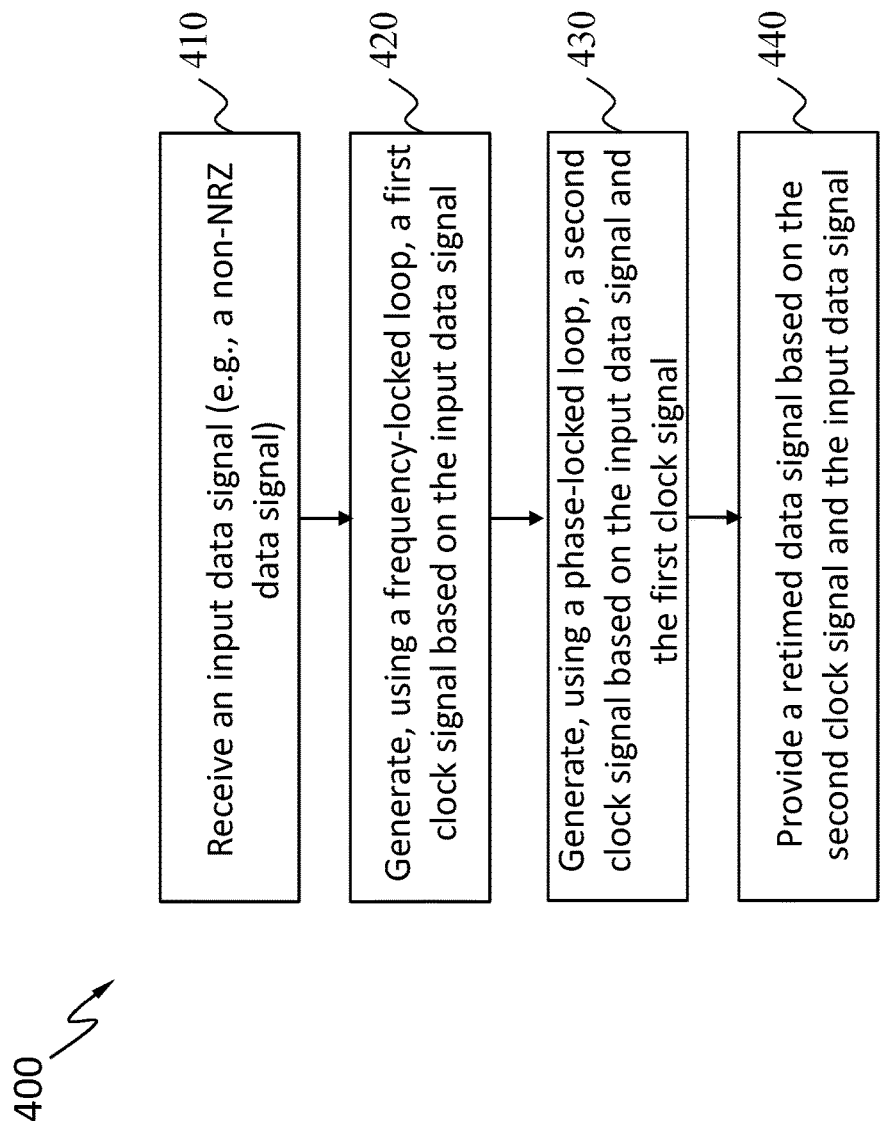
FIG. 4 is a flowchart of a method performed by a CDR circuit according to an embodiment of the disclosure.

Referring to FIG. 4, a flowchart 400 of a method for clock and data recovery is depicted according to an embodiment of the disclosure. The method may be performed by a CDR circuit, e.g., the CDR circuit 230, 300, or 303. At step 410, an input data signal may be received. For example, the input data signal may be received by a frequency detector, e.g., the FD 350. Alternatively or in addition, the input data signal may be received by a phase detector, e.g., the PD 310. The input data signal may be a digital data signal. The input data signal may be an analog data signal. The input data signal may be an RZ data signal. The input data signal may be an NRZ data signal. The non-NRZ data signal may include, but not limited to, a PAM data signal such as a PAM4 data signal, a PAM8 data signal, a PAM16 data signal, and the like. The input data signal may be non-limiting.

At step 420, a first clock signal may be generated, using a frequency-locked loop, based on the input data signal. The frequency-locked loop may be similar to the FLL circuit 301 or the FLL circuit 304. At step 430, a second clock signal may be generated, using a phase-locked loop, based on the input data signal and the first locked signal. The phase-locked loop may be similar to the PLL circuit 302 or the PLL circuit 306.

At step 440, a retimed data signal may be provided based on the second clock signal and the input data signal. In an embodiment, the retimed data signal may be provided by a frequency detector in the frequency-locked loop. For example, the frequency detector may be similar to the FD 350 in the FLL circuit 301 and the FLL circuit 304.

Figure 5:
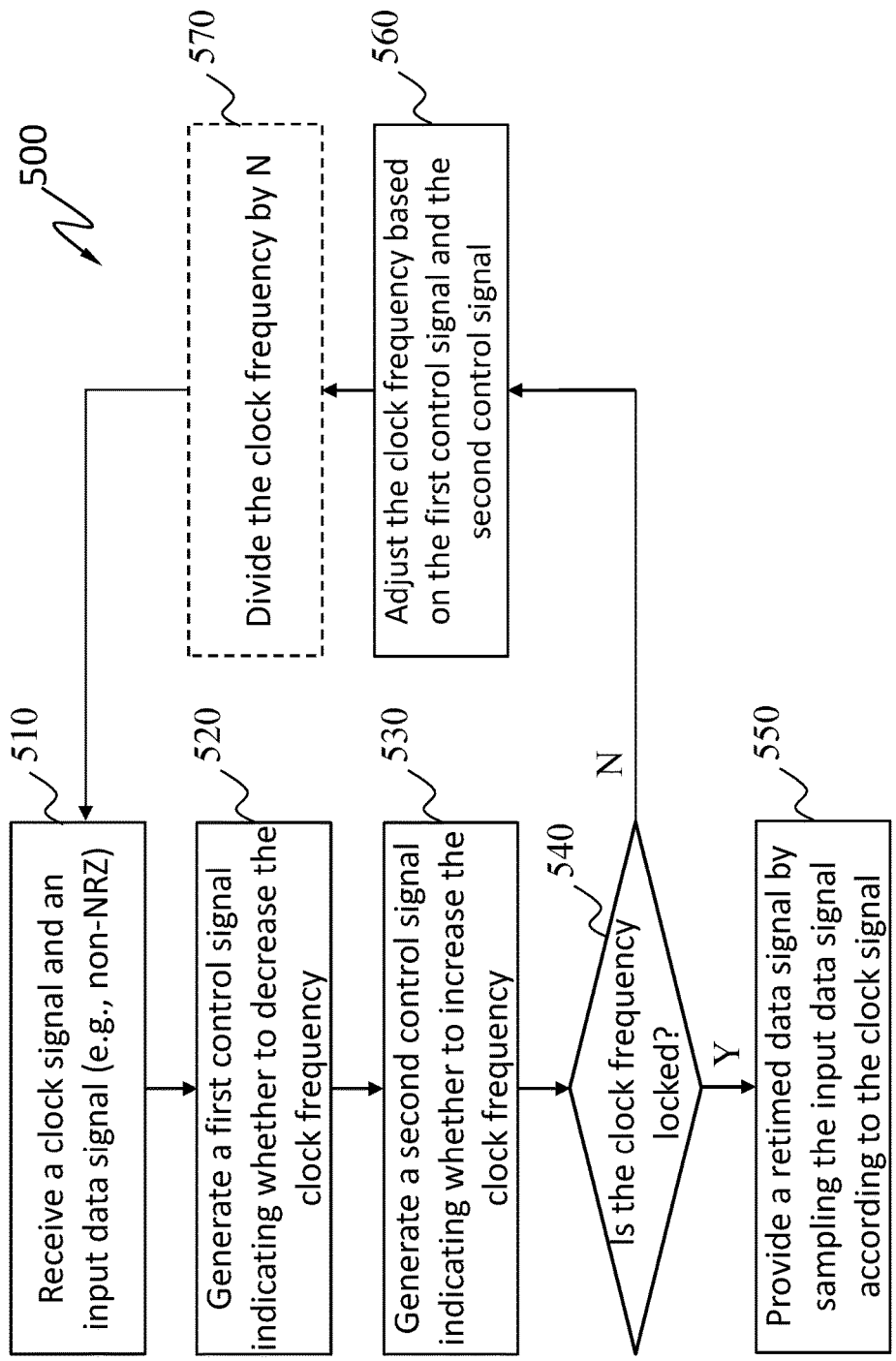
FIG. 5 is a flowchart of a method performed by a frequency-locked loop (FLL) circuit according to an embodiment of the disclosure.

Referring to FIG. 5, a flowchart 500 of a method for clock and data recovery is depicted according to an embodiment of the disclosure. The method for clock and data recovery may performed by a frequency-locked loop. The frequency-locked loop may be similar to the FLL circuit 301 or the FLL circuit 304.

At step 510, an input data signal may be received. For example, the input data signal may be received by a frequency detector, e.g., the FD 350. Alternatively or in addition, the input data signal may be received by a phase detector, e.g., the PD 310. The input data signal may be non-limiting. For example, the input data signal may be an analog data signal. The input data signal may be a digital data signal. The input data signal may be an NRZ data signal. The input data signal may be a non-NRZ data signal. The non-NRZ data signal may include, but not limited to a PAM data signal such as a PAM4 data signal, a PAM8 data signal, a PAM16 data signal, and the like. In addition to the input data signal, a clock signal provided by a voltage controlled oscillator, for example, the voltage controlled oscillator 340, may also be received.

At step 520, a first control signal indicating whether to decrease a frequency of the clock signal may be generated. The first control signal may be the first control signal 352 in FIG. 3A and FIG. 3B. In an embodiment, the first control signal may be generated by a frequency detector, e.g., the FD 350. In an embodiment, the first control signal may be denoted by "fast clock." In an embodiment, it is indicated to decrease the frequency of the clock signal when the first control signal is represented by the bit of "1" or has a high voltage. In an embodiment, it is indicated not to decrease the frequency of the clock signal when the first control signal is represented by the bit of "0" or has a low voltage. It should be noted the first control signal represented by the bit of "0" or having the low voltage may not indicate to increase the frequency of the clock signal provided by the voltage controlled oscillator.

At step 530, a second control signal indicating whether to increase the frequency of the clock signal may be generated. The second control signal may be the second control signal 354 in FIG. 3A and FIG. 3B. In an embodiment, the second control signal may be generated by the frequency detector, e.g., the FD 350. In an embodiment, the second control signal may be denoted by "slow clock." In an embodiment, it is indicated to increase the frequency of the clock signal when the second control signal is represented by the bit of "1" or has a high voltage. In an embodiment, it is indicated not to increase the frequency of the clock signal when the second control signal is represented by the bit of "0" or has a low voltage. It should be noted that the second control signal represented by the bit of "0" or having the low voltage may not indicate to decrease the frequency of the clock signal provided by the voltage controlled oscillator. In an embodiment, the first control signal indicating to decrease the frequency of the clock signal and the second control signal indicating to increase the frequency of the clock signal may not be generated by the frequency detector, e.g., the FD 350, at the same time. For example, the first control signal and the second control signal, as described in the above example, may not be represented by the bits of "1" or have the high voltages at the same time.

At step 540, it is determined whether the frequency of the clock signal is locked. Specifically, it is determined whether the frequency of the clock signal is locked within a threshold range of a frequency of the input data signal or within the threshold range of a division of the frequency of the input data signal. If so, the method proceeds to step 550. Otherwise, the method proceeds to step 560. In an embodiment, it is determined the frequency of the clock signal is locked when the first control signal indicates not to decrease the frequency of the clock signal as the second control signal indicates not to increase the frequency of the clock signal. Otherwise, it is determined the frequency of the clock signal is not locked. For example, it is determined the frequency of the clock signal is locked when both the first control signal and the second control signal are represented by the bits of "0" or have the low voltages. Otherwise, it is determined the frequency of the clock signal is not clocked.

At step 550, a retimed data signal is provided, for example, by the frequency detector, e.g., the FD 350. The retimed data signal may be provided by sampling the input data signal according to the clock signal. Specifically, the retimed data signal may be provided by sampling the input data signal at the transition edge (e.g., the rising edge or the falling edge) of the clock signal.

At step 560, the frequency of the clock signal provided by the voltage controlled oscillator may be adjusted based on the first control signal and the second control signal. Specifically, the first control signal and the second control signal may be converted to a control current by a charge pump. For example, the charge pump may be the FD charge pump 360 in FIG. 3A and FIG. 3B. Then a control voltage may be provided by a loop filter (e.g., the loop filter 330 in FIG. 3A and FIG. 3B), to the voltage controlled oscillator (e.g., the voltage controlled oscillator 340 in FIG. 3A and FIG. 3B), based on the control current. For example, a positive control voltage may be provided by the loop filter to the voltage controlled oscillator when the control current flows toward the loop filter 330. As a result, the voltage controlled oscillator may increase or decrease the frequency of the clock signal provided by the voltage controlled oscillator depending on the configuration of the voltage controlled oscillator. Alternatively, a negative control voltage may be provided by the loop filter to the voltage controlled oscillator when the control current flows from the loop filter 330. As a result, the voltage controlled oscillator may decrease or increase the frequency of the clock signal provided by the voltage controlled oscillator depending on the configuration of the voltage controlled oscillator.

At step 570, optionally, the frequency of the clock signal provided by the voltage controlled oscillator may be divided by, for example, a frequency divider. The frequency divider may be the frequency divider 370 as shown in FIG. 3B. In an embodiment, the frequency of the clock signal may be divided by a factor of N, where N is an integer greater than 1. Then, the method proceeds to step 510.

Figure 6:
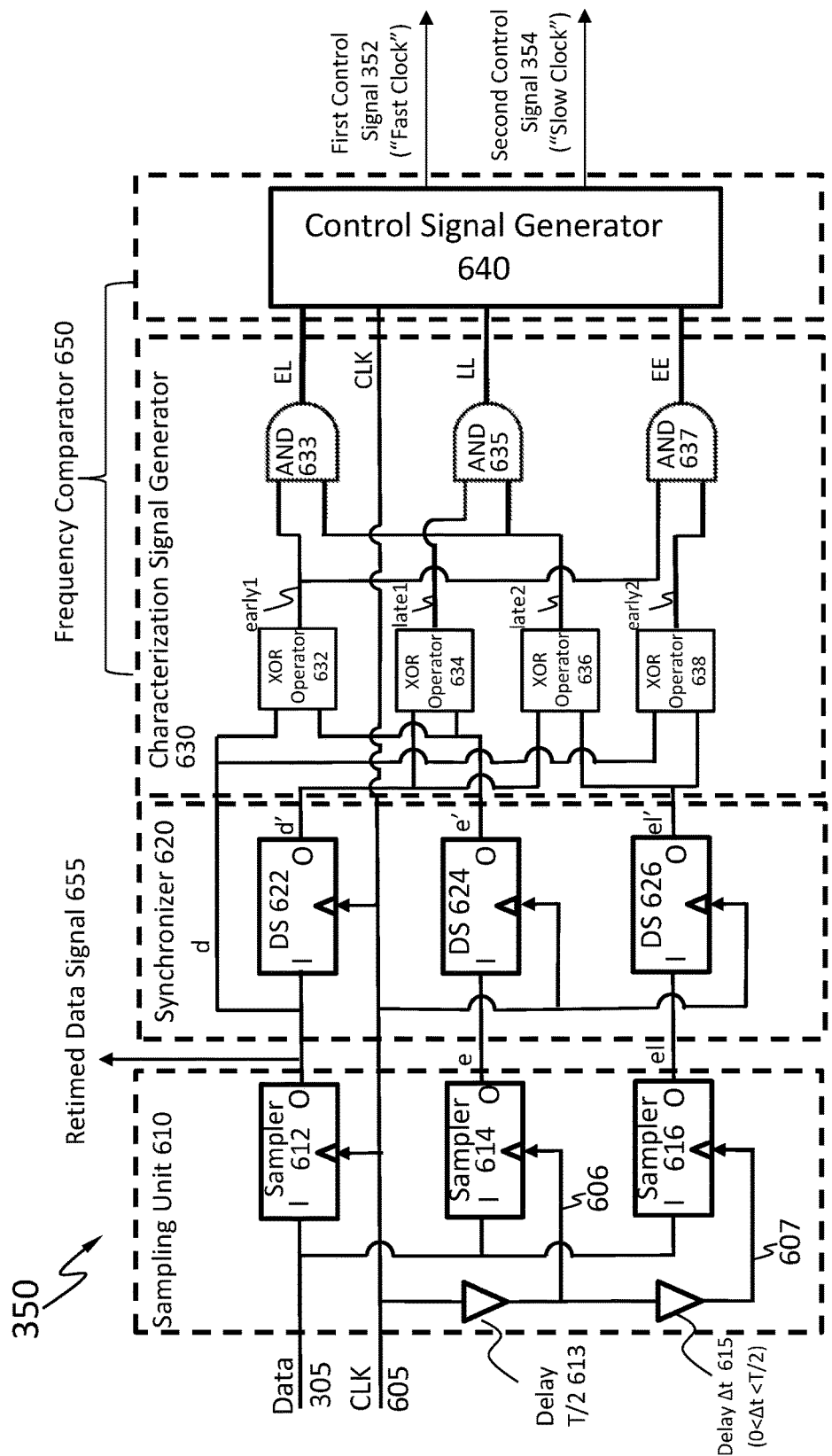
FIG. 6 is a schematic diagram of a frequency detector according to an embodiment of the disclosure.

Referring to FIG. 6, a schematic diagram of the FD 350 is depicted according to an embodiment of the disclosure. As described above, the FD 350 may be configured to receive the input data signal 305 and a clock signal 605 provided directly or indirectly from the voltage controlled oscillator 340. The input data signal 305 may be any suitable data signals. The input data signal 305 may be non-limiting. For example, the input data signal 305 may be an analog data signal. The input data signal 305 may be a digital data signal. The input data signal 305 may be an NRZ data signal. The input data signal 305 may be a non-NRZ data signal. The clock signal 605 may be the clock signal 345 provided directly by the voltage controlled oscillator 340 as described in FIG. 3A. Alternatively, the clock signal 605 may be the clock signal 375 provided by the frequency divider 370 as described in FIG. 3B. Finally, the FD 350 may be configured to provide a first control signal 352 (denoted by "fast clock") indicating whether to decrease the frequency of the clock signal 605 and a second control signal 354 (denoted by "slow clock") indicating whether to increase the frequency of the clock signal 605. In an embodiment, the first control signal 352 and the second control signal 354 are provided to the FD charge pump 360 as described in FIG. 3A and FIG. 3B. The FD 350 may be further configured to provide a retimed data signal 655, for example, by sampling the input data signal 305 according to the clock signal 605. Specifically, the FD 350 may be further configured to provide the retimed data signal 655 at the transition edge (e.g., the rising edge or the falling edge) of the clock signal 605. The retimed data signal 655 may be the retimed data signal 365 in FIG. 3A or the retimed data signal 366 in FIG. 3B.

As shown, the FD 350 may include a sampling unit 610, a synchronizer 620 coupled to the sampling unit 610, a characterization signal generator 630 coupled to the synchronizer 620, and a control signal generator 640 coupled to the characterization signal generator 630. In an embodiment, the characterization signal generator 630 and the control signal generator 640 may be collectively referred to a frequency comparator 650 (or a frequency comparing circuit).

The sampling unit 610 may be configured to provide a plurality of sampled data signals according to different clock signals. The plurality of sampled data signals may include a first sampled data signal (denoted by "d"), a second sampled data signal (denoted by "e"), and a third sampled data signal (denoted by "el"). The different clock signals may include a first clock signal 605 (i.e., the clock signal 605), a second clock signal 606, and a third clock signal 607. The sampling unit 610 may include a first delay buffer 613 configured to provide the second clock signal 606 by delaying the first clock signal 605 by 180 degrees (i.e., a half period as denoted by T/2). The sampling unit 610 may further include a second delay buffer 615 coupled to the first delay buffer 613, the second delay buffer 615 configured to provide the third clock signal 607 by delaying the second clock signal 606 by an amount between 0 degree and 180 degrees (i.e., between zero and a half period T/2). Although not shown, the third clock signal 607 may alternatively be provided by delaying the first clock signal 605 by an amount between 180 degrees and 360 degrees (i.e., between a half period T/2 and a whole period T).

In addition, the sampling unit 610 may include a first sampling circuit 612, a second sampling circuit 614, and a third sampling circuit 616. Each of the first sampling circuit 612, the second sampling circuit 614, and the third sampling circuit 616 may be denoted by "A" "sampler" as shown in FIG. 6.

The first sampling circuit 612 may be configured to provide the first sampled data signal (denoted by "d")enoted by "d," by sampling the input data signal 305 according to the first clock signal 605. Specifically, the input data signal 305 may be sampled by the first sampling circuit 612 at the transition edge of the first clock signal 605. The transition edge of the first clock signal 605 may be the rising edge of the first clock signal 605 or the falling edge of the first clock signal 605. In an embodiment, the first sampled data signal may also be referred to as the retimed data signal 655. In an embodiment, the first sampled data signal may be a digital signal. Accordingly, the first sampled data signal may be represented by M binary bits, where M is a positive integer, depending on the modulation format of the input data signal 305. For example, the first sampled data signal may be represented by one binary bit, e.g., 0 or 1, when the input data signal 305 is, or corresponds to an NRZ data signal. For another example, the first sampled data signal may be represented by 2 binary bits, e.g., 00, 01, 10, or 11, when the input data signal 305 is, or corresponds to a PAM4 data signal. For another example, the first sampled data signal may be represented by 3 binary bits, e.g., 000, 001, 010, 011, 100, 101, 110, or 111, when the input data signal 305 is, or corresponds to a PAM8 data signal. The examples are not limiting.

Figure 7A:
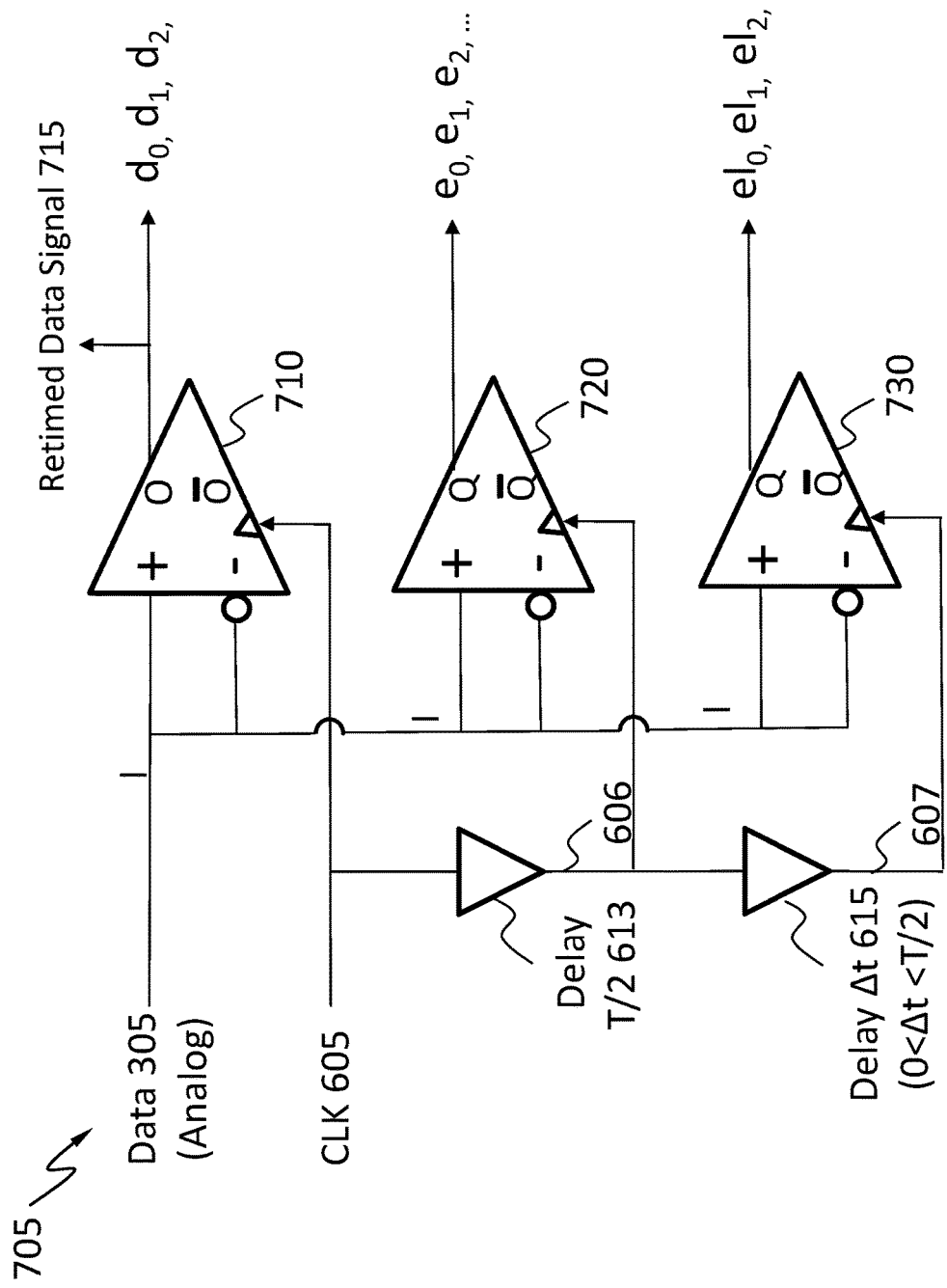
FIG. 7A is a schematic diagram of a sampling unit for sampling an analog data signal according to an embodiment of the disclosure.

Further, the input data signal 305 may be either an analog data signal or a digital data signal. Accordingly, when the input data signal 305 is the analog data signal, the first sampling circuit 612 may be an analog sampling circuit, for example, a first analog sampling circuit 710 as shown in FIG. 7A. Alternatively, when the input data signal 305 is a digital data signal, the first sampling circuit 612 may be an digital sampling circuit, for example, a fourth digital sampling circuit 760 in FIG. 7B, the digital sampling circuit 770 in FIG. 7C, or the digital sampling circuit 771 in FIG. 7D.

The second sampling circuit 614 may be configured to provide the second sampled data signal, denoted by "e," by sampling the input data signal 305 according to the second clock signal 606. Specifically, the input data signal 305 may be sampled by the second sampling circuit 614 at the transition edge of the second clock signal 606. The transition edge of the second clock signal 606 may be the rising edge of the second clock signal 606 or the falling edge of the second clock signal 606. In an embodiment, the second sampled data signal may be a digital signal. Similar to the first sampled data signal, the second sampled data signal may be represented by M binary bits, where M is a positive integer, depending on the modulation format of the input data signal 305. Further, the input data signal 305 may be either an analog data signal or a digital data signal. Accordingly, when the input data signal 305 is the analog data signal, the second sampling circuit 614 may be an analog sampling circuit, for example, a second analog sampling circuit 720 as shown in FIG. 7A. Alternatively, when the input data signal 305 is a digital data signal, the second sampling circuit 614 may be an digital sampling circuit, for example, a fifth digital sampling circuit 762 in FIG. 7B, the digital sampling circuit 770 in FIG. 7C, or the digital sampling circuit 771 in FIG. 7D.

The third sampling circuit 616 may be configured to provide the third sampled data signal, denoted by "el," by sampling the input data signal 305 according to the third clock signal 607. Specifically, the input data signal 305 may be sampled by the third sampling circuit 616 at the transition edge of the third clock signal 607. The transition edge of the third clock signal 607 may be the rising edge of the third clock signal 607 or the falling edge of the third clock signal 607. In an embodiment, the third sampled data signal may be a digital signal. Similar to the first sampled data signal and the second sampled data signal, the third sampled data signal may be represented by M binary bits, where M is a positive integer, depending on the modulation format of the input data signal 305. Further, the input data signal 305 may be either an analog data signal or a digital data signal. Accordingly, when the input data signal 305 is the analog data signal, the third sampling circuit 616 may be an analog sampling circuit, for example, the third analog sampling circuit 730 as shown in FIG. 7A. Alternatively, when the input data signal 305 is a digital data signal, the third sampling circuit 616 may be an digital sampling circuit, for example, a sixth digital sampling circuit 764 in FIG. 7B, the digital sampling circuit 770 in FIG. 7C, or the digital sampling circuit 771 in FIG. 7D.

The synchronizer 620 may be configured to provide a plurality of synchronized signals based on the first sampled data signal (denoted by "d"), the second sampled data signal (denoted by "e"), and the third sampled data signal (denoted by "el"). In an embodiment, the synchronizer 620 may also be referred to as a synchronizing circuit. The plurality of synchronized signals may include a first synchronized signal (denoted by "d'"), a second synchronized signal (denoted by "e'"), and a third synchronized signal (denoted by "el'"). Since the first clock signal 605, the second clock signal 606, and the third clock signal 607 are not synchronized due to the delays between any two of them, the first sampled data signal, the second sampled data signal, and the third sampled data signal are not synchronized. Therefore, the synchronizer 620 may be used to provide the first synchronized signal, the second synchronized signal, and the third synchronized signal by synchronizing the first sampled data signal, the second sampled data signal, and the third sampled data signal. In other words, the first synchronized signal, the second synchronized signal, and the third synchronized signal are synchronized with each other, meaning a first time duration between any transition edge (e.g., a rising edge or a falling edge) of the first synchronized signal and any transition edge (e.g., a rising edge or falling edge) of the second synchronized signal is equal to a first integer number of clock period, a second time duration between any transition edge (e.g., a rising edge or a falling edge) of the first synchronized signal and any transition edge (e.g., a rising edge or a falling edge) of the third synchronized signal is equal to a second integer number of clock period, and a third time duration between any transition edge (e.g., a rising edge or a falling edge) of the second synchronized signal and any transition edge (e.g., a rising edge or a falling edge) of the third synchronized signal is equal to a third integer number of the clock period. The clock period may be the inverse of the frequency of the clock signal 605.

As shown, the synchronizer 620 may include a first digital sampling circuit 622, a second digital sampling circuit 624, and a third digital sampling circuit 626. The first digital sampling circuit 622 may be configured to provide the first synchronized signal (denoted by "d'"), at the output port (denoted by "O") by sampling the first sampled data signal (denoted by "d"), received at the input port (denoted by "I") according to the first clock signal 605. Specifically, the first sampled data signal (denoted by "d"), may be sampled at the transition edge (e.g., the rising edge or the falling edge) of the first clock signal 605. Both the first synchronized signal (denoted by "d'"), and the first sampled data signal (denoted by "d"), are digital signals. The first synchronized signal (denoted by "d'"), may be represented by a same number of binary bits as the first sampled data signal (denoted by "d"). For example, both the first synchronized signal (denoted by "d'"), and the first sampled data signal (denoted by "d"), may be represented by one binary bit, i.e., 1 or 0. This may occur when, for example, the input data signal 305 is an NRZ data signal. For another example, both the first synchronized signal (denoted by "d'"), and the first sampled data signal (denoted by "d"), may be represented by two binary bits, i.e., 00, 01, 10, or 11. This may occur when, for example, the input data signal 305 is a PAM4 data signal. The examples are not limiting.

The second digital sampling circuit 624 may be configured to provide the second synchronized signal (denoted by "e'"), at the output port (denoted by "O") by sampling the second sampled data signal (denoted by "e"), received at the input port (denoted by "I") according to the second clock signal 606. Specifically, the second sampled data signal (denoted by "e"), may be sampled at the transition edge (e.g., the rising edge or the falling edge) of the second clock signal 606. Both the second synchronized signal (denoted by "e'"), and the second sampled data signal (denoted by "e"), are digital signals. The second synchronized signal (denoted by "e'"), may be represented by a same number of binary bits as the second sampled data signal (denoted by "e"). For example, both the second synchronized signal (denoted by "e'"), and the second sampled data signal (denoted by "e"), may be represented by one binary bit, i.e., 1 or 0. This may occur when, for example, the input data signal 305 is an NRZ data signal. For another example, both the second synchronized signal (denoted by "e'"), and the second sampled data signal (denoted by "e"), may be represented by two binary bits, i.e., 00, 01, 10, or 11. This may occur when, for example, the input data signal 305 is a PAM4 data signal. The examples are not limiting.

The third digital sampling circuit 626 may be configured to provide the third synchronized signal (denoted by "el'"), at the output port (denoted by "O") by sampling the third sampled data signal (denoted by "el"), received at the input port (denoted by "I") according to the third clock signal 607. Specifically, the third sampled data signal (denoted by "el"), may be sampled at the transition edge (e.g., the rising edge or the falling edge) of the third clock signal 607. Both the third synchronized signal (denoted by "el'"), and the third sampled data signal (denoted by "el"), are digital signals. The third synchronized signal (denoted by "el'"), may be represented by a same number of binary bits as the third sampled data signal (denoted by "el"). For example, both the third synchronized signal (denoted by "el'"), and the third sampled data signal (denoted by "el"), may be represented by one binary bit, i.e., 1 or 0. This may occur when, for example, the input data signal 305 is an NRZ data signal. For another example, both the third synchronized signal (denoted by "el'"), and the third sampled data signal (denoted by "el"), may be represented by two binary bits, i.e., 00, 01, 10, or 11. This may occur when, for example, the input data signal 305 is a PAM4 data signal. The examples are not limiting. In an embodiment, the first digital sampling circuit 622, the second digital sampling circuit 624, and the third digital sampling circuit 626 may be configured as in FIG. 7C and FIG. 7D.

The characterization signal generator 630 may be configured to provide a first characterization signal (denoted by "EL"), a second characterization signal (denoted by "LL"), and a third characterization signal (denoted by "EE") based on the first sampled data signal (denoted by "d"), the first synchronized signal (denoted by "d'"), the second synchronized signal (denoted by "e'"), and the third synchronized signal (denoted by "el'").

As shown, the characterization signal generator 630 includes a first XOR operator 632, a second XOR operator 634, a third XOR operator 636, and a fourth XOR operator 638. The first XOR operator 632 may include a first input port configured to receive the first sampled data signal (denoted by "d"), and a second input port configured to receive the second synchronized signal (denoted by "e'"). The first XOR operator 632 may further include an output port configured to output a first XOR signal (denoted by "early1"). The first XOR signal, "early1," may be a digital signal, represented by one binary bit, e.g, 1 or 0. The first XOR operator 632 may be configured to provide the first XOR signal, "early1," by performing an XOR operation on the first sampled data signal (denoted by "d"), and the second synchronized signal (denoted by "e'''"). That is, the first XOR signal, "early1," may be represented by the bit of "1" when the first sampled data signal (denoted by "d"), is different from the second synchronized signal (denoted by "e'''"). Otherwise, the first XOR signal, "early1," may be represented by the bit of "0." Both the first sampled data signal (denoted by "d"), and the second synchronized signal (denoted by "e'''"), may be represented by one or more binary bits, as described above.

The second XOR operator 634 may include a first input port configured to receive the first synchronized signal (denoted by "d'''"), and a second input port configured to receive the second synchronized signal (denoted by "e'''"). The second XOR operator 634 may further include an output port configured to output a second XOR signal (denoted by "late1"). The second XOR signal, "late1," may be a digital signal, represented by a binary bit, i.e., 1 or 0. The second XOR operator 634 may be configured to provide the second XOR signal, "late1," by performing an XOR operation on the first synchronized signal (denoted by "d'''"), and the second synchronized signal (denoted by "e'''"). That is, the second XOR signal, "late1," may be represented by the bit of '1' when the first synchronized signal (denoted by "d'''"), is different from the second synchronized signal (denoted by "e'''"). Otherwise, the second XOR signal, "late1," may be represented by the bit of "0." Both the first synchronized signal (denoted by "d'''"), and the second synchronized signal (denoted by "e'''"), may be represented by one or more binary bits, as described above.

The third XOR operator 636 may include a first input port configured to receive the first synchronized signal (denoted by "d'''"), and a second input port configured to receive the third synchronized signal (denoted by "el'''"). The third XOR operator 636 may further include an output port configured to output a third XOR signal (denoted by "late2"). The third XOR signal may be a digital signal, represented by one binary bit, i.e., 1 or 0. The third XOR operator 636 may be configured to provide the third XOR signal, "late2," by performing an XOR operation on the first synchronized signal (denoted by "d'''"), and the third synchronized signal (denoted by "el'''"). That is, the third XOR signal, "late2," may be represented by the bit of "1" when the first synchronized signal (denoted by "d'''"), is different from the third synchronized signal (denoted by "el'''"). Otherwise, the third XOR signal, "late2," may be represented by the bit of "0." Both the first synchronized signal (denoted by "d'''"), and the third synchronized signal (denoted by "el'''"), may be represented by one or more binary bits, as described above.

The fourth XOR operator 638 may include a first input port configured to receive the first sampled data signal (denoted by "d"), and a second input port configured to receive the third synchronized signal (denoted by "el'''"). The fourth XOR operator 638 may further include an output port configured to output a fourth XOR signal (denoted by "early2"). The fourth XOR signal may be a digital signal, represented by one binary bit, i.e., 1 or 0. The fourth XOR operator 638 may be configured to provide the fourth XOR signal, "early2," by performing an XOR operation on the first sampled data signal (denoted by "d"), and the third synchronized signal (denoted by "el'''"). That is, the fourth XOR signal, "early2," may be represented by the bit of "1" when the first sampled data signal (denoted by "d"), is different from the third synchronized signal (denoted by "el'''"). Otherwise, the fourth XOR signal, "early2," may be represented by the bit of "0." Both the first sampled data signal (denoted by "d"), and the third synchronized signal (denoted by "el'''"), may be represented by one or more binary bits, as described above.

As shown, the characterization signal generator 630 may further include a first AND gate 633, a second AND gate 635, and a third AND gate 637. The first AND gate 633 may include a first input port configured to receive the first XOR signal, "early1," and a second input port configured to receive the third XOR signal, "late2." The first AND gate 633 may further include an output port configured to provide the first characterization signal, "EL." The first AND gate 633 may be configured to generate the first characterization signal (denoted by "EL"), by performing an AND operation on the first XOR signal, "early1," and the third XOR signal, "late2." That is, the first characterization signal (denoted by "EL"), may be represented by the bit of "1" when both the first XOR signal, "early1," and the third XOR signal, "late2," are represented by the bit of "1." Otherwise, the first characterization signal (denoted by "EL"), may be represented by the bit of "0."

The second AND gate 635 may include a first input port configured to receive the second XOR signal, "late1," and a second input port configured to receive the third XOR signal, "late2." The second AND gate 635 may further include an output port configured to provide the second characterization signal, "LL." The second AND gate 635 may be configured to generate the second characterization signal (denoted by "LL"), by performing an AND operation on the second XOR signal, "late1," and the third XOR signal, "late2." That is, the second characterization signal (denoted by "LL"), may be represented by the bit of "1" when both the second XOR signal, "late1," and the third XOR signal, "late2," are represented by the bit of "1." Otherwise, the second characterization signal (denoted by "LL"), may be represented by the bit of "0."

The third AND gate 637 may include a first input port configured to receive the first XOR signal, "early1," and a second input port configured to receive the fourth XOR signal, "early2." The third AND gate 637 may further include an output port configured to provide the third characterization signal (denoted by "EE"). The third AND gate 637 may be configured to generate the third characterization signal (denoted by "EE"), by performing an AND operation on the first XOR signal, "early1," and the fourth XOR signal, "early2." That is, the third characterization signal (denoted by "EE"), may be represented by the bit of "1" when both the first XOR signal, "early1," and the fourth XOR signal, "early2," are represented by the bit of "1." Otherwise, the third characterization signal (denoted by "EE"), may be represented by the bit of "0." In an embodiment, only one of the first characterization signal (denoted by "EL"), the second characterization signal (denoted by "LL"), and the third characterization signal (denoted by "EE"), may be represented by the bit of "1" (or have a high voltage) at any time.

The control signal generator 640 may be configured to provide the first control signal 352 indicating whether to decrease the frequency of the first clock signal 605 and the second control signal 354 indicating whether to increase the frequency of the first clock signal 605 upon receipt of the first clock signal 605, the first characterization signal (denoted by "EL"), the second characterization signal (denoted by "LL"), and the third characterization signal (denoted by "EE"). In an embodiment, the first control signal 352 and the second control signal 354 may be determined based on the temporal occurrence of the bit of "1" (or equivalently, a high voltage) among the first characterization signal (denoted by "EL"), the second characterization signal (denoted by "LL"), and the third characterization signal (denoted by "EE").

For example, the first control signal 352 may be represented by the bit of "1" (or have a high voltage), and the second control signal 354 may be represented by the bit of "0" (or have a low voltage), when the bit of "1" (or equivalently, the high voltage) occurs in the third characterization signal (denoted by "EE"), followed by at least two second characterization signal (denoted by "LL"), and subsequently followed by the first characterization signal, "EL." This indicates the frequency of the first clock signal 605 is faster than the frequency of the input data signal 305. Accordingly, the frequency of the first clock signal 605 is to be decreased.

For another example, the first control signal 352 may be represented by the bit of "0" (or have a low voltage), and the second control signal 354 may be represented by the bit of "1" (or have the high voltage) when the bit of "1" (or equivalently, the high voltage) occurs in the first characterization signal (denoted by "EL"), followed by at least two second characterization signal (denoted by "LL"), and subsequently followed by the third characterization signal (denoted by "EE"). This indicates the frequency of the first clock signal 605 is slower than the frequency of the input data signal 305. Accordingly, the frequency of the first clock signal 605 is to be increased. More details about the control signal generator 640 will be described below associated with FIG. 9-FIG. 14. In an embodiment, the control signal generator 640 may also be referred to as a control circuit.

In an embodiment, one or more components included in the FD 350 as shown in FIG. 6 may be implemented using complementary metal-oxide-semiconductor (CMOS) technologies, for example, fabricated in silicon. That is, the one or more components may be implemented using p-channel metal-oxide-semiconductor field effect transistors (PMOS) and/or n-channel metal-oxide-semiconductor field effect transistors (NMOS). For example, the first delay buffer 613 and the second delay buffer 615 may be implemented by cascading an even number of inverters fabricated using CMOS technology.

In an embodiment, one or more components included in the FD 350 as shown in FIG. 6 may be implemented based on current mode logic (CML), for example, fabricated in Silicon Germanium (Si—Ge). For example, the first delay buffer 613 and the second delay buffer 615 may be CIVIL-based current-steering delay.

Referring to FIG. 7A, a schematic diagram of a sampling unit 705 is depicted according to an embodiment of the disclosure. The sampling unit 705 may be the sampling unit 610 in FIG. 6, when the input data signal 305 is an analog data signal. As shown, in addition to the first delay buffer 613 and the second delay buffer 615 as described in FIG. 6, the sampling unit 705 may further include a first analog-to-digital comparator 710, a second analog-to-digital comparator 720, and a third analog-to-digital comparator 730, which may be configured as the first sampling circuit 612, the second sampling circuit 614, and the third sampling circuit 616 respectively, as shown in FIG. 6. In an embodiment, at least one of the first analog-to-digital comparator 710, the second analog-to-digital comparator 720, and the third analog-to-digital comparator 730 may be a sense amplifier implemented using the CMOS technology. The sense amplifier may include, but not limited to, a strong-arm latch or a two-stage regenerative latch. In an embodiment, at least one of the first analog-to-digital comparator 710, the second analog-to-digital comparator 720, and the third analog-to-digital comparator 730 may be a CIVIL latch. The CIVIL latch may be implemented in CMOS technologies fabricated in, for example, silicon. In addition or alternatively, the CIVIL latch may be implemented in bipolar technologies fabricated in, for example, SiGe.

Specifically, the first analog-to-digital comparator 710 may include a first data input port, denoted by "+," configured to receive the analog data signal 305, and a second data input port, denoted by "−," configured to receive an inverted copy of the analog data signal 305 (e.g., obtained by inverting the polarity of the analog data signal 305 using an inverter as denoted by "A" circle). The first analog-to-digital comparator 710 may further include a trigger input port, denoted by "A" triangle, configured to receive the first clock signal 605. In addition, the first analog-to-digital comparator 710 may include an output port, denoted by "O," configured to provide the first sampled data signal (denoted by "d"). In an embodiment, the first sampled data signal (denoted by "d"), may also be referred to as the retimed data signal 715. The first analog-to-digital comparator 710 may be configured to provide the first sampled data signal (denoted by "d"), by sampling the analog data signal 305 according to the first clock signal 605. Specifically, the first analog-to-digital comparator 710 may be configured to provide a first sampled analog signal by sampling the analog data signal 305 at the transition edge of the first clock signal 605. The transition edge of the first clock signal 605 may be the rising edge or the falling edge of the first clock signal 605. The first analog-to-digital comparator 710 may be further configured to compare the amplitude of the first sampled analog signal with a first set of threshold levels associated with the first analog-to-digital comparator 710. The first analog-to-digital comparator 710 may be further configured to provide the first sampled data signal (denoted by "d"), based on the comparison. The first set of threshold levels may include any suitable number of threshold levels. For example, the first set of the threshold levels may include a first threshold level, a second threshold level (which is greater than the first threshold level), and a third threshold level (which is greater than the second threshold level). When the amplitude of the first sampled analog signal is below the first threshold level, the first sampled data signal (denoted by "d"), may be represented by 00. When the amplitude of the first sampled analog signal is above the first threshold level but below the second threshold level, the first sampled data signal (denoted by "d"), may be represented by 01. When the amplitude of the first sampled analog signal is above the second threshold level but below the third threshold level, the first sampled data signal (denoted by "d"), may be represented by 10. When the amplitude of the first sampled analog signal is above the third threshold level, the first sampled data signal (denoted by "d"), may be represented by 11. The examples are not limiting. The first sampled data signal (denoted by "d"), may be represented by any suitable number of binary bits. Further as shown, a data stream of the first sampled data signal (denoted by "d"), may include a plurality of first sample data signals, denoted by "D"$_0$, $d_1$, $d_2$, . . . , each of which may be represented by one or more binary bits, and may be provided by sampling the analog data signal 305 at a different transition edge of the first clock signal 605.

The second analog-to-digital comparator 720 may include a first data input port, denoted by "+," configured to receive the analog data signal 305, and a second data input port, denoted by "−," configured to receive the inverted copy of the analog data signal 305 (e.g., obtained by inverting the polarity of the analog data signal 305 using an inverter as denoted by "A" circle). The second analog-to-digital comparator 720 may further include a trigger input port, denoted by "A" triangle, configured to receive the second clock signal 606. In addition, the second analog-to-digital comparator 720 may include an output port, denoted by "O," configured to provide the second sampled data signal (denoted by "e"). In an embodiment, the second analog-to-digital comparator 720 may be configured to provide the second sampled data signal (denoted by "e"), by sampling the analog data signal 305 according to the second clock signal 606. Specifically, the second analog-to-digital comparator 720 may be configured to provide a second sampled analog signal by sampling the analog data signal 305 at the transition edge of the second clock signal 606. The transition edge of the second clock signal may be the rising edge or the falling edge of the second clock signal 606. The second analog-to-digital comparator 720 may be further configured to compare the amplitude of the second sampled analog signal with a second set of threshold levels associated with the second analog-to-digital comparator 720. The second analog-to-digital comparator 720 may be further configured to provide the second sampled data signal (denoted by "e"), based on the comparison. Similar to the first set of threshold levels associated with the first analog-to-digital comparator 710, the second set of threshold levels may include any suitable number of threshold levels. Accordingly, the second sampled data signal (denoted by "e"), may be represented by any suitable number of binary bits. Further as shown, a data stream of the second sampled data signal (denoted by "e"), may include a plurality of second sample data signals, denoted by $e_0, e_1, e_2, \ldots$, each of which may be represented by one or more binary bits, and may be provided by sampling the analog data signal 305 at a different transition edge of the second clock signal 606.

The third analog-to-digital comparator 730 may include a first data input port, denoted by "+," configured to receive the analog data signal 305, and a second data input port, denoted by "−," configured to receive the inverted copy of the analog data signal 305 (e.g., obtained by inverting the polarity of the analog data signal 305 using an inverter as denoted by "A" circle). The third analog-to-digital comparator 730 may further include a trigger input port, denoted by "A" triangle, configured to receive the third clock signal 607. In addition, the third analog-to-digital comparator 730 may include an output port, denoted by "O," configured to provide the third sampled data signal (denoted by "el"). In an embodiment, the third analog-to-digital comparator 730 may be configured to provide the third sampled data signal (denoted by "el"), by sampling the analog data signal 305 according to the third clock signal 607. Specifically, the third analog-to-digital comparator 730 may be configured to provide a third sampled analog signal by sampling the analog data signal 305 at the transition edge of the third clock signal 607. The transition edge of the second clock signal may be the rising edge or the falling edge of the third clock signal 607. The third analog-to-digital comparator 730 may be further configured to compare the amplitude of the third sampled analog signal with a third set of threshold levels associated with the third analog-to-digital comparator 730. The third analog-to-digital comparator 730 may be further configured to provide the third sampled data signal (denoted by "el"), based on the comparison. Similar to the first set of threshold levels associated with the first analog-to-digital comparator 710, the third set of threshold levels may include any suitable number of threshold levels. Accordingly, the third sampled data signal (denoted by "el"), may be represented by any suitable number of binary bits. Further as shown, a data stream of the third sampled data signal (denoted by "el"), may include a plurality of third sample data signals, denoted by $el_0, el_1, el_2, \ldots$, each of which may be represented by one or more binary bits, and may be provided by sampling the analog data signal 305 at a different transition edge of the third clock signal 607.

In an embodiment, the first set of threshold levels, the second set of threshold levels and the third set of threshold levels may be the same. In an embodiment, the first set of threshold levels, the second set of threshold levels and the third set of threshold levels may be different. In an embodiment, at least one of the first set of threshold levels, the second set of threshold levels, and the third set of threshold levels may be adjusted by an external control signal. This may be done so that an additional phase shift may be applied to the first clock signal 605, the second clock signal 606, and/or the third clock signal 607 accordingly.

Figure 7B:
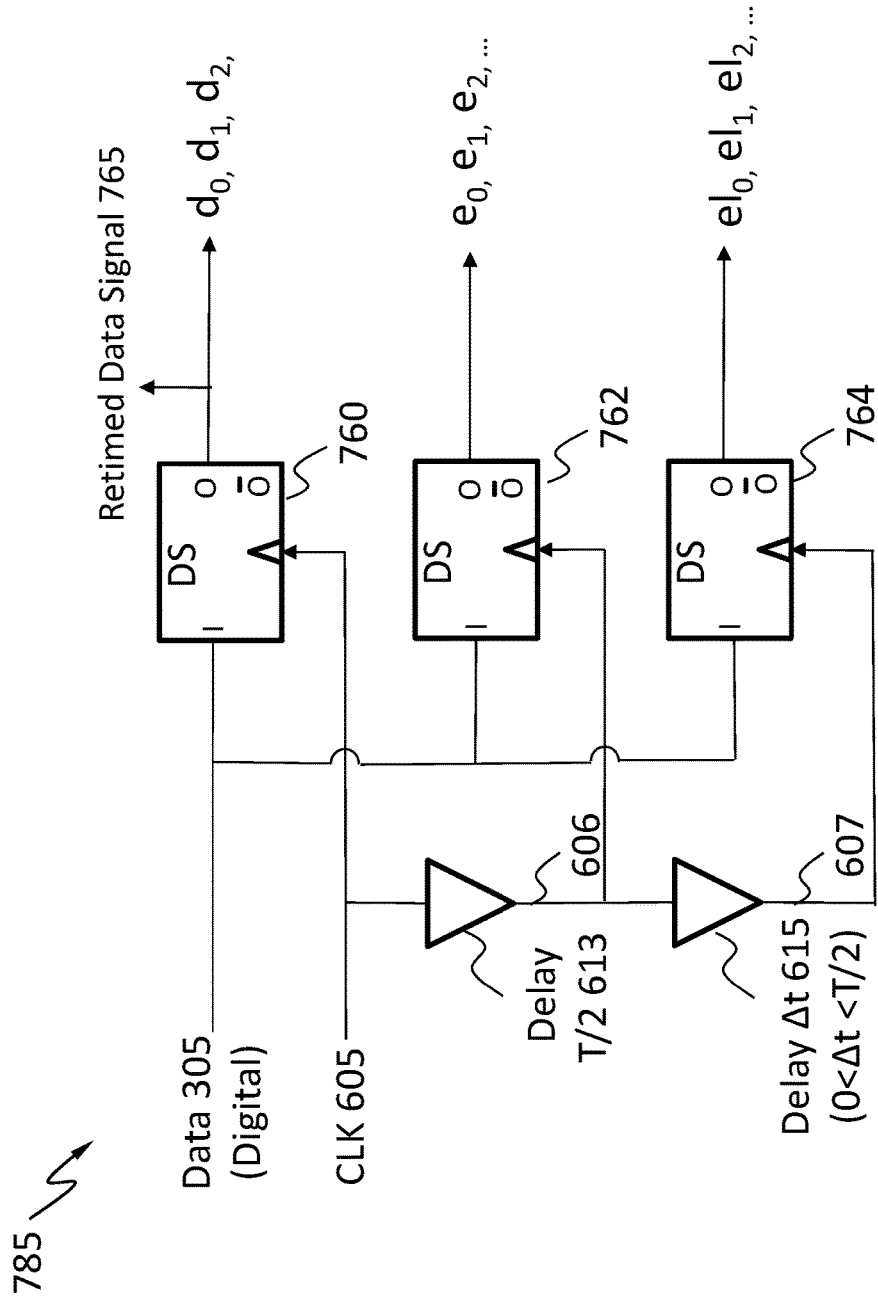
FIG. 7B is a schematic diagram of a sampling unit for sampling a digital data signal according to an embodiment of the disclosure.

Referring to FIG. 7B, a schematic diagram of a sampling unit 785 is depicted according to an embodiment of the disclosure. The sampling unit 785 may be the sampling unit 610 in FIG. 6, when the input data signal 305 is a digital data signal. In an embodiment, the digital data signal, i.e., the input data signal 305 in FIG. 7B, may be provided based on an analog data signal. For example, the digital data signal 305 in FIG. 7B may be converted from the analog data signal 305 in FIG. 7A, for example, using an analog-to-digital converter. In an embodiment, the input data signal 305, in FIG. 7B, may be represented by one or more binary bits. For example, the input data signal 305 may be represented by one binary bit, i.e., 1 or 0, when the input data signal 305 corresponds to an NRZ data signal (e.g., when the input data signal 305 in FIG. 7B is converted from the NRZ data signal.). For example, the input data signal 305 in FIG. 7B may be represented by more than one binary bit when the input data signal 305 in FIG. 7B corresponds to a non-NRZ data signal. Specifically, the input data signal 305 in FIG. 7B may be represented by two binary bits when the input data signal 305 is converted from a PAM4 data signal. Further, the input data signal 305 in FIG. 7B may be represented by three binary bits when the input data signal 305 is converted from a PAM8 data signal. The examples are not limiting.

As shown in FIG. 7B, in addition to the first delay buffer 613 and the second delay buffer 615 as described in FIG. 6, the sampling unit 785 may further include the fourth digital sampling circuit 760, the fifth digital sampling circuit 762, and the sixth digital sampling circuit 764, which may be configured as the first sampling circuit 612, the second sampling circuit 614, and the third sampling circuit 616 respectively, as shown in FIG. 6. In an embodiment, the fourth digital sampling circuit 760, the fifth digital sampling circuit 762, and the sixth digital sampling circuit 764 are similar to the first digital sampling circuit 622, the second digital sampling circuit 624, and the third digital sampling circuit 626.

The fourth digital sampling circuit 760 may be configured to provide the first sampled data signal (denoted by "d"), at the output port (denoted by "O") by sampling the input data signal 305, received at the input port (denoted by "I") according to the first clock signal 605. Specifically, the input data signal 305 may be sampled at the transition edge (e.g., the rising edge or the falling edge) of the first clock signal 605. In an embodiment, the first sampled data signal (denoted by "d"), may also be referred to as the retimed data signal 765. Both the input data signal 305 and the first sampled data signal (denoted by "d"), are digital signals. The first sampled data signal (denoted by "d"), may be represented by a same number of binary bits as the input data signal 305. In an embodiment, both the first sampled data signal (denoted by "d"), and the input data signal 305 may be represented by one or more binary bits. Further as shown, a data stream of the first sampled data signals may include a plurality of first sample data signals, denoted by $d_0$, $d_1$, $d_2$, . . . , each of which may be represented by one or more binary bits, and may be provided by sampling the input data signal 305 at a different transition edge of the first clock signal 605.

The fifth digital sampling circuit 762 may be configured to provide the second sampled data signal (denoted by "e"), at the output port (denoted by "O") by sampling the input data signal 305, received at the input port (denoted by "I") according to the second clock signal 606. Specifically, the input data signal 305 may be sampled at the transition edge (e.g., the rising edge or the falling edge) of the second clock signal 606. Both the input data signal 305 and the second sampled data signal (denoted by "e"), are digital signals. The second sampled data signal (denoted by "e"), may be represented by a same number of binary bits as the input data signal 305. In an embodiment, both the second sampled data signal (denoted by "e"), and the input data signal 305 may be represented by one or more binary bits. Further as shown, a data stream of the second sampled data signals may include a plurality of second sample data signals, denoted by $e_0$, $e_1$, $e_2$, . . . , each of which may be represented by one or more binary bits, and may be provided by sampling the input data signal 305 at a different transition edge of the second clock signal 606.

The sixth digital sampling circuit 764 may be configured to provide the third sampled data signal (denoted by "el"), at the output port (denoted by "O") by sampling the input data signal 305, received at the input port (denoted by "I") according to the third clock signal 607. Specifically, the input data signal 305 may be sampled at the transition edge (e.g., the rising edge or the falling edge) of the third clock signal 607. Both the input data signal 305 and the third sampled data signal (denoted by "el"), are digital signals. The third sampled data signal (denoted by "el"), may be represented by a same number of binary bits as the input data signal 305. In an embodiment, both the third sampled data signal (denoted by "el"), and the input data signal 305 may be represented by one or more binary bits. Further as shown, a data stream of the third sampled data signals may include a plurality of second sample data signals, denoted by $el_0$, $el_1$, $el_2$, . . . , each of which may be represented by one or more binary bits, and may be provided by sampling the input data signal 305 at a different transition edge of the third clock signal 607.

Figure 7C:
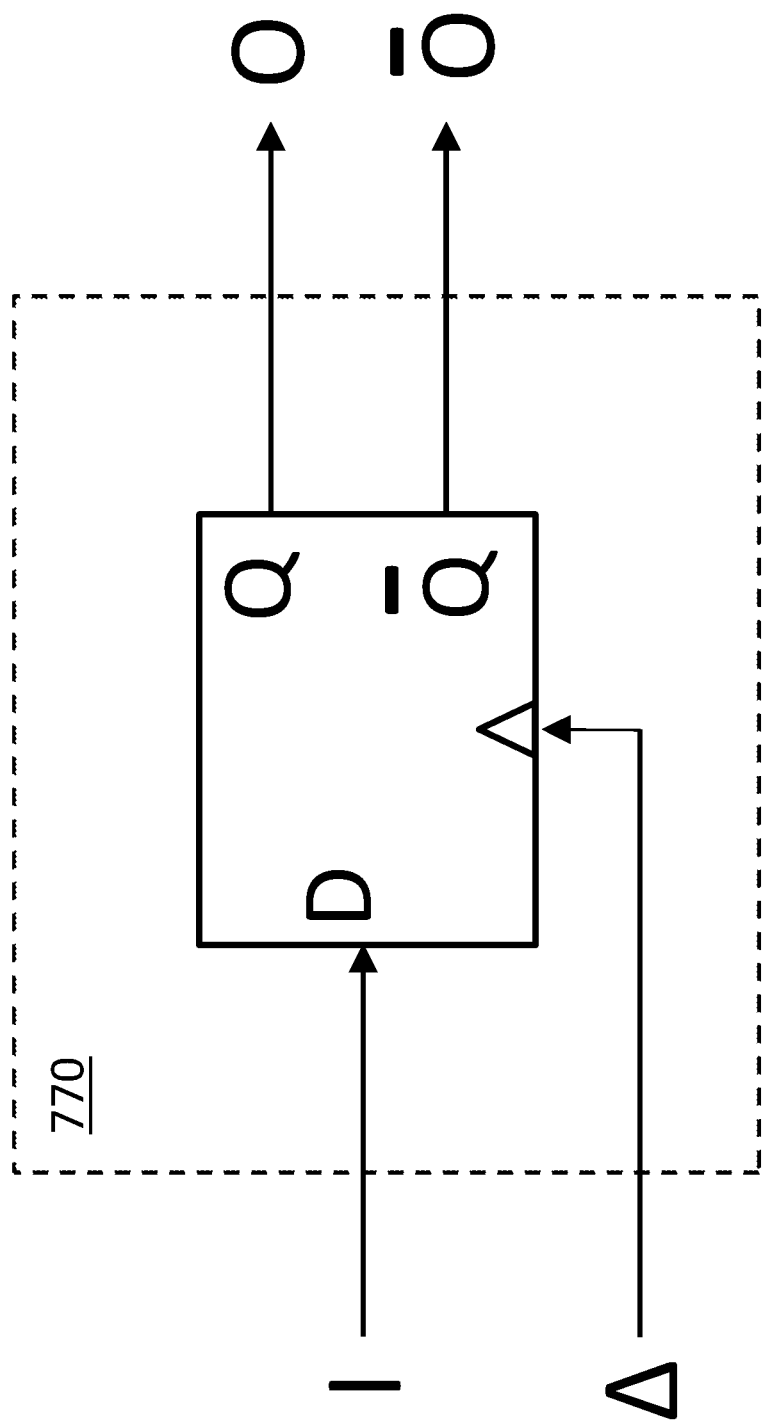
FIG. 7C is a schematic diagram of a digital sampling circuit according to an embodiment of the disclosure.
Figure 7D:
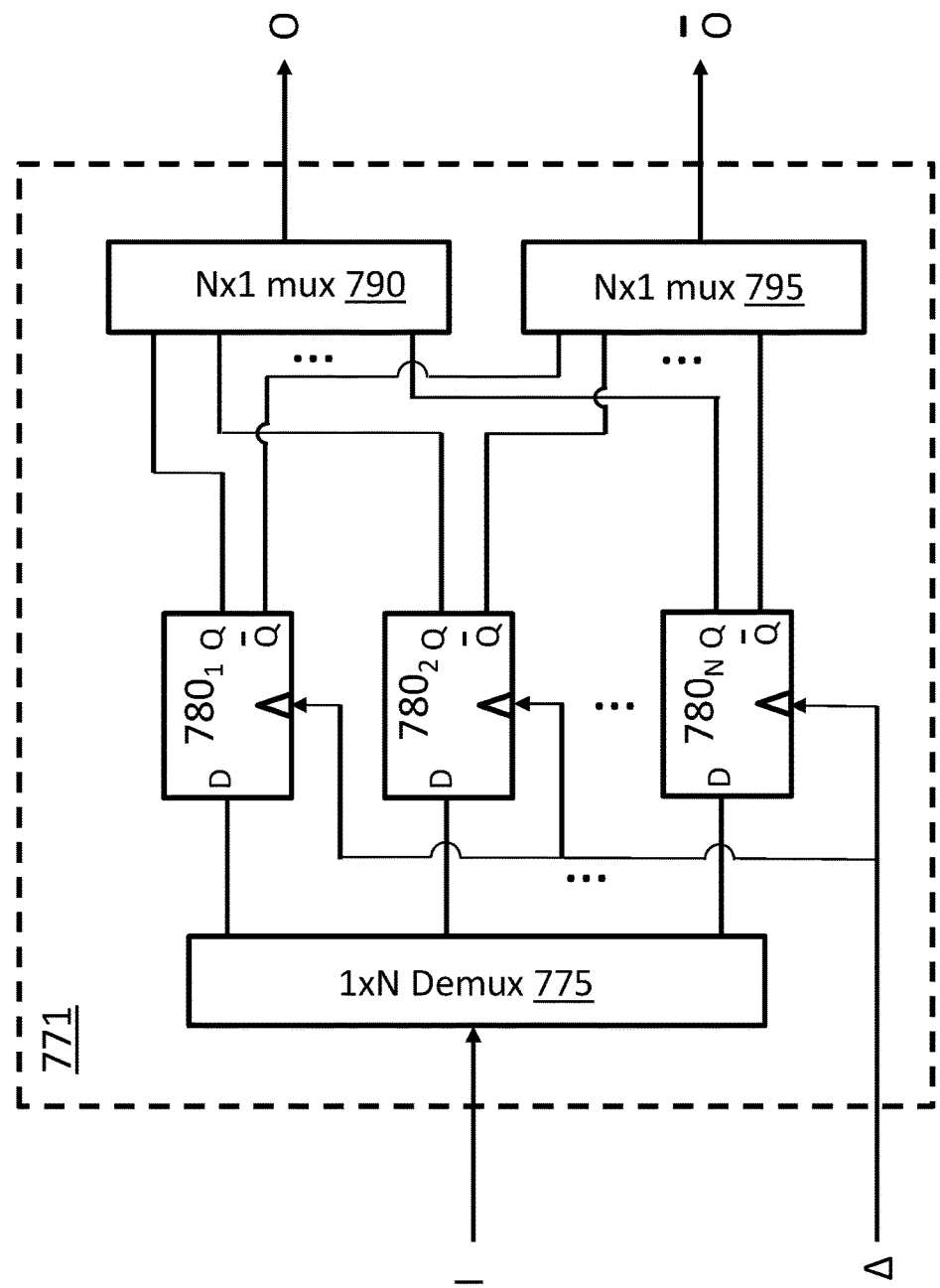
FIG. 7D is a schematic diagram of a digital sampling circuit according to an embodiment of the disclosure.

FIGS. 7C and 7D illustrate different embodiments of a digital sampling circuit 770, 771. The digital sampling circuits 770, 771 may be similar to the digital sampling circuits 622, 624, 626, 760, 762, and 764 as described above. The digital sampling circuit 770,771 may include an input port (denoted by "I") configured to receive a digital signal. The digital sampling circuit 770, 771 may include a trigger port (denoted by "Δ") configured to receive a clock signal (e.g, the clock signal 605). The digital sampling circuit 770, 771 may further include an output port (denoted by "O") configured to provide a sampled digital signal. In an embodiment, the received digital signal and the sampled digital signal may be represented by the same number of binary bits. For example, both the received digital signal and the sampled digital signal may be represented by one binary bit, i.e., 1 or 0. For example, both the received digital signal and the sampled digital signal may be represented by more than one binary bit. The digital sampling circuit 770, 771 may be configured to generate the sampled digital signal by sampling the received digital signal according to the clock signal. Specifically, the digital sampling circuit 770, 771, may be configured to generate the sampled digital signal by sampling the received digital signal at the transition edge (e.g., the rising edge or the falling edge) of the clock signal received by the trigger port (denoted by "Δ") of the digital sampling circuit 770, 771.

Specifically, a schematic diagram of the digital sampling circuit 770 is depicted in FIG. 7C according to an embodiment of the disclosure. As shown, the digital sampling circuit 770 may be a D-type flip flop. This is configured when the digital signal received by the digital sampling circuit 770 may be represented by one binary bit, i.e., 1 or 0. For example, the digital signal may correspond to an NRZ data signal, or may be converted from the NRZ data signal. As shown in FIG. 7C, the D-type flip flop may be configured to provide a sampled signal outputted by an output port (denoted by "Q") by sampling the digital signal received from the input port (denoted by "D") according to the clock signal received from the trigger port (denoted by Δ). Specifically, the digital signal may be sampled at the transition edge of the clock signal received from the trigger port of the D-type flip flop. The transition edge may be a rising edge or a falling edge. As shown in FIG. 7C, the input port of the D-type flip flop (denoted by "D") corresponds to the input port I of the digital sampling circuit 770, the output port of the D-type flip flop (denoted by "Q") corresponds to the output port O of the digital sampling circuit 770, and the trigger port of the D-type flip flop (denoted by Δ) corresponds to the trigger port Δ of the digital sampling circuit 770.

Referring to FIG. 7D, a schematic diagram of a digital sampling circuit 771 is depicted according to an embodiment of the disclosure. The digital sampling circuit 771 may be configured when the digital signal received by the digital sampling circuit 771 is represented by N binary bits, where N is a positive integer. In an embodiment, N may be equal to 1. For example, the digital signal may correspond to an NRZ data signal, or may be converted from the NRZ data signal. In an embodiment, N may be a positive integer that is equal to or greater than two. For example, the digital signal may correspond to a non-NRZ data signal, or may be converted from the non-NRZ data signal. As shown in FIG. 7D, the digital sampling circuit 771 may include a data input port (denoted by "I") configured to receive the digital signal, a trigger port (denoted by Δ) configured to receive a clock signal, a data output port (denoted by "O") configured to provide the sampled data signal, and an inverted data output port (denoted by "O" bar) configured to provide the inverted sampled data signal. In an embodiment, the inverted sampled data signal and the inverted sampled data signal may be equal in amplitude but opposite in polarity. The digital sampling circuit 771 may be configured to generate the sampled data signal by sampling the digital data received from the input port (denoted by "I") according to the clock signal received from the trigger port (denoted by Δ) of the digital sampling circuit 771. Specifically, the digital signal may be sampled at the transition edge of the clock signal received from the trigger port of the digital sampling circuit 771. The transition edge may be a rising edge or a falling edge. In an embodiment, both the sampled data signal and the inverted sampled data signal may be represented by N binary bits.

As shown in FIG. 7D, the digital sampling circuit 771 may include a de-multiplexer 775, N D-type flip flops $780_{1-N}$, a first multiplexer 790, and a second multiplexer 795. The de-multiplexer 775 may be configured to receive the digital signal having N binary bits, where N is a positive integer. The de-multiplexer 775 may be further configured to provide each of the N binary bits to a different one of the N D-type flip flops $780_{1-N}$. In the non-limiting example as shown in FIG. 7D, a first binary bit of the digital signal may be provided to the first D-type flip flop $780_1$ through the data input port (denoted by "D") of the first D-type flip flop $780_1$, a second binary bit of the digital signal may be provided to the second D-type flip flop $780_2$ through the data input port (denoted by "D") of the second D-type flip flop $780_2$, . . . , and a $N_{th}$ binary bit of the digital signal may be provided to the $N_{th}$ D-type flip flop $780_N$ through the data input port (denoted by "D") of the $N_{th}$ D-type flip flop $780_N$.

Each of the D-type flip flops $780_{1-N}$ may be configured to provide a sampled bit through the output port (denoted by "Q") of the respective D-type flip flop $780_{1-N}$ by sampling the received binary bit at the transition edge (e.g., the rising edge or the falling edge) of the clock signal received from the trigger port (denoted by "Δ") of the digital sampling circuit 771. In addition, each of the D-type flip flops $780_{1-N}$ may be configured to provide an inverted sampled bit by inverting the polarity of the respective sampled bit. For example, the first D-type flip flop $780_1$ may be configured to provide a first sampled bit through the output port (denoted by "Q") of the first D-type flip flop $780_1$ by sampling the first binary bit of the digital signal at the transition edge of the clock signal, . . . , the $N_{th}$ D-type flip flop $780_N$ may be configured to provide a $N_{th}$ sampled bit through the output port (denoted by "Q") of the $N_{th}$ D-type flip flop $780_N$ by sampling the $N_{th}$ binary bit of the digital signal at the transition edge of the clock signal.

In addition, the first D-type flip flop $780_1$ may be further configured to provide a first inverted sampled bit through the inverted output port (denoted by "Q" bar) of the first D-type flip flop $780_1$ by inverting the polarity of the first sampled bit, . . . , the $N_{th}$ D-type flip flop $780_N$ may be further configured to provide an $N_{th}$ inverted sampled bit through the inverted output port (denoted by "Q" bar) of the $N_{th}$ D-type flip flop $780_N$ by inverting the polarity of the $N_{th}$ sampled bit.

The first multiplexer 790 may include N input ports, each of which may be coupled to the output port (denoted by "Q") of a different one of the D-type flip flops $780_{1-N}$. Accordingly, the first multiplexer 790 may be configured to receive the first sampled bit, the second sampled bit, . . . , and the $N_{th}$ sampled bit. The first multiplexer 790 may be further configured to combine the received sampled bits (i.e., the first sampled bit, the second sampled bit, . . . , and the $N_{th}$ sampled bit) in the same order as the first binary bit, the second binary bit, . . . , the $N_{th}$ binary bit are arranged in the digital signal received through the input port (denoted by "I") of the digital sampling circuit 771.

Similarly, the second multiplexer 795 may include N input ports, each of which may be coupled to the inverted output port (denoted by "Q" bar) of a different one of the D-type flip flops $780_{1-N}$. Accordingly, the second multiplexer 795 may be configured to receive the first inverted sampled bit, the second inverted sampled bit, . . . , and the $N_{th}$ inverted sampled bit. The second multiplexer 795 may be further configured to combine the received inverted sampled bits (i.e., the first inverted sampled bit, the second inverted sampled bit, . . . , and the $N_{th}$ inverted sampled bit) in the same order as the first binary bit, the second binary bit, . . . , the $N_{th}$ binary bit are arranged in the digital signal received through the input port (denoted by "I") of the digital sampling circuit 771.

Figure 8A:
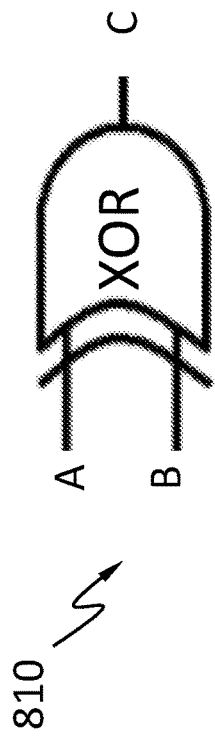
FIG. 8A is a schematic diagram of an XOR operator according to an embodiment of the disclosure.
Figure 8B:
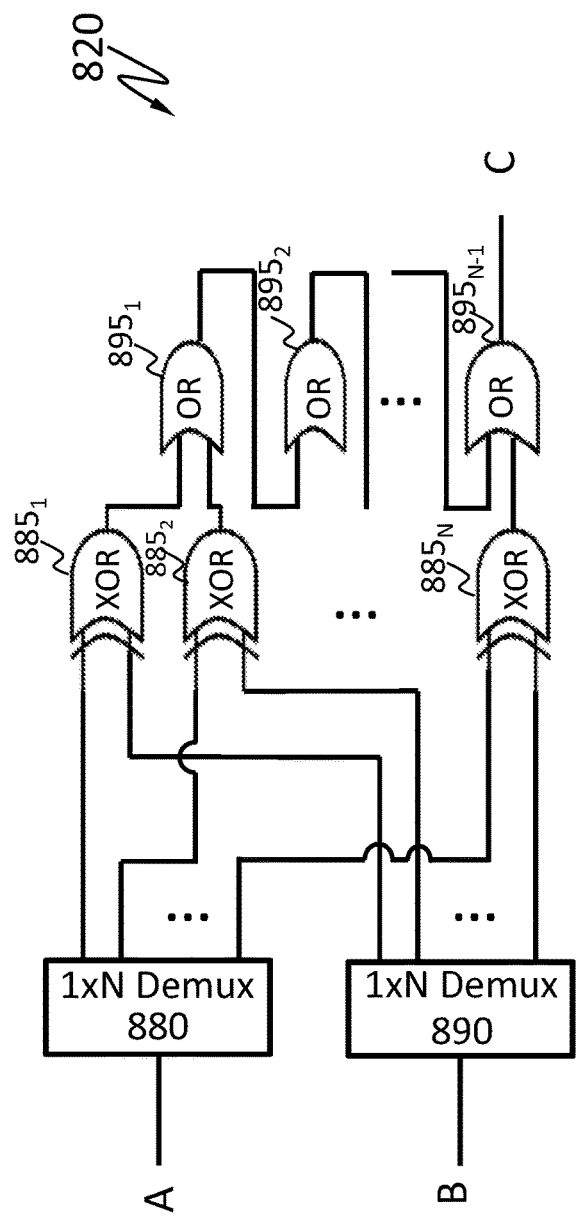
FIG. 8B is a schematic diagram of an XOR operator according to an embodiment of the disclosure.

FIGS. 8A and 8B illustrate different embodiments of an XOR operator 810, 820. The XOR operators 810, 820 may be similar to the XOR operators 632, 634, 636, and 638 in FIG. 6. The XOR operators 810, 820 may include a first input port (denoted by "A") configured to receive a first digital signal, and a second input port (denoted by "B") configured to receive a second digital signal. Both the first digital signal and the second digital signal may be represented by one or more binary bits. The XOR operators 810, 820 may further include an output port (denoted by "C") configured to provide an XOR signal which is a binary bit. The XOR operators 810, 820 may be configured to generate the XOR signal (i.e., the binary bit) by performing an XOR operation on the first digital signal and the second digital signal. Accordingly, the binary bit may be 1 (or a high voltage) when the first digital signal is different than the second digital signal. On the other hand, the binary bit may be 0 (or a low voltage) when the first digital signal is the same as the second digital signal.

Specifically, a schematic diagram of the XOR operator 810 is depicted in FIG. 8A. As shown, the XOR operator 810 may be an XOR gate. This is configured when both the first digital signal received through the first input port (denoted by "A") and the second digital signal received through the second input port (denoted by "B") are represented by one binary bit, i.e., 1 or 0.

In addition, a schematic diagram of the XOR operator 820 is depicted in FIG. 8B. The XOR operator 820 may be configured when both the first digital signal received by the first input port (denoted by "A") and the second digital signal received by the second input port (denote by B) are represented by N binary bits, where N is a positive integer. In an embodiment, N is equal to one. In an embodiment, N is equal to or greater than two.

As shown in FIG. 8B, the XOR operator 820 may include a first de-multiplexer 880, a second de-multiplexer 890, N XOR gates $885_{1-N}$, and (N−1) OR gate $895_{1-(N-1)}$. The first de-multiplexer 880 may be configured to receive the first digital signal having N binary bits, where N is a positive integer. The first de-multiplexer 880 may be further configured to provide each of the N binary bits of the first digital signal to a different one of the N XOR gates $885_{1-N}$. In the non-limiting example as shown in FIG. 8B, a first binary bit of the first digital signal may be provided to the first XOR gate $885_1$, a second binary bit of the first digital signal may be provided to the second XOR gate $885_2$, . . . , and a $N_{th}$ binary bit of the first digital signal may be provided to the $N_{th}$ XOR gate $885_N$.

The second de-multiplexer 890 may be configured to receive the second digital signal having N binary bits, where N is the positive integer as described above. The second de-multiplexer 890 may be further configured to provide each of the N binary bits of the first digital signal to a different one of the N XOR gates $885_{1-N}$ associated with the respective one of the N binary bits of the first digital signal. In the non-limiting example as shown in FIG. 8B, a first binary bit of the second digital signal may be provided to the first XOR gate $885_1$, a second binary bit of the second digital signal may be provided to the second XOR gate $885_2$, . . . , and a $N_{th}$ binary bit of the second digital signal may be provided to the $N_{th}$ XOR gate $885_N$.

Each of the XOR gates $885_{1-N}$ may be configured to provide an XOR bit by performing an XOR operation on a pair of binary bits from the first digital signal and the second digital signal, respectively. Specifically, the XOR bit may be 1 when the pair of binary bits is different, while the XOR bit may be 0 when the pair of binary bits is the same. For example, the first XOR gate $885_1$ may be configured to provide a first XOR bit by performing an XOR operation on the first binary bit of the first digital signal and the first binary bit of the second digital signal, . . . , and the $N_{th}$ XOR gate $885_N$ may be configured to provide a $N_{th}$ XOR bit by performing an XOR operation on the $N_{th}$ binary bit of the first digital signal and the $N_{th}$ binary bit of the second digital signal.

The OR gates $895_{1-(N-1)}$ may be cascaded as shown by coupling an output of each OR gate to an input of the next OR gate (if any). Further, each of the OR gates $895_{1-(N-1)}$ may include an input configured to receive a different XOR bit. Each of the OR gates $895_{1-(N-1)}$ may be configured to provide a bit of '1' when at least one of the input of the OR gate is a bit of '1,' and may be configured to provide a bit of '0' when both of the inputs of the OR gate are bits of '0.' The OR gates $895_{1-(N-1)}$ may be collectively configured as shown to determine whether at least one of the first XOR bit, the second XOR bit, . . . , and the $N_{th}$ XOR bit is the bit of "1." If so, the XOR signal, outputted by the output port (denoted by "C") of the XOR operator 820, may be represented by the bit of '1' (or a high voltage). Otherwise, the XOR signal, outputted by the output port (denoted by "C") of the XOR operator 820, may be represented by the bit of '0' (or a low voltage).

Figure 9:
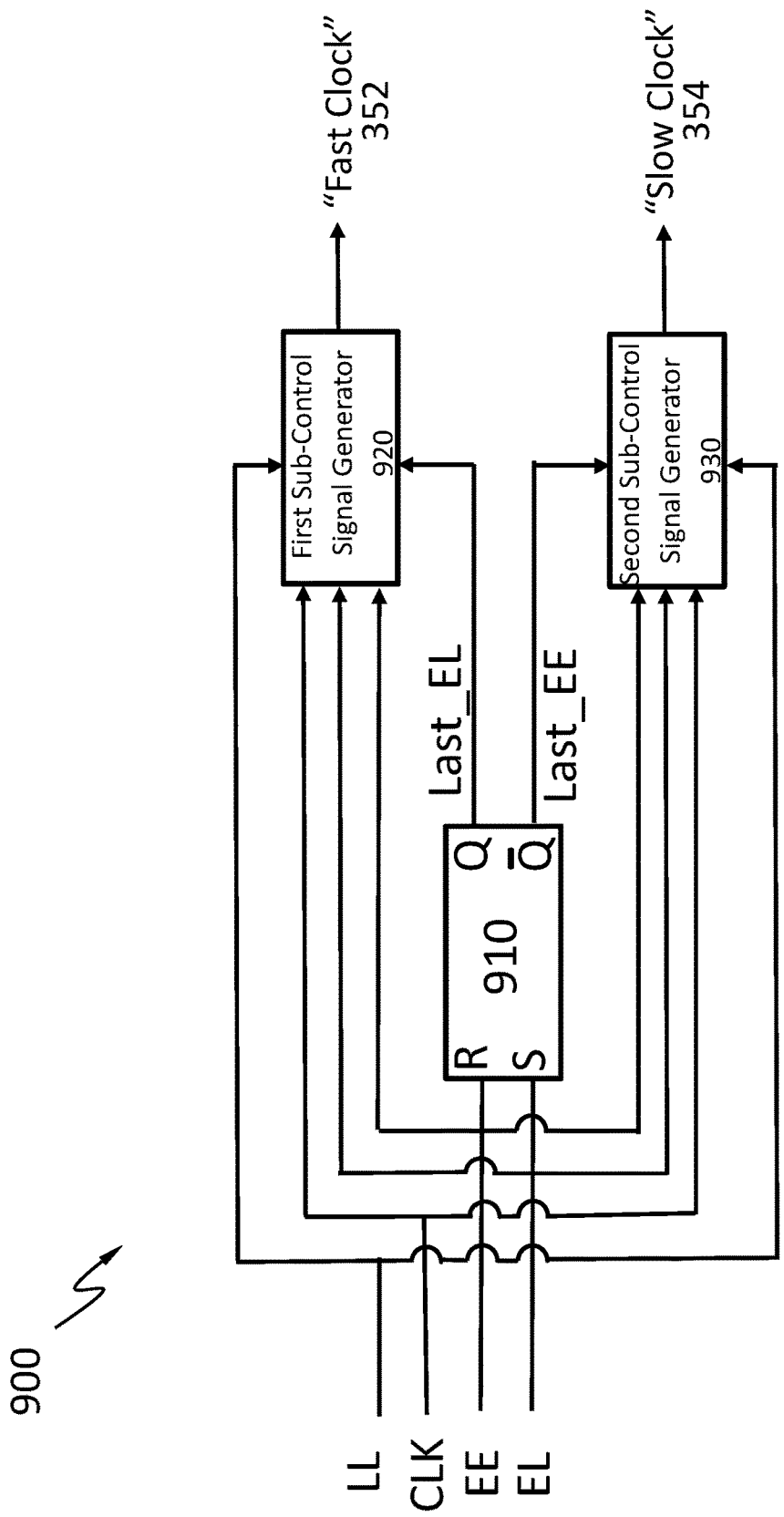
FIG. 9 is a schematic diagram of a control signal generator according to an embodiment of the disclosure.
Figure 10:
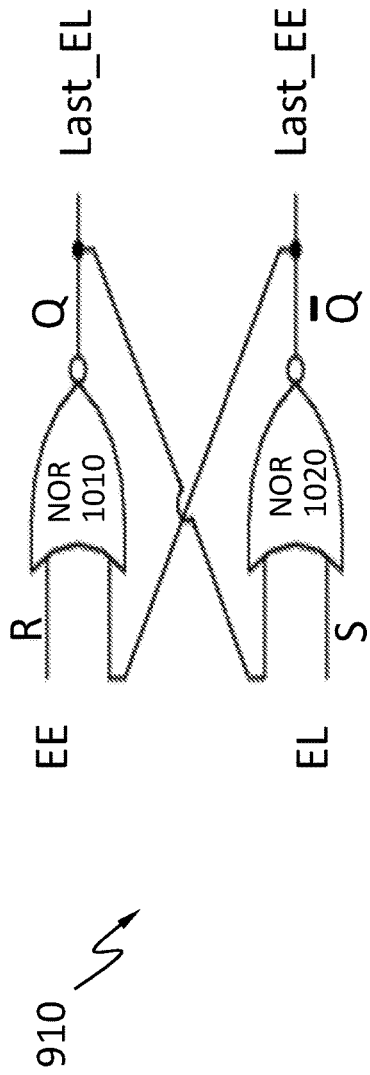
FIG. 10A is a schematic diagram of an RS-latch circuit according to an embodiment of the disclosure.
FIG. 10B is a truth table of an RS-latch circuit.

Referring to FIG. 9, a schematic diagram of a control signal generator 900 is depicted according to an embodiment of the disclosure. The control signal generator 900 may be similar to the control signal generator 640 in FIG. 6. In an embodiment, the control signal generator 900 may also be referred to as a control circuit. As described above, the control signal generator 900 may be configured to receive the first characterization signal (denoted by "EL"), the second characterization signal (denoted by "LL"), the third characterization signal (denoted by "EE"), and a clock signal (denoted by "CLK.") In an embodiment, the clock signal may be the clock signal 605 in FIG. 6, the clock signal 345 in FIG. 3A, or the clock signal 375 in FIG. 3B. The control signal generator 900 may be further configured to provide the first control signal (denoted by "fast clock") indicating to decrease the frequency of the clock signal, and the second control signal (denoted by "slow clock") upon receipt of the first characterization signal (denoted by "EL"), the second characterization signal (denoted by "LL"), the third characterization signal (denoted by "EE"), and the clock signal (denoted by "CLK").

As shown, the control signal generator 900 includes an RS-latch circuit 910, a first sub-control signal generator 920 coupled to the RS-latch circuit 910, and a second sub-control signal generator 930 coupled to the RS-latch circuit 910. The RS-latch circuit 910 may include a reset port (denoted by "R") configured to receive the third characterization signal (denoted by "EE") and a set port (denoted by "S") configured to receive the first characterization signal (denoted by "EL"). The RS-latch circuit 910 may further include an output port (denoted by "Q") configured to provide the last state of the first characterization signal, which may be denoted by "last_EL." The RS-latch circuit 910 may further include an inverted output port (denoted by "Q" bar) configured to provide the last state of the third characterization signal, which may be denoted by "last_EE."

The first sub-control signal generator 920 may be configured to receive the last state of the first characterization signal (denoted by "last_EL"), provided by the RS-latch circuit 910. The first sub-control signal generator 920 may be further configured to receive the clock signal (denoted by "CLK"), the first characterization signal (denoted by "EL"), the second characterization signal (denoted by "LL"), and the third characterization signal (denoted by "EE"). In addition, the first sub-control signal generator 920 may be configured to provide the first control signal (denoted by "fast clock") indicating whether to decrease the frequency of the clock signal (denoted by "CLK"). For example, when the first control signal (denoted by "fast clock") is represented by a bit of "1" (or a high voltage), it is indicated to decrease the frequency of the clock signal (denoted by "CLK"). On the other hand, when the first control signal (denoted by "fast clock") is represented by a bit of "0" (or a low voltage), it is indicated not to decrease the frequency of the clock signal (denoted by "CLK"). It should be noted when the first control signal (denoted by "fast clock") is represented by the bit of "0" (or the low voltage), it is not necessarily indicated to increase the frequency of the clock signal (denoted by "CLK"). In an embodiment, the first sub-control signal generator 920 may be configured to generate the first clock signal (denoted by "fast clock") based on the temporal occurrences of the bit of "1" (or the high voltage) among the first characterization signal (denoted by "EL"), the second characterization signal (denoted by "LL"), and the third characterization signal (denoted by "EE"). Specifically, the first clock signal (denoted by "fast clock") may be represented by the bit of "1" (or the high voltage) when the bit of "1" (or the high voltage) occurs in the third characterization signal (denoted by "EE"), followed by at least two second characterization signals (denoted by "LL"), and subsequently followed by the first characterization signal (denoted by "EL"). Otherwise, the first clock signal (denoted by "fast clock") may be represented by the bit of "0" (or the low voltage). In an embodiment, the first sub-control signal generator 920 may be also referred to as a first sub-control circuit.

The second sub-control signal generator 930 may be configured to receive the last state of the third characterization signal (denoted by "last_EE"), provided by the RS-latch circuit 910. The second sub-control signal generator 930 may be further configured to receive the clock signal (denoted by "CLK"), the first characterization signal (denoted by "EL"), the second characterization signal (denoted by "LL"), and the third characterization signal (denoted by "EE"). In addition, the second sub-control signal generator 930 may be configured to provide the second control signal (denoted by "slow clock") indicating whether to increase the frequency of the clock signal (denoted by "CLK"). For example, when the second control signal (denoted by "slow clock") is represented by a bit of "1," (or a high voltage), it is indicated to increase the frequency of the clock signal (denoted by "CLK"). On the other hand, when the second control signal (denoted by "slow clock") is represented by a bit of "0," (or a low voltage), it is indicated not to increase the frequency of the clock signal (denoted by "CLK"). It should be noted when the second control signal (denoted by "slow clock") is represented by the bit of "0," (or the low voltage), it is not necessarily indicated to decrease the frequency of the clock signal (denoted by "CLK"). In an embodiment, the second sub-control signal generator 930 may be configured to generate the second clock signal (denoted by "slow clock") based on the temporal occurrences of the bit of "1" (or the high voltage) among the first characterization signal (denoted by "EL"), the second characterization signal (denoted by "LL"), and the third characterization signal (denoted by "EE"). Specifically, the second clock signal (denoted by "slow clock") may be represented by the bit of "1" (or the high voltage) when the bit of "1" (or the high voltage) occurs in the first characterization signal (denoted by "EL"), followed by at least two second characterization signals (denoted by "LL"), and subsequently followed by the third characterization signal (denoted by "EE"). Otherwise, the second clock signal (denoted by "slow clock") may be represented by the bit of "0" (or the low voltage). In an embodiment, the second sub-control signal generator 930 may be also referred to as a second sub-control circuit. In an embodiment, the first sub-control signal generator 920 and the second sub-control signal generator 930 may be configured similarly. In an embodiment, both the first sub-control signal generator 920 and the second sub-control signal generator may be referred to a sub-control signal generator.

Referring to FIG. 10A, a schematic diagram of the RS-latch circuit 910 is depicted according to an embodiment of the disclosure. The RS-latch circuit 910 may include a first NOR gate 1010 and a second NOR gate 1020. The first NOR gate 1010 may include a first input port (i.e., the reset port, denoted by "R," of the RS-latch circuit 910) configured to receive the third characterization signal (denoted by "EE"). The first NOR gate 1010 may include a second input port coupled to an output port of the second NOR gate 1020 (i.e., the inverted output port, denoted by "Q" bar, of the RS-latch circuit), which is configured to provide the last state of the third characterization signal (denoted by "last_EE"). The first NOR gate 1010 may further include an output port (i.e., the output port, denoted by "Q" of the RS-latch circuit 910) configured to provide the last state of the first characterization signal (denoted by "last_EL"). The first NOR gate 1010 may be configured to generate the last state of the first characterization signal (denoted by "last_EL") by performing an NOR operation on the third characterization signal (denoted by "EE") and the last state of the third characterization signal (denoted by "last_EE"). Specifically, the last state of the first characterization signal (denoted by "last_EL") may be represented by a bit of "1" when both the third characterization signal (denoted by "EE") and the last state of the third characterization signal (denoted by "last_EE") are represented by the bit of "0" (or a low voltage). Otherwise, the last state of the first characterization signal (denoted by "last_EL") may be represented by the bit of "0."

The second NOR gate 1020 may include a first input port coupled to the output port of the first NOR gate 1010 (i.e., the output port, denoted by "Q," of the RS-latch circuit 910) and configured to receive the last state of the first characterization signal (denoted by "last_EL"). The second NOR gate 1020 may further include a second input port (i.e., the set port, denoted by "S," of the RS-latch circuit 910) configured to receive the first characterization signal (denoted by "EL"). As described above, the second NOR gate 1020 may include the output port (i.e., the inverted output port, denoted by "Q" bar, of the RS-latch circuit 910) configured to provide the last state of the third characterization signal (denoted by "last_EE"). The second NOR gate 1020 may be configured to generate the last state of the third characterization signal (denoted by "last_EE") by performing an NOR operation on the first characterization signal (denoted by "EL") and the last state of the first characterization signal (denoted by "last_EL"). Specifically, the last state of the third characterization signal (denoted by "last_EE") may be represented by a bit of "1" when both the first characterization signal (denoted by "EL") and the last state of the first characterization signal (denoted by "last_EL") are represented by the bit of "0" (or a low voltage). Otherwise, the last state of the third characterization signal (denoted by "last_EE") may be represented by the bit of "0."

Referring to FIG. 10B, the truth table of the RS-latch circuit 910 is shown. The truth table as shown in FIG. 10B summarizes the logic of the RS-latch circuit 910. As described above, the bit of "1" (or the high voltage) may occur, at any time, in only one of the first characterization signal (denoted by "EL"), the second characterization signal (denoted by "LL"), and the third characterization signal (denoted by "EE"). Therefore, it may not occur when both the first characterization signal (denoted by "EL") and the third characterization signal (denoted by "EE") are represented by the bit of "1" (or the high voltage) at the same time.

Figure 11:
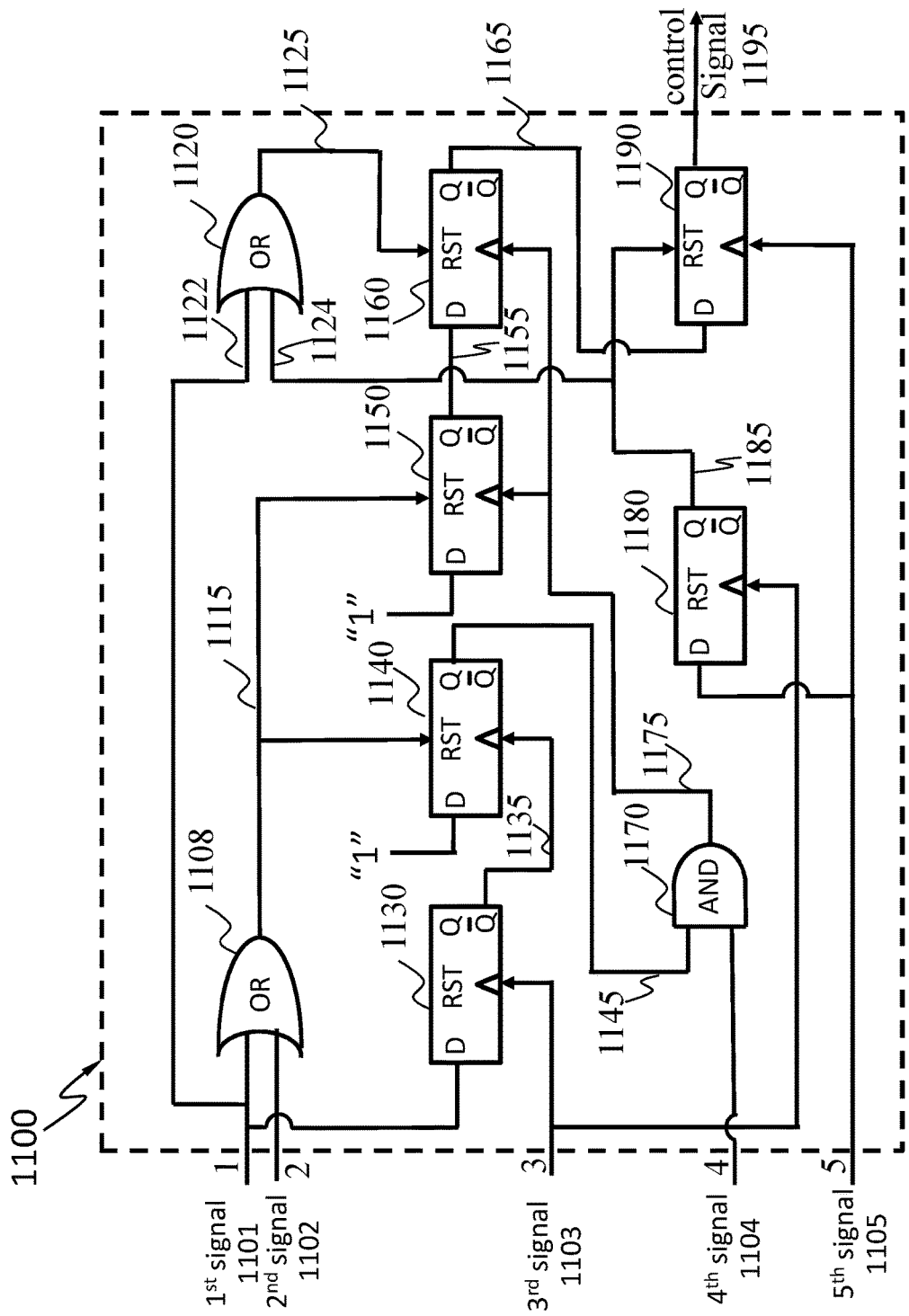
FIG. 11 is a schematic diagram of a sub-control signal generator according to an embodiment of the disclosure.

Referring to FIG. 11, a schematic diagram of a sub-control signal generator 1100 is depicted according to an embodiment of the disclosure. The sub-control signal generator 1100 may be configured to be the first sub-control signal generator 920 and/or the second sub-control signal generator 930. Sometimes, the sub-control signal generator 1100 may also be referred to as a sub-control circuit. As shown in FIG. 11, the sub-control signal generator 1100 may include a first input port (denoted by "1") configured to receive a first signal 1101, a second input port (denoted by "2") configured to receive a second signal 1102, a third input port (denoted by "3") configured to receive a third signal 1103, a fourth input port (denoted by "4") configured to receive a fourth signal 1104, and a fifth input port (denoted by "5") configured to receive a fifth signal 1105. The sub-control signal generator 1100 may further include an output port configured to provide a control signal 1195. The control signal 1195 may be the first control signal (denoted by "fast clock") when the sub-control signal generator 1100 is configured to be the first sub-control signal generator 920. Alternatively, the control signal 1195 may be the second control signal (denoted by "slow clock") when the sub-control signal generator 1100 is configured to be the second sub-control signal generator 930.

The sub-control signal generator 1100 may include a first OR gate 1108. The first OR gate 1108 may include the first input port (denoted by "1") configured to receive the first signal 1101, and the second input port (denoted by "2") configured to receive the second signal 1102. The first OR gate 1108 may further include an output port configured to provide a first OR signal 1115. The first OR gate 1108 may be configured to generate the first OR signal 1115 by performing an OR operation on the first signal 1101 and the second signal 1102. Specifically, the first OR signal 1115 may be represented by the bit of "0" when both the first signal 1101 and the second signal 1102 are represented by the bit of "0." Otherwise, the first OR signal 1115 may be represented by the bit of "1."

The sub-control signal generator 1100 may include a first D-type flip flop 1130. The first D-type flip flop 1130 may include an input port (denoted by "D") configured to receive the first signal 1101. The first D-type flip flop 1130 may include a trigger port (denoted by "Δ") configured to receive the third signal 1103. The trigger port of the first D-type flip flop 1130 may be, or may be coupled to the third input port (denoted by "3") of the sub-control signal generator 1100. The first D-type flip flop 1130 may further include an inverted output port (denoted by Q bar) configured to provide an inverted output signal 1135. The first D-type flip flop 1130 may be configured to provide a first output signal by sampling the first signal 1101 according to the third signal 1103, for example, by sampling the first signal 1101 at the transition edge (e.g., the rising edge or the falling edge) of the third signal 1103. The first D-type flip flop 1130 may be further configured to provide the inverted output signal 1135 by inverting the first output signal, for example, by changing the polarity of the first output signal.

The sub-control signal generator 1100 may further include a second D-type flip flop 1140. The second D-type flip flop 1140 may include an input port (denoted by "D") coupled to a high voltage (or a stream of bits of "1"). The second D-type flip flop 1140 may include a trigger port (denoted by "Δ") coupled to the inverted output port (denoted by Q bar) of the first D-type flip flop 1130 and configured to receive the inverted output signal 1135. The second D-type flip flop 1140 may include an output port (denoted by "Q") configured to provide a second output signal 1145. The second D-type flip flop 1140 may be configured to generate the second output signal 1145 by representing the second output signal 1145 by the bit of "1" (or the high voltage) according to the inverted output signal 1135. Specifically, the second output signal 1145 may be represented by the bit of "1" (or the high voltage) at the transition edge (e.g., the rising edge or the falling edge) of the inverted output signal 1135. The second D-type flip flop 1140 may further include a reset port (denoted by "RST") coupled to the output port of the first OR gate 1108 and configured to receive the first OR signal 1115. Accordingly, the second output signal 1145 may be reset to the bit of "0" (or the low voltage) when the first OR signal 1115 is represented by the bit of "1" (or the high voltage).

The sub-control signal generator 1100 may further include an AND gate 1170. The AND gate 1170 may include the fourth input port (denoted by "4") configured to receive the fourth signal 1104. The AND gate 1170 may further include another input port coupled to the output port (denoted by Q) of the second D-type flip flop 1140 and configured to receive the second output signal 1145. The AND gate 1170 may further include an output port configured to provide an AND signal 1175. The AND gate 1170 may be configured to generate the AND signal 1175 by performing an AND operation on the fourth signal 1104 and the second output signal 1145. Specifically, the AND signal 1175 may be represented by the bit of "1" (or the high voltage) when the fourth signal 1104 and the second output signal 1145 are both represented by the bit of "1" (or the high voltage). Otherwise, the AND signal 1175 may be represented by the bit of "0" (or the low voltage).

The sub-control signal generator 1100 may further include a third D-type flip flop 1150. The third D-type flip flop 1150 may include an input port (denoted by "D") coupled to a high voltage (or a stream of bits of "1"). The third D-type flip flop 1150 may include a trigger port (denoted by "Δ") coupled to the output port of the AND gate 1170 and configured to receive the AND signal 1175. The third D-type flip flop 1150 may include an output port (denoted by "Q") configured to provide a third output signal 1155. The third D-type flip flop 1150 may be configured to generate the third output signal 1155 by representing the third output signal 1155 by the bit of "1" (or the high voltage) according to the AND signal 1175. Specifically, the third output signal 1155 may be represented by the bit of "1" (or the high voltage) at the transition edge (e.g., the rising edge or the falling edge) of the AND signal 1175. The third D-type flip flop 1150 may further include a reset port (denoted by "RST") coupled to the output port of the first OR gate 1108 and configured to receive the first OR signal 1115. Accordingly, the third output signal 1155 may be reset to the bit of "0" (or the low voltage) when the first OR signal 1115 is represented by the bit of "1" (or the high voltage).

The sub-control signal generator 1100 may further include a fourth D-type flip flop 1180. The fourth D-type flip flop 1180 may include an input port (denoted by "D") configured to receive the fifth signal 1105. The input port (denoted by "D") of the fourth D-type flip flop 1180 may be, or may be coupled to the fifth input port (denoted by "5") of the sub-control signal generator 1100. The fourth D-type flip flop 1180 may include a trigger port (denoted by "Δ") configured to receive the third signal 1103. The trigger port (denoted by "Δ") of the fourth D-type flip flop 1180 may be, or may be coupled to, the third input port (denoted by "3") of the sub-control signal generator 1100. The fourth D-type flip flop 1140 may include an output port (denoted by "Q") configured to provide a fourth output signal 1185. The fourth D-type flip flop 1180 may be configured to generate the fourth output signal 1185 by sampling the fifth signal 1105 according to the third signal 1103. Specifically, the fourth D-type flip flop 1180 may be configured to generate the fourth output signal 1185 by sampling the fifth signal 1105 at the transition edge (e.g., the rising edge or the falling edge) of the third signal 1103.

The sub-control signal generator 1100 may include a second OR gate 1120. The second OR gate 1120 may include a first input port 1122 configured to receive the first signal 1101, and a second input port 1124 coupled to the output port (denoted by Q) of the fourth D-type flip flop 1180 and configured to receive the fourth output signal 1185. The first input port 1122 of the second OR gate 1120 may be, or may be coupled to the first input port (denoted by "1") of the sub-control signal generator 1100. The second OR gate 1120 may further include an output port configured to provide a second OR signal 1125. The second OR gate 1120 may be configured to generate the second OR signal 1125 by performing an OR operation on the first signal 1101 and the fourth output signal 1185. Specifically, the second OR signal 1125 may be represented by the bit of "0" (or the low voltage) when both the first signal 1101 and the fourth output signal 1185 are represented by the bit of "0" (or the low voltage). Otherwise, the second OR signal 1125 may be represented by the bit of "1" (or the high voltage).

The sub-control signal generator 1100 may further include a fifth D-type flip flop 1160. The fifth D-type flip flop 1160 may include an input port (denoted by "D") coupled to the output port (denoted by "Q") of the third D-type flip flop 1150 and configured to receive the third output signal 1155. The fifth D-type flip flop 1160 may include a trigger port (denoted by "Δ") coupled to the output port of the AND gate 1170 and configured to receive the AND signal 1175. The fifth D-type flip flop 1160 may include an output port (denoted by "Q") configured to provide a fifth output signal 1165. The fifth D-type flip flop 1160 may be configured to generate the fifth output signal 1165 by sampling the third output signal 1155 according to the AND signal 1175. Specifically, the fifth D-type flip flop 1160 may be configured to generate the fifth output signal 1165 by sampling the third output signal 1155 at the transition edge (e.g., the rising edge or the falling edge) of the AND signal 1175. The fifth D-type flip flop 1160 may further include a reset port (denoted by "RST") coupled to the output port of the second OR gate 1120 and configured to receive the second OR signal 1125. Accordingly, the fifth output signal 1165 may be reset to the bit of "0" (or the low voltage) when the second OR signal 1125 is represented by the bit of "1" (or the high voltage).

The sub-control signal generator 1100 may further include a sixth D-type flip flop 1190. The sixth D-type flip flop 1190 may include an input port (denoted by "D") coupled to the output port (denoted by "Q") of the fifth D-type flip flop 1160 and configured to receive the fifth output signal 1165.

The sixth D-type flip flop 1190 may include a trigger port (denoted by "Δ") configured to receive the fifth signal 1105. The trigger port (denoted by "Δ") of the sixth D-type flip flop 1190 may be, or may be coupled to the fifth input port (denoted by "5") of the sub-control signal generator 1100. The sixth D-type flip flop 1190 may include an output port (denoted by "Q") configured to provide the control signal 1195. The output port (denoted by "Q") of the sixth D-type flip flop 1190 may be, or may be coupled to the output port of the sub-control signal generator 1100. The sixth D-type flip flop 1190 may be configured to generate the control signal 1195 by sampling the fifth output signal 1165 according to the fifth signal 1105. Specifically, the sixth D-type flip flop 1190 may be configured to generate the control signal 1195 by sampling the fifth output signal 1165 at the transition edge (e.g., the rising edge or the falling edge) of the fifth signal 1105. The sixth D-type flip flop 1190 may further include a reset port (denoted by "RST") coupled to the output port (denoted by "Q") of the fourth D-type flip flop 1180 and configured to receive the fourth output signal 1185. Accordingly, the control signal 1195 may be reset to the bit of "0" (or the low voltage) when the fourth output signal 1185 is represented by the bit of "1" (or the high voltage).

Referring to FIG. 12A, the first sub-control signal generator 920 is depicted according to an embodiment of the disclosure. The first sub-control signal generator 920 may be configured to provide the first control signal (denoted by "fast clock") indicating whether to decrease the frequency of the clock signal (denoted by "CLK") upon receipt of the clock signal (denoted by "CLK"), the first characterization signal (denoted by "EL"), the second characterization signal (denoted by "LL"), the third characterization signal (denoted by "EE"), and the last state of the first characterization signal (denoted by "last_EL"). Sometimes, the first sub-control signal generator 920 may also be referred to as a first sub-control circuit. As shown, the first sub-control signal generator 920 may include a first input port (denoted by "1") configured to receive the third characterization signal (denoted by "EE"), a second input port (denoted by "2") configured to receive the first characterization signal (denoted by "EL"), a third input port (denoted by "3") configured to receive the clock signal (denoted by "CLK"), a fourth input port (denoted by "4") configured to receive the second characterization signal (denoted by "LL"), and a fifth input port (denoted by "5") configured to receive the last state of the first characterization signal (denoted by "last_EL"). The first sub-control signal generator 920 may further include an output port configured to provide the first control signal 352 (denoted by "fast clock"). In an embodiment, the first sub-control signal generator 920 may be configured similarly to the sub-control signal generator 1100. Accordingly, the third characterization signal (denoted by "EE"), the first characterization signal (denoted by "EL"), the clock signal (denoted by "CLK"), the second characterization signal (denoted by "LL"), the last state of the first characterization signal (denoted by "last_EL"), and the first control signal 352 (denoted by "fast clock"), as shown in FIG. 12A, may be, or may correspond to, the first signal 1101, the second signal 1102, the third signal 1103, the fourth signal 1104, the fifth signal 1105, and the control signal 1195, as shown in FIG. 11.

Referring to FIG. 12B, a schematic diagram of the second sub-control signal generator 930 is depicted according to an embodiment of the disclosure. The second sub-control signal generator 930 may be configured to provide the second control signal (denoted by "slow clock") indicating whether to increase the frequency of the clock signal (denoted by "CLK") upon receipt of the clock signal (denoted by "CLK"), the first characterization signal (denoted by "EL"), the second characterization signal (denoted by "LL"), the third characterization signal (denoted by "EE"), and the last state of the third characterization signal (denoted by "last_EE"). Sometimes, the second sub-control signal generator 930 may also be referred to as a second sub-control circuit. As shown, the second sub-control signal generator 930 may include a first input port (denoted by "1") configured to receive the first characterization signal (denoted by "EL"), a second input port (denoted by "2") configured to receive the third characterization signal (denoted by "EE"), a third input port (denoted by "3") configured to receive the clock signal (denoted by "CLK), a fourth input port (denoted by "4") configured to receive the second characterization signal (denoted by "LL"), and a fifth input port (denoted by "5") configured to receive the last state of the third characterization signal (denoted by "last_EE"). The second sub-control signal generator 920 may further include an output port configured to provide the second control signal 354 (denoted by "clock clock"). In an embodiment, the second sub-control signal generator 930 may be configured similarly to the sub-control signal generator 1100. Accordingly, the first characterization signal (denoted by "EL"), the third characterization signal (denoted by "EE"), the clock signal (denoted by "CLK"), the second characterization signal (denoted by "LL"), the last state of the third characterization signal (denoted by "last_EE"), and the second control signal 354 (denoted by "fast clock"), as shown in FIG. 12B, may be, or may correspond to, the first signal 1101, the second signal 1102, the third signal 1103, the fourth signal 1104, the fifth signal 1105, and the control signal 1195, as shown in FIG. 11.

Figure 13:
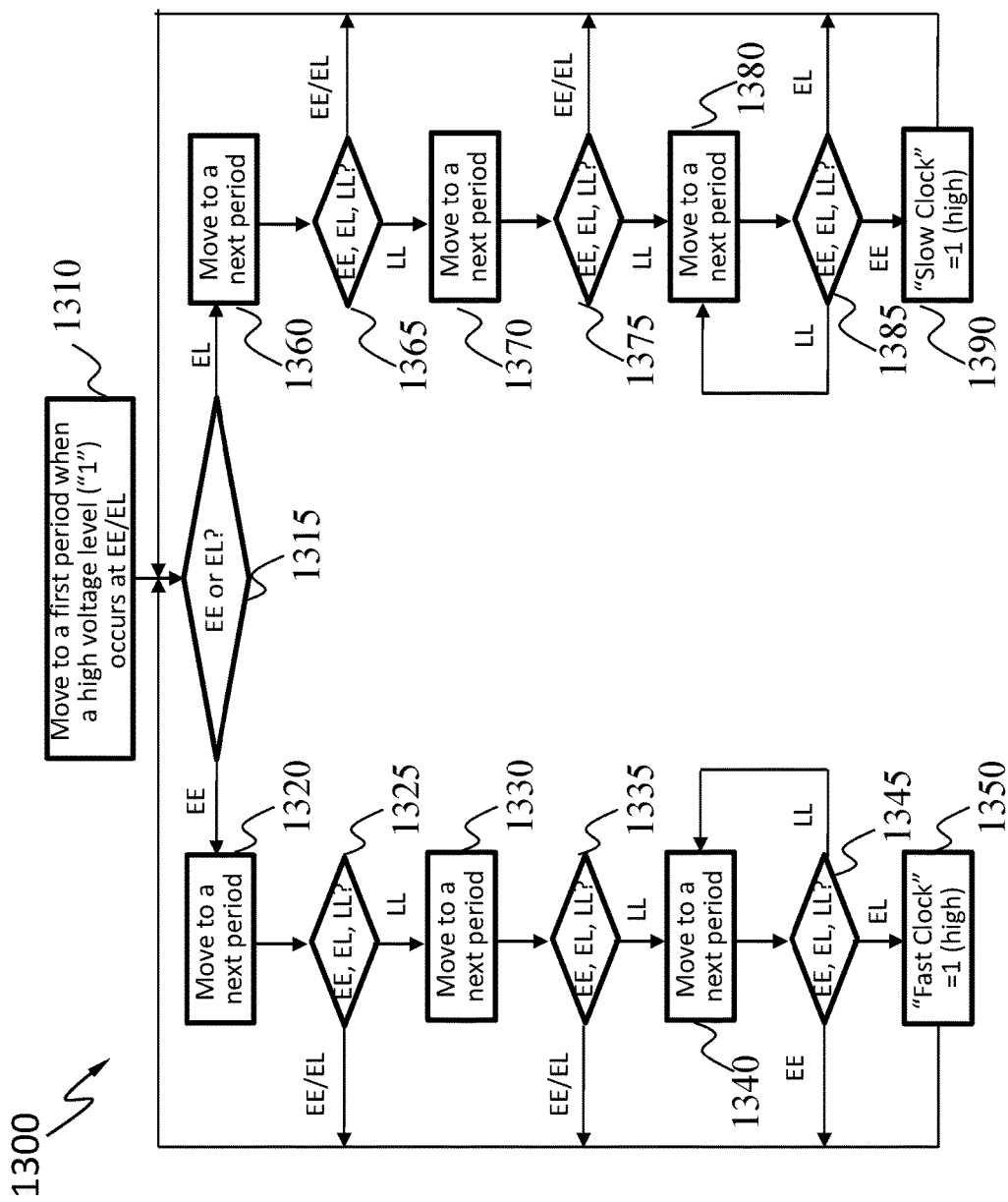
FIG. 13 is a flowchart of a method performed by a control signal generator according to an embodiment of the disclosure.

Referring to FIG. 13, a flowchart 1300 of a method for generating the first control signal 352 and the second control signal 354 is shown according to an embodiment of the disclosure. The method as illustrated in the flowchart 1300 may be performed by the control signal generator 640 in FIG. 6 or the control signal generator 900 in FIG. 9, upon receipt of the first characterization signal (denoted by "EL"), the second characterization signal (denoted by "LL"), the third characterization signal (denoted by "EE"), and the clock signal (denoted by "CLK"). The clock signal may be the clock signal 345 in FIG. 3A, the clock signal 375 in FIG. 3B, or the clock signal 605 in FIG. 6.

At step 1310, it is moved to a first period when a bit of "1" (or a high voltage) occurs in the first characterization signal (denoted by "EL") or the third characterization signal (denoted by "EE"). Specifically, this may occur when the first characterization signal (denoted by "EL") is represented by a bit of "1," as the third characterization signal (denoted by "EE") is represented by a bit of "0." As such, the last state of the first characterization signal (denoted by "last_EL"), which is provided to the first sub-control signal generator 920, is represented by the bit of "0," as the last state of the third characterization signal (denoted by "last_EE"), which is provided to the second sub-control signal generator 930, is represented by the bit of "1." Alternatively, this may also occur when the first characterization signal (denoted by "EL") is represented by a bit of "0," as the third characterization signal (denoted by "EE") is represented by a bit of "1." As such, the last state of the first characterization signal (denoted by "last_EL"), which is provided to the first sub-control signal generator 920, is represented by the bit of "1," as the last state of the third characterization signal (denoted by "last_EE"), which is provided to the second sub-control signal generator 930, is represented by the bit of "0." In an embodiment, the step 1310 may be performed at a transition edge of the clock signal (e.g., the clock signal 345 in FIG. 3A, the clock signal 375 in FIG. 3B, or the clock signal 605 in FIG. 6). The transition edge may be a rising edge or a falling edge.

At step 1315, it is determined whether the bit of "1" (or the high voltage) occurs in the first characterization signal (denoted by "EL") or the third characterization signal (denoted by "EE"). When it is determined the bit of "1" occurs in the third characterization signal (denoted by "EE"), the method proceeds to perform steps 1320-1350 for generating the first control signal (denoted by "fast clock").

Specifically, at step 1320, it is moved to the next period. This may occur at a next transition edge of the clock signal (e.g., the clock signal 345 in FIG. 3A, the clock signal 375 in FIG. 3B, or the clock signal 605 in FIG. 6).

At step 1325, it is determined whether the bit of "1" (or the high voltage) occurs in the first characterization signal (denoted by "EL"), the second characterization signal (denoted by "LL"), or the third characterization signal (denoted by "EE") at the moment. When it is determined that the bit of "1" (or the high voltage) occurs in the second characterization signal (denoted by "LL") at the moment, the method moves to step 1330. Otherwise, the method returns to step 1315.

At step 1330, it is moved to the next period. This may occur at a next transition edge of the clock signal (e.g., the clock signal 345 in FIG. 3A, the clock signal 375 in FIG. 3B, or the clock signal 605 in FIG. 6).

At step 1335, it is determined whether the bit of "1" (or the high voltage) occurs in the first characterization signal (denoted by "EL"), the second characterization signal (denoted by "LL"), or the third characterization signal (denoted by "EE") at the moment. When it is determined that the bit of "1" (or the high voltage) occurs in the second characterization signal (denoted by "LL") at the moment, the method moves to step 1340. Otherwise, the method returns to step 1315.

At step 1340, it is moved to the next period. This may occur at a next transition edge of the clock signal (e.g., the clock signal 345 in FIG. 3A, the clock signal 375 in FIG. 3B, or the clock signal 605 in FIG. 6).

At step 1345, it is determined whether the bit of "1" (or the high voltage) occurs in the first characterization signal (denoted by "EL"), the second characterization signal (denoted by "LL"), or the third characterization signal (denoted by "EE") at the moment. When it is determined that the bit of "1" (or the high voltage) occurs in the second characterization signal (denoted by "LL") at the moment, the method returns to step 1340. When it is determined that the bit of "1" (or the high voltage) occurs in the first characterization signal (denoted by "EL") at the moment, the method proceeds to step 1350. When it is determined that the bit of "1" (or the high voltage) occurs in the third characterization signal (denoted by "EE") at the moment, the method returns to step 1315.

At step 1350, the first control signal (denoted by "fast clock") is generated and represented by the bit of "1" (or the high voltage). Then the method returns to step 1315.

Referring back to the discussion above regarding step 1315, when it is determined the bit of "1" occurs in the first characterization signal (denoted by "EL"), the method proceeds to perform steps 1360-1390 for generating the second control signal (denoted by "slow clock").

Specifically, at step 1360, it is moved to the next period. This may occur at a next transition edge of the clock signal (e.g., the clock signal 345 in FIG. 3A, the clock signal 375 in FIG. 3B, or the clock signal 605 in FIG. 6).

At step 1365, it is determined whether the bit of "1" (or the high voltage) occurs in the first characterization signal (denoted by "EL"), the second characterization signal (denoted by "LL"), or the third characterization signal (denoted by "EE") at the moment. When it is determined that the bit of "1" (or the high voltage) occurs in the second characterization signal (denoted by "LL") at the moment, the method moves to step 1370. Otherwise, the method returns to step 1315.

At step 1370, it is moved to the next period. This may occur at a next transition edge of the clock signal (e.g., the clock signal 345 in FIG. 3A, the clock signal 375 in FIG. 3B, or the clock signal 605 in FIG. 6).

At step 1375, it is determined whether the bit of "1" (or the high voltage) occurs in the first characterization signal (denoted by "EL"), the second characterization signal (denoted by "LL"), or the third characterization signal (denoted by "EE") at the moment. When it is determined that the bit of "1" (or the high voltage) occurs in the second characterization signal (denoted by "LL") at the moment, the method moves to step 1380. Otherwise, the method returns to step 1315.

At step 1380, it is moved to the next period. This may occur at a next transition edge of the clock signal (e.g., the clock signal 345 in FIG. 3A, the clock signal 375 in FIG. 3B, or the clock signal 605 in FIG. 6).

At step 1385, it is determined whether the bit of "1" (or the high voltage) occurs in the first characterization signal (denoted by "EL"), the second characterization signal (denoted by "LL"), or the third characterization signal (denoted by "EE") at the moment. When it is determined that the bit of "1" (or the high voltage) occurs in the second characterization signal (denoted by "LL") at the moment, the method returns to step 1380. When it is determined that the bit of "1" (or the high voltage) occurs in the first characterization signal (denoted by "EL") at the moment, the method returns to step 1315. When it is determined that the bit of "1" (or the high voltage) occurs in the third characterization signal (denoted by "EE") at the moment, the method proceeds to step 1390.

At step 1390, the second control signal (denoted by "slow clock") is generated and represented by the bit of "1" (or the high voltage). Then the method returns to step 1315.

Figure 14:
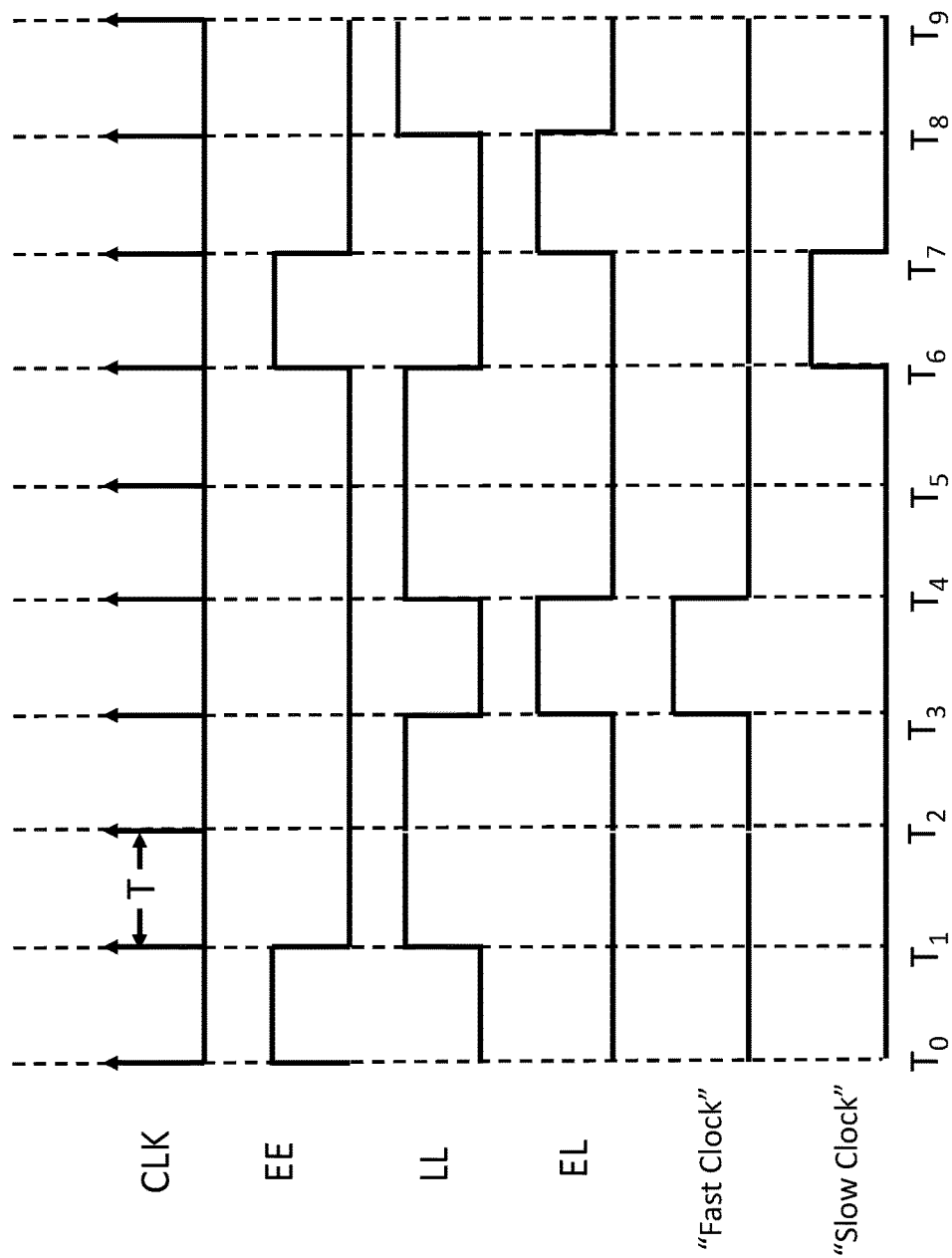
FIG. 14 shows exemplary timing diagrams illustrating operations of a control signal generator according to an embodiment of the disclosure.

Referring to FIG. 14, exemplary timing diagrams illustrating operations of the control signal generator 900 are shown according to an embodiment of the disclosure. Specifically, the exemplary timing diagrams may be used to provide an example of generating the first control signal 352 (denoted by "fast clock") and the second control signal 354 (denoted by "slow clock") by the control signal generator 640, 900 upon receipt of the clock signal (denoted by "C"LK), the first characterization signal (denoted by "EL"), the second characterization signal (denoted by "LL"), and the third characterization signal (denoted by "EE"). In FIG. 14, the x-axis represents time in some constant units, and the y-axis represents voltages in some constant units. The vertical dashed lines are aligned with the transition edges (i.e., the rising edges in this example) of the clock signal (denoted by "C"LK), which occur at times $T_0, T_1, T_2, \ldots,$ and $T_9$. The time periods between adjacent transition edges of the clock signal (denoted by "C"LK) may be constant and represented by T. In an embodiment, the time period, T, may be the inverse of the frequency of the clock signal (denoted by "CLK").

In this example, at $T_0$, $T_1$, $T_2$, and $T_3$, the bit of "1" (or the high voltage) occurs in the third characterization signal (denoted by "EE"), followed by two second characterization signal (denoted by "LL"), and subsequently followed by the first characterization signal (denoted by "EL"). Accordingly, the bit of "1" (or the high voltage) is generated for the first control signal 352 (denoted by "fast clock") at time $T_3$, which lasts for a time period before reset to the bit of "0" at time $T_4$, according to steps 1320-1350 in the flowchart 1300 as shown in FIG. 13.

Further, at $T_3$, $T_4$, $T_5$, and $T_6$, the bit of "1" (or the high voltage) occurs in the first characterization signal (denoted by "EL"), followed by two second characterization signal (denoted by "LL"), and subsequently followed by the third characterization signal (denoted by "EE"). Accordingly, the bit of "1" (or the high voltage) is generated for the second control signal 354 (denoted by "slow clock") at time $T_6$, which lasts for a time period before reset to the bit of "0" (or the low voltage) at time $T_7$, according to steps 1360-1390 in the flowchart 1300 as shown in FIG. 13.

Figure 15:
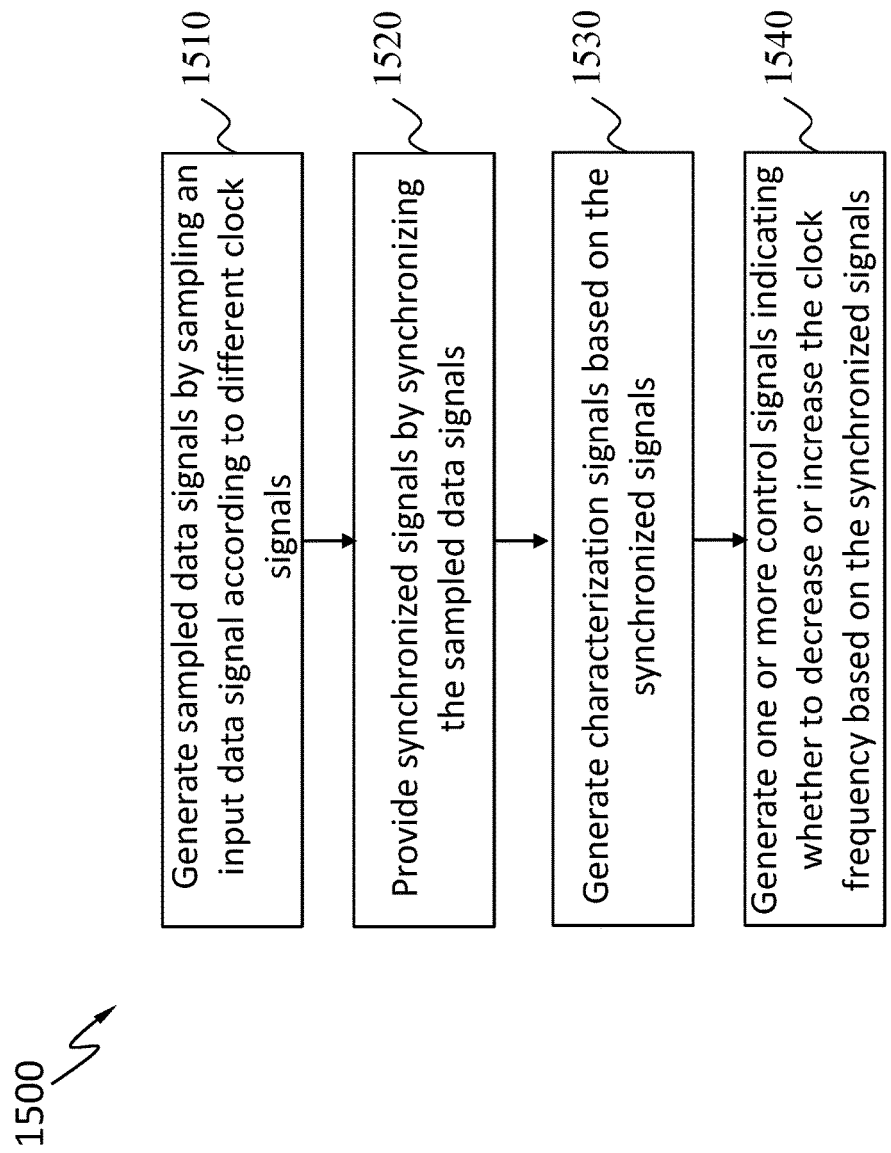
FIG. 15 is a flowchart of a method performed by a frequency detector according to an embodiment of the disclosure.

Referring to FIG. 15, a flowchart 1500 of a method performed by a frequency detector is depicted according to an embodiment of the disclosure. The frequency detector may be similar to the FD 350 in FIG. 3A and FIG. 3B. The method as illustrated in the flowchart 1500 may be performed upon receipt of an input data signal. The input data signal may be non-limiting. For example, the input data signal may be an analog data signal. The input data signal may be a digital data signal. The input data signal may be an NRZ data signal. The input data signal may be a non-NRZ data signal. The non-NRZ data signal may include, but not limited to a PAM data signal such as a PAM4 data signal, a PAM8 data signal, a PAM16 data signal, and the like.

At step 1510, sampled data signals may be generated by sampling the input data signal according to different clock signals. In an embodiment, step 1510 may be performed by the sampling unit 610 of the FD 350 as shown in FIG. 6. The different clock signals may include a first clock signal, a second clock signal, and a third clock signal. The second clock signal may have a first delay of 180 degrees with respect to the first clock signal. The third clock signal may have a second delay between zero degree and 180 degrees with respect to the second clock signal.

At step 1520, synchronized signals may be provided by synchronizing the sampled data signals. In an embodiment, step 1520 may be performed by the synchronizer 620 of the FD 350 as shown in FIG. 6. In an embodiment, the synchronized signals may include a first synchronized signal, a second synchronized signal, and a third synchronized signal. In an embodiment, the time duration between any two transition edges selected from a group consisting of a first transition edge associated with the first synchronized signal, a second transition edge associated with the second synchronized signal, and a third transition edge associated with the third synchronized signal may be equal to an integer number of a clock period, where the clock period may be defined as the inverse of the frequency of one of the different clock signals (e.g., the frequency of the first clock signal). Further, either of the first transition edge, the second transition edge, and the third transition edge may be a rising edge or a falling edge.

At step 1530, characterization signals may be provided based on the synchronized signals. In an embodiment, step 1530 may be performed by the characterization signal generator 630 of the FD 350 as shown in FIG. 6. In an embodiment, the characterization signals may be provided by performing various AND operations and XOR operations associated with the synchronized signals and the first sampled signal. In an embodiment, the characterization signals may include a first characterization signal, a second characterization signal, and a third characterization signal.

At step 1540, one or more control signals indicating whether to decrease or increase a frequency of one of the different clock signals may be generated based on the synchronized signals. In an embodiment, step 1540 may be performed by the control signal generator 640 of the FD 350 as shown in FIG. 6. The one or more control signals may include a first control signal and a second control signal. The first control signal may be the first control signal 352 in FIG. 3A and FIG. 3B, while the second control signal may be the second control signal 354 in FIG. 3A and FIG. 3B.

In an embodiment, the first control signal may be denoted by "fast clock." The first control signal may indicate whether to decrease the frequency of the one of the different clock signals. The one of the different clock signals may be the first clock signal. In an embodiment, it is indicated to decrease the frequency of the first clock signal when the first control signal is represented by the bit of "1" or has a high voltage. In an embodiment, it is indicated not to decrease the frequency of the first clock signal when the first control signal is represented by the bit of "0" or has a low voltage. It should be noted the first control signal represented by the bit of "0" or having the low voltage may not indicate to increase the frequency of the first clock signal provided directly or indirectly by the voltage controlled oscillator.

In an embodiment, the second control signal may be denoted by "slow clock." The second control signal may indicate whether to increase the frequency of the one of the different clock signals. The one of the different clock signals may be the first clock signal. In an embodiment, it is indicated to increase the frequency of the first clock signal when the second control signal is represented by the bit of "1" or has a high voltage. In an embodiment, it is indicated not to increase the frequency of the first clock signal when the second control signal is represented by the bit of "0" or has a low voltage. It should be noted the second control signal represented by the bit of "0" or having the low voltage may not indicate to decrease the frequency of the first clock signal provided directly or indirectly by the voltage controlled oscillator.

In an embodiment, the first control signal and the second control signal may be provided by, e.g., the control signal generator 640 in FIG. 6, based on temporal occurrences of the bit of "1" (or a high voltage) among the first characterization signal, the second characterization signal, and the third characterization signal. In an embodiment, the first characterization signal may be denoted by "EL," the second characterization signal may be denoted by "LL," and the third characterization signal may be denoted by "EE." For example, the first control signal may be represented by the bit of "1" (or have a high voltage) and the second control signal may be represented by the bit of "0" (or have a low voltage), when the bit of "1" (or the high voltage) occurs in "EE," followed by at least two "LL," and subsequently followed by "EL." This indicates to decrease the frequency of the first clock signal provided directly or indirectly by the voltage controlled oscillator, e.g., the voltage controlled oscillator 340 in FIG. 3A and FIG. 3B. For another example, the first control signal may be represented by the bit of "0" (or have the low voltage) and the second control signal may be represented by the bit of "1" (or have the high voltage), when the bit of "1" (or the high voltage) occurs in "EL," followed by at least two "LL," and subsequently followed by "EE." This indicates to increase the frequency of the first clock signal provided directly or indirectly by the voltage controlled oscillator, e.g., the voltage controlled oscillator 340 in FIG. 3A and FIG. 3B.

Figure 16:
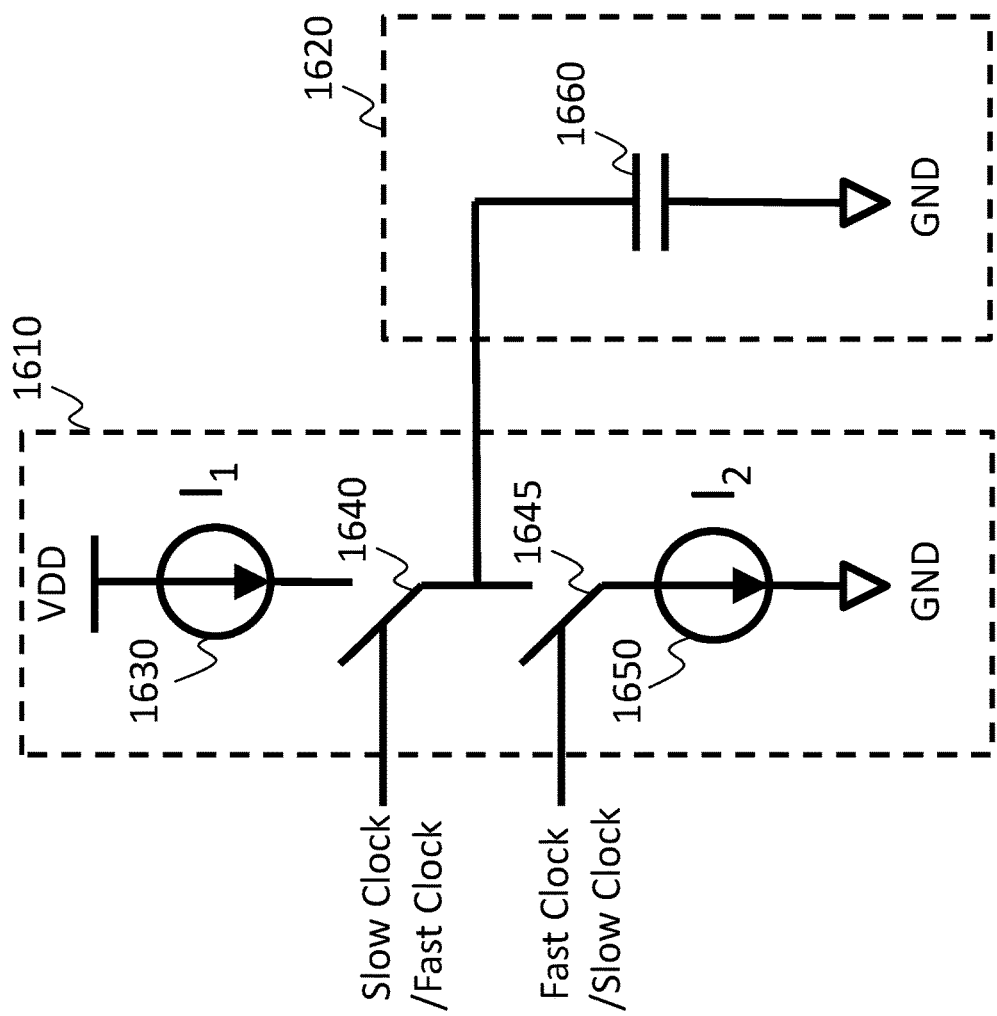
FIG. 16 is a schematic diagram of a charge pump and a loop filter according to an embodiment of the disclosure.

Referring to FIG. 16, an exemplary schematic diagram of a charge pump 1610 and a loop filter 1620 is depicted according to an embodiment of the disclosure. In an embodiment, the charge pump 1610 may be similar to the PD charge pump 320 and the FD charge pump 360 in FIG. 3A and FIG. 3B. It should be noted the charge pump 1610 and the loop filter 1620 as illustrated in FIG. 16 are merely examples. The configurations of the charge pump 1610 and the loop filter 1620 may not be limiting.

As shown in FIG. 16, the loop filter 1620 may include a capacitor 1660 coupled to the ground (denoted by "GND"). The voltage at the capacitor 1660 may be applied to a voltage controlled oscillator (e.g., the voltage controlled oscillator 340 in FIG. 3A and FIG. 3B) coupled to, or to be coupled to the loop filter 1620. The charge pump 1610 may include a first current source 1630 coupled to a power supply (denoted by "VDD"), a first switch 1640 coupled to the first current source 1630, a second switch 1645 coupled to the first switch 1640, and a second current source 1650 coupled to the second switch 1645 and the ground (denoted by "GND"). Both the first switch 1640 and the second switch 1645 of the charge pump 1610 may be coupled to the capacitor 1660 of the loop filter 1620.

The first current source 1630 may be configured to provide a first current (denoted by "$I_1$"). Both the first switch 1640 and the second switch 1645 are voltage controlled switch. Specifically, the first switch 1640 and/or the second switch 1645 may be turned on when a high voltage is applied to the first switch 1640 and/or the second switch 1645. Alternatively, the first switch 1640 and/or the second switch 1645 may be turned off when a low voltage is applied to the first switch 1640 and/or the second switch 1645. The second current source 1650 may be configured to provide a second current (denoted by "$I_2$").

In an embodiment, turning on or off the first switch 1640 may be controlled by the first control signal 352, i.e., "fast clock," while turning on or off the second switch 1645 may be controlled by the second control signal 354, i.e., "slow clock." This is configured when the frequency of the clock signal directly provided by the voltage controlled oscillator, e.g., the clock signal 345 provided by the voltage controlled oscillator 340 in FIG. 3A and FIG. 3B, is decreased as a positive voltage is applied to the voltage controlled oscillator, as the frequency of the clock signal directly provided by the voltage controlled oscillator is increased as a negative voltage is applied to the voltage controlled oscillator.

For example, when the first control signal 352, i.e., "fast clock" is represented by the bit of "1" (or has a high voltage), as the second control signal 354, i.e., "slow clock" is represented by the bit of "0" (or has a low voltage), the first switch 1640 is turned on and the second switch 1645 is turned off. Therefore, the first current $I_1$ provided by the first current source 1630 flows toward the capacitor 1660 of the loop filter 1620, thereby charging the loop filter 1620. As such, a positive voltage is provided by the loop filter 1620. The positive voltage is then applied to the voltage controlled oscillator, e.g., the voltage controlled oscillator 340 in FIG. 3A and FIG. 3B. As a result, the frequency of the clock signal, e.g., the clock signal 345 provided by the voltage controlled oscillator 340 in FIG. 3A and FIG. 3B may be decreased in response to the first control signal 352, i.e., "fast clock," represented by the bit of "1" (or having the high voltage).

For another example, when the first control signal 352, i.e., "fast clock," is represented by the bit of "0" (or has the low voltage), as the second control signal 354, i.e., "slow clock," is represented by the bit of "1" (or has the high voltage), the first switch 1640 is turned off and the second switch 1645 is turned on. Therefore, the second current $I_2$ provided by the second current source 1650 flows from the capacitor 1660 of the loop filter 1620, thereby discharging the loop filter 1620. As such, a negative voltage is provided by the loop filter 1620. The negative voltage is then applied to the voltage controlled oscillator, e.g., the voltage controlled oscillator 340 in FIG. 3A and FIG. 3B. As a result, the frequency of the clock signal, e.g., the clock signal 345 provided by the voltage controlled oscillator 340 in FIG. 3A and FIG. 3B may be increased in response to the second control signal 354, i.e., "slow clock," represented by the bit of "1" (or having the high voltage).

In an embodiment, turning on or off the first switch 1640 may be controlled by the second control signal 354, i.e., "slow clock," while turning on or off the second switch 1645 may be controlled by the first control signal 352, i.e., "fast clock." This is configured when the frequency of the clock signal directly provided by the voltage controlled oscillator, e.g., the clock signal 345 provided by the voltage controlled oscillator 340 in FIG. 3A and FIG. 3B, is increased as a positive voltage is applied to the voltage controlled oscillator, while the frequency of the clock signal directly provided by the voltage controlled oscillator is decreased as a negative voltage is applied to the voltage controlled oscillator.

For example, when the first control signal 352, i.e., "fast clock," is represented by the bit of "1" (or has a high voltage), as the second control signal 354, i.e., "slow clock," is represented by the bit of "0" (or has a low voltage), the first switch 1640 is turned off and the second switch 1645 is turned on. Therefore, the second current $I_2$ provided by the second current source 1650 flows from the capacitor 1660 of the loop filter 1620, thereby discharging the loop filter 1620. As such, a negative voltage is provided by the loop filter 1620. The negative voltage is then applied to the voltage controlled oscillator, e.g., the voltage controlled oscillator 340 in FIG. 3A and FIG. 3B. As a result, the frequency of the clock signal (e.g., the clock signal 345 provided by the voltage controlled oscillator 340 in FIG. 3A and FIG. 3B) may be decreased in response to the first control signal 352, i.e., "fast clock," represented by the bit of "1" (or having the high voltage).

For another example, when the first control signal 352, i.e., "fast clock," is represented by the bit of "0" (or has the low voltage), as the second control signal 354, i.e., "slow clock," is represented by the bit of "1" (or has the high voltage), the first switch 1640 is turned on and the second switch 1645 is turned off. Therefore, the first current $I_1$ provided by the first current source 1630 flows toward the capacitor 1660 of the loop filter 1620, thereby charging the loop filter 1620. As such, a positive voltage is provided by the loop filter 1620. The positive voltage is then applied to the voltage controlled oscillator (e.g., the voltage controlled oscillator 340 in FIG. 3A and FIG. 3B). As a result, the frequency of the clock signal (e.g., the clock signal 345 provided by the voltage controlled oscillator 340 in FIG. 3A and FIG. 3B) may be increased in response to the second control signal 354, i.e., "slow clock," represented by the bit of "1" (or having the high voltage).

Figure 17:
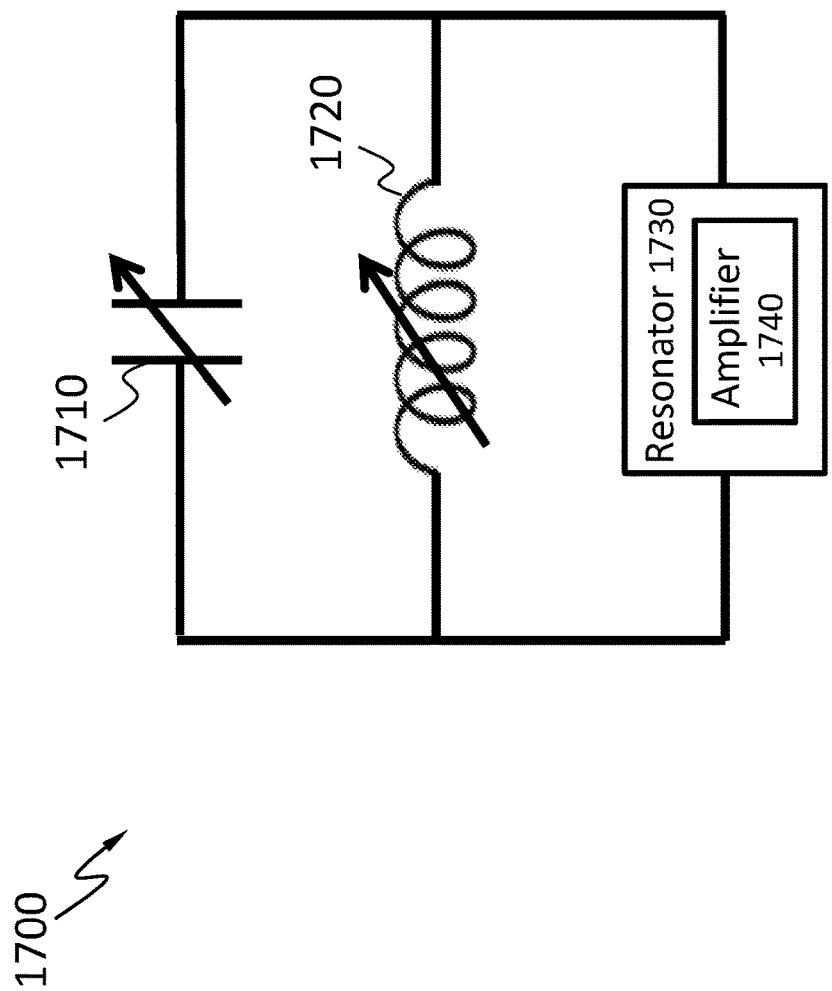
FIG. 17 is a schematic diagram of a voltage controlled oscillator (VCO) according to an embodiment of the disclosure.

Referring to FIG. 17, an exemplary schematic diagram of a voltage controlled oscillator 1700 is depicted according to an embodiment of the disclosure. In an embodiment, the voltage controlled oscillator 1700 may be similar to the voltage controlled oscillator 340 in FIG. 3A and FIG. 3B. It should be noted that the voltage controlled oscillator 1700 as illustrated in FIG. 17 is merely an example. The configuration of the voltage controlled oscillator 1700 may not be limiting.

As shown, the voltage controlled oscillator 1700 may include a capacitor 1710, an inductor 1720 coupled to the capacitor 1710, and a resonator 1730 coupled to the capacitor 1710 and the inductor 1720. The resonator 1730 may be configured to provide a clock signal, e.g., the clock signal 345 in FIG. 3A and FIG. 3B. In an embodiment, the resonator 1730 may include an amplifier 1740 configured to compensate the power loss of the clock signal inside the resonator 1730. In an embodiment, the resonator 1730 may include a pair of mirrors with the amplifier 1740 situated between the pair of mirrors.

In an embodiment, the frequency of the clock signal provided by the resonator 1730 may be determined by the capacitor 1710 and the inductor 1720. Specifically, the frequency of the clock signal, denoted by $f_{clk}$, may be expressed by:

$$f_{clk} = \frac{1}{2\pi\sqrt{LC}} \quad (1)$$

where L is the inductance of the inductor 1720, and C is the capacitance of the capacitor 1710.

In an embodiment, the voltage controlled oscillator 1700 may be coupled to a loop filter, e.g., the loop filter 1620. Accordingly, a voltage may be applied by the loop filter 1620 to the capacitor 1710 and the inductor 1720. In an embodiment, the capacitor 1710 and/or the inductor 1720 are voltage dependent. For example, the capacitor 1710 and/or the inductor 1720 may have a greater capacitance C and/or a greater inductance L, when a positive voltage is applied to the capacitor 1710 and the inductor 1720 as shown in FIG. 17. Accordingly, the capacitor 1710 and/or the inductor 1720 may have a smaller capacitance C and/or a smaller inductance L, when a negative voltage is applied to the capacitor 1710 and the inductor 1720. According to equation (1), the frequency of the clock signal provided by the resonator 1730 of the voltage controlled oscillator, i.e., $f_{clk}$, may be decreased when the positive voltage is provided by the loop filter, e.g., the loop filter 1620, to the capacitor 1710 and the inductor 1720 of the voltage controlled oscillator 1700. In addition, the frequency of the clock signal provided by the resonator 1730 of the voltage controlled oscillator 1700 may be increased when the negative voltage is provided by the loop filter, e.g., the loop filter 1620, to the capacitor 1710 and the inductor 1720 of the voltage controlled oscillator 1700.

For another example, the capacitor 1710 and/or the inductor 1720 may have a smaller capacitance C and/or a smaller inductance L, when a positive voltage is applied to the capacitor 1710 and the inductor 1720 as shown in FIG. 17. Accordingly, the capacitor 1710 and/or the inductor 1720 may have a greater capacitance C and/or a greater inductance L, when a negative voltage is applied to the capacitor 1710 and the inductor 1720. According to equation (1), the frequency of the clock signal provided by the resonator 1730 of the voltage controlled oscillator, i.e., $f_{clk}$, may be increased when the positive voltage is provided by the loop filter, e.g., the loop filter 1620, to the capacitor 1710 and the inductor 1720 of the voltage controlled oscillator 1700. In addition, the frequency of the clock signal provided by the resonator 1730 of the voltage controlled oscillator 1700 may be decreased when the negative voltage is provided by the loop filter, e.g., the loop filter 1620, to the capacitor 1710 and the inductor 1720 of the voltage controlled oscillator 1700.

Figure 18:
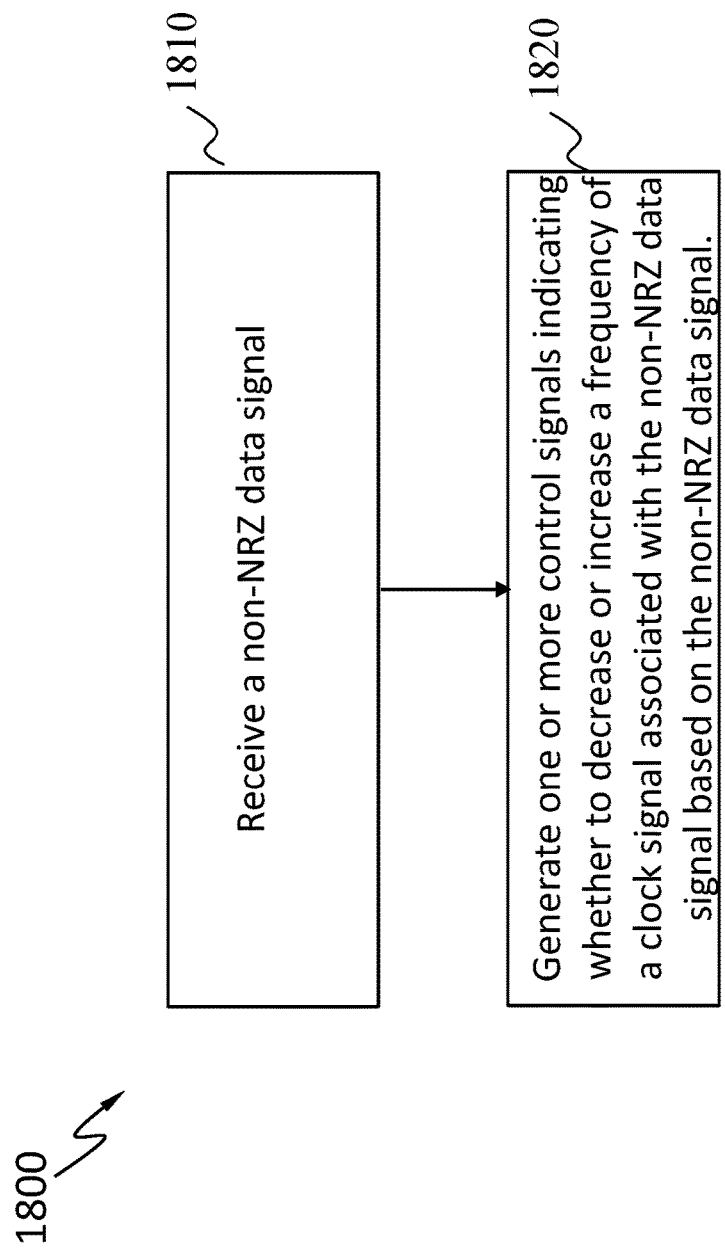
FIG. 18 is a flowchart of a method performed by a frequency detector according to an embodiment of the disclosure.

Referring to FIG. 18, a flowchart 1800 of a method performed by a frequency detector is depicted according to an embodiment of the disclosure. The frequency detector may be similar to the FD 350 in FIG. 3A, FIG. 3B, and FIG. 6.

At step 1810, a non-NRZ data signal may be received by, for example, a plurality of sampling circuits 612, 614, and 616 as shown in FIG. 6. In addition, different clock signals may be received by, for example, the plurality of sampling circuits 612, 614, and 616. The different clock signals may include a first clock signal, a second clock signal, and a third clock signal. The second clock signal may have a first delay of 180 degrees with respect to the first clock signal. The third clock signal may have a second delay between zero degree and 180 degrees with respect to the second clock signal. In an embodiment, the first clock signal may be provided directly by a voltage controlled oscillator, e.g., the voltage controlled oscillator 340 in FIG. 3A and FIG. 3B. In an embodiment, the first clock signal may be provided by a frequency divider, e.g., the frequency divider 370 in FIG. 3B, which is configured to divide a frequency of a clock signal, provided by the voltage controlled oscillator, by an integer which is equal to or greater than 2.

At step 1820, one or more control signals indicating whether to decrease or increase a frequency of a clock signal associated with the non-NRZ data signal may be generated based at least in part on the non-NRZ data signal. The clock signal may be one of the different clock signals as described at step 1810. For example, the clock signal may be the first clock signal as described at step 1810. In an embodiment, the one or more control signals may be generated by a control signal generator, e.g., the control signal generator 640 in FIG. 6. In an embodiment, the one or more control signals include a first control signal indicating whether to decrease the frequency of the one of the different clock signals. The one or more control signals may further include a second control signal indicating whether to increase the frequency of the one of the different clock signals. The one of the different clock signals may be the first clock signal. The first control signal may be the first control signal 352, while the second control signal may be the second control signal 354 in FIG. 3A and FIG. 3B.

Figure 19:
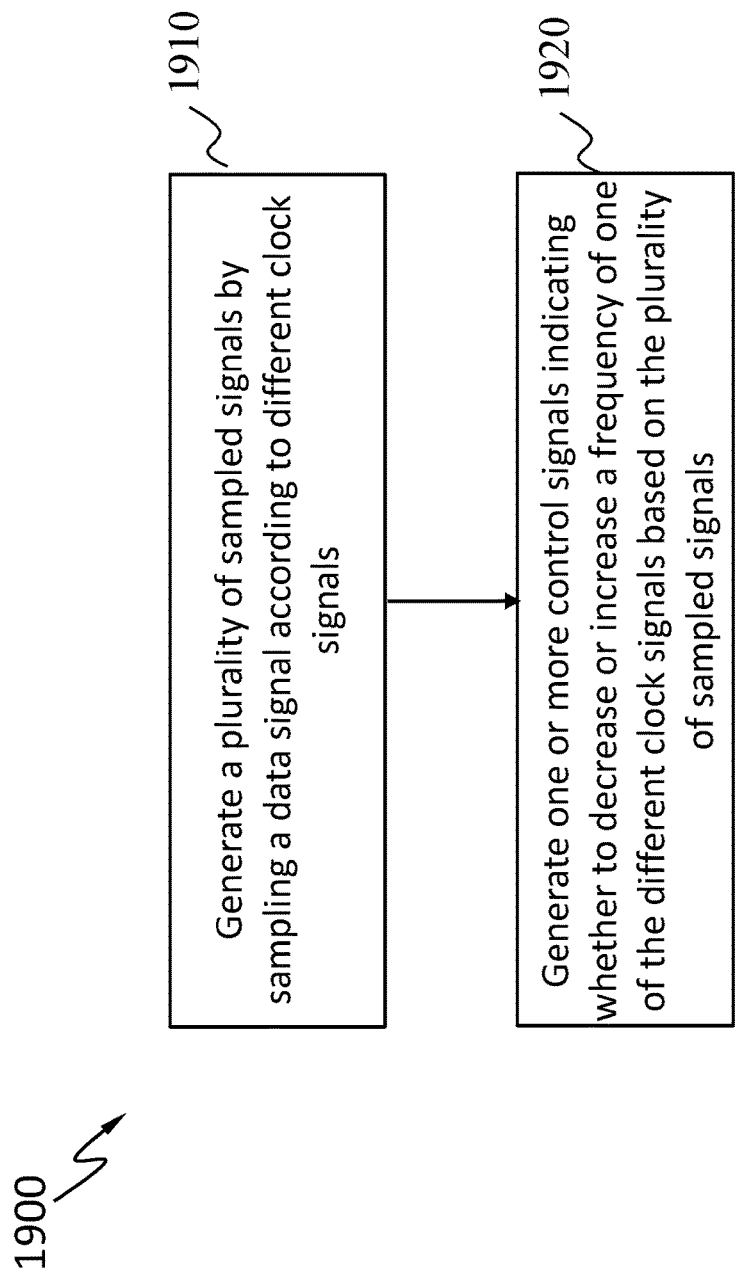
FIG. 19 is a flowchart of a method performed by a frequency detector according to an embodiment of the disclosure.

Referring to FIG. 19, a flowchart 1900 of a method performed by a frequency detector is depicted according to an embodiment of the disclosure. The frequency detector may be similar to the FD 350 in FIG. 3A, FIG. 3B, and FIG. 6.

At step 1910, a plurality of sampled signals may be generated, for example, by the sampling unit 610 in FIG. 6, by sampling a data signal according to different clock signals. The data signal may be non-limiting. For example, the data signal may be an analog data signal. The data signal may be a digital data signal. The data signal may be an NRZ data signal. The data signal may be a non-NRZ data signal. The non-NRZ data signal may include, but not limited to, a PAM data signal such as a PAM4 data signal, a PAM8 data signal, a PAM16 data signal, and the like. In an embodiment, the different clock signals may include a first clock signal, a second clock signal, and a third clock signal. The second clock signal may have a first delay of 180 degrees with respect to the first clock signal. The third clock signal may have a second delay between zero degree and 180 degrees with respect to the second clock signal. In an embodiment, the first clock signal may be provided directly by a voltage controlled oscillator, e.g., the voltage controlled oscillator 340 in FIG. 3A and FIG. 3B. In an embodiment, the first clock signal may be provided by a frequency divider, e.g., the frequency divider 370 in FIG. 3B, which is configured to divide a frequency of a clock signal, provided by the voltage controlled oscillator, by an integer which is equal to or greater than 2.

At step 1920, one or more control signals indicating whether to decrease or increase a frequency of one of the different clock signals may be generated based on the plurality of sampled signals. In an embodiment, the one or more control signals may be generated by a control signal generator, e.g., the control signal generator 640 in FIG. 6. In an embodiment, the one or more control signals include a first control signal indicating whether to decrease the frequency of the one of the different clock signals. The one or more control signals may further include a second control signal indicating whether to increase the frequency of the one of the different clock signals. The one of the different clock signals may be the first clock signal. The first control signal may be the first control signal 352, while the second control signal may be the second control signal 354 in FIG. 3A and FIG. 3B.

Figure 20:
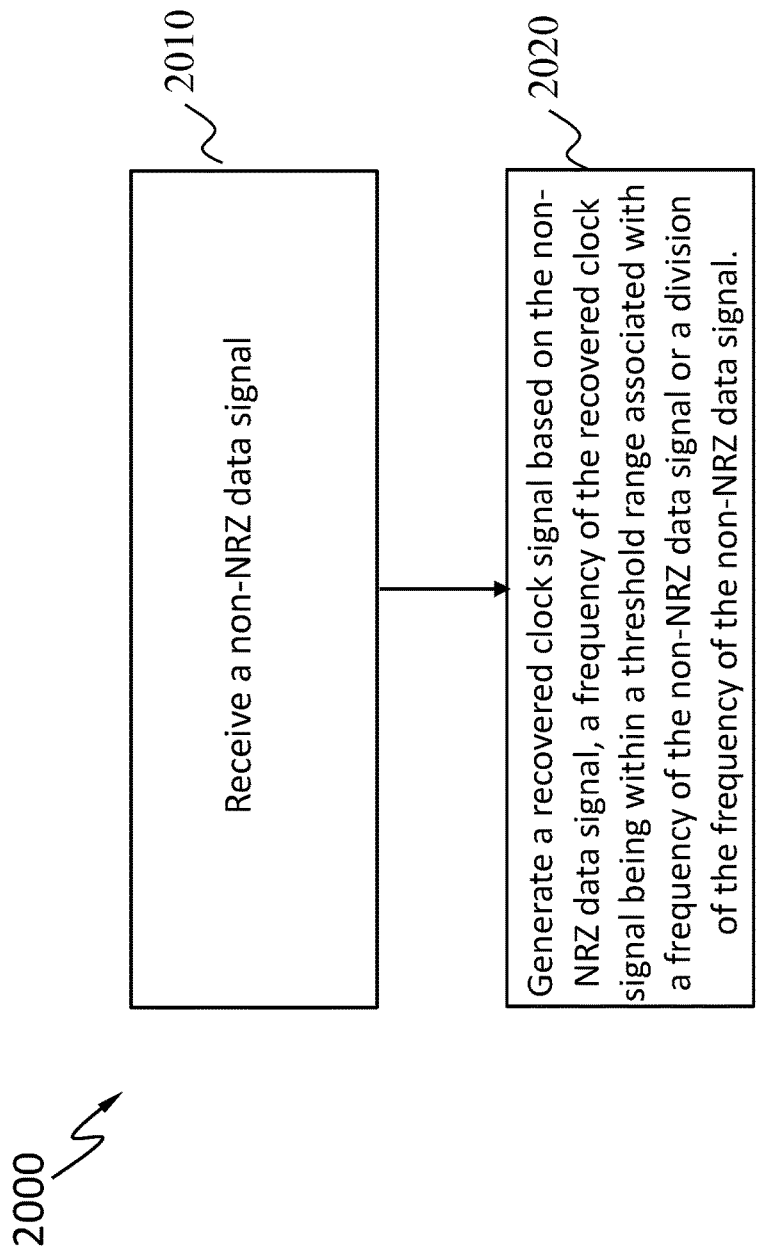
FIG. 20 is a flowchart of a method performed by an FLL circuit according to an embodiment of the disclosure.

Referring to FIG. 20, a flowchart 2000 of a method for clock and data recovery is depicted according to an embodiment of the disclosure. In an embodiment, the method as illustrated in the flowchart 2000 may be performed by an FLL circuit, e.g., the FLL circuit 301 in FIG. 3A or the FLL circuit 304 in FIG. 3B.

At step 2010, a non-NRZ data signal may be received by, for example, a plurality of sampling circuits 612, 614, and 616 as shown in FIG. 6. In addition, different clock signals may be received by, for example, the plurality of sampling circuits 612, 614, and 616 as shown in FIG. 6. The different clock signals may include a first clock signal, a second clock signal, and a third clock signal. The second clock signal may have a first delay of 180 degrees with respect to the first clock signal. The third clock signal may have a second delay between zero degree and 180 degrees with respect to the second clock signal. In an embodiment, the first clock signal may be provided directly by a voltage controlled oscillator, e.g., the voltage controlled oscillator 340 in FIG. 3A and FIG. 3B. In an embodiment, the first clock signal may be provided by a frequency divider, e.g., the frequency divider 370 in FIG. 3B, which is configured to divide a frequency of a clock signal, provided by the voltage controlled oscillator, by an integer which is equal to or greater than 2.

At step 2020, a recovered clock signal may be generated based at least in part on the non-NRZ data signal. In an embodiment, a frequency of the recovered clock signal may be within a threshold range associated with the non-NRZ data signal. For example, the recovered clock signal may be provided directly from voltage controlled oscillator (e.g., the voltage controlled oscillator 340 in FIG. 3A). As such, the frequency of the recovered clock signal may be within the threshold range of a frequency of the non-NRZ data signal. For another example, the recovered clock signal may be outputted by a frequency divider (e.g., the frequency divider 370 as shown in FIG. 3B), which is configured to divide the clock signal, provided by the voltage controlled oscillator, by an integer which is equal to or greater than 2. As such, the frequency of the recovered clock signal may be within the threshold range of a division of the frequency of the non-NRZ data signal.

Figure 21:
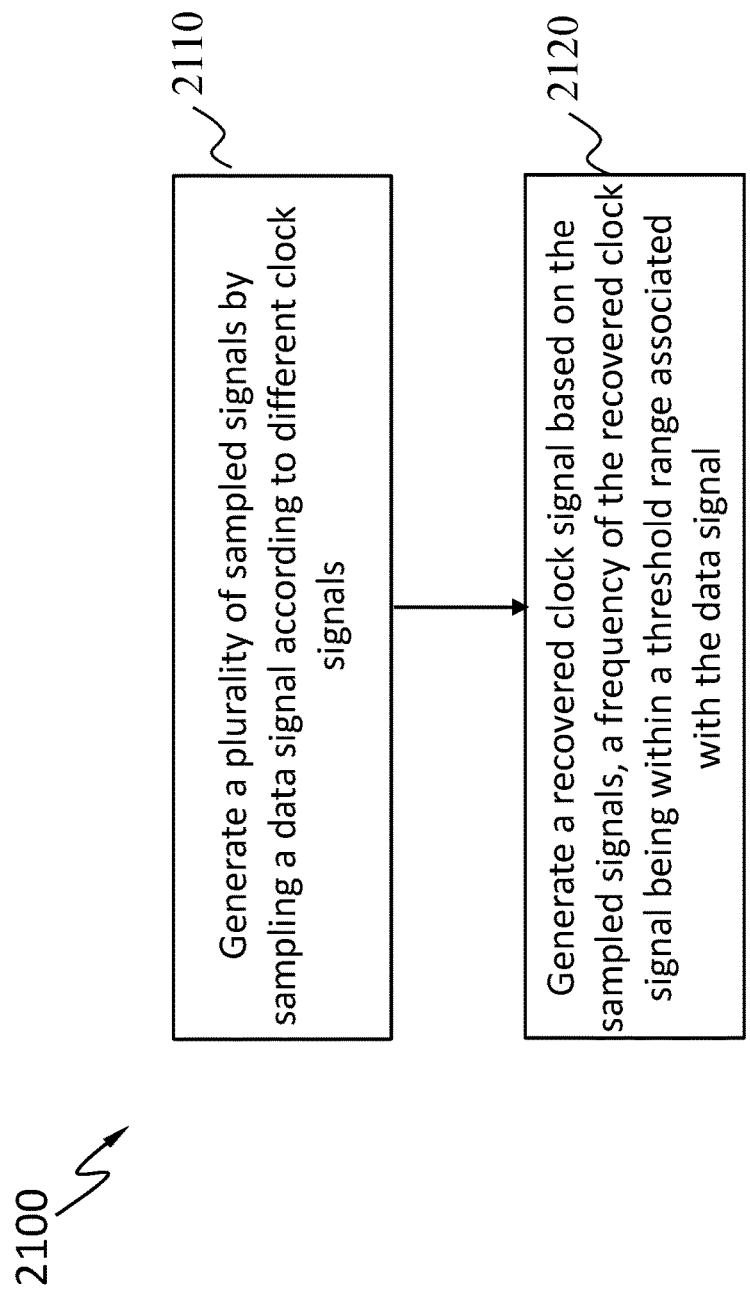
FIG. 21 is a flowchart of a method performed by an FLL circuit according to an embodiment of the disclosure.

Referring to FIG. 21, a flowchart 2100 of a method for clock and data recovery is depicted according to an embodiment of the disclosure. In an embodiment, the method as illustrated in the flowchart 2100 may be performed by an FLL circuit, e.g., the FLL circuit 301 in FIG. 3A or the FLL circuit 304 in FIG. 3B upon receipt of a data signal.

At step 2110, a plurality of sampled signals may be generated, for example, by the sampling unit 610 in FIG. 6, by sampling a data signal according to different clock signals. The data signal may be non-limiting. For example, the data signal may be an analog data signal. The data signal may be a digital data signal. The data signal may be an NRZ data signal. The data signal may be a non-NRZ data signal. The non-NRZ data signal may include, but not limited to, a PAM data signal such as a PAM4 data signal, a PAM8 data signal, a PAM16 data signal, and the like. In an embodiment, the different clock signals may include a first clock signal, a second clock signal, and a third clock signal. The second clock signal may have a first delay of 180 degrees with respect to the first clock signal. The third clock signal may have a second delay between zero degree and 180 degrees with respect to the second clock signal. In an embodiment, the first clock signal may be provided directly by a voltage controlled oscillator, e.g., the voltage controlled oscillator 340 in FIG. 3A and FIG. 3B. In an embodiment, the first clock signal may be provided by a frequency divider, e.g., the frequency divider 370 in FIG. 3B, which is configured to divide a frequency of a clock signal, provided by the voltage controlled oscillator, by an integer which is equal to or greater than 2.

At step 2120, a recovered clock signal may be generated based on the sampled signals. In an embodiment, a frequency of the recovered clock signal may be within a threshold range associated with the data signal. For example, the recovered clock signal may be provided directly from voltage controlled oscillator, e.g., the voltage controlled oscillator 340 in FIG. 3A. As such, the frequency of the recovered clock signal may be within the threshold range of a frequency of the data signal. For another example, the recovered clock signal may be outputted by a frequency divider (e.g., the frequency divider 370 as shown in FIG. 3B), which is configured to divide the clock signal, provided by the voltage controlled oscillator, by an integer which is equal to or greater than 2. As such, the frequency of the recovered clock signal may be within the threshold range of a division of the frequency of the data signal.

In an embodiment, there is provided an apparatus comprising: a plurality of sampling circuits configured to receive a non-Non Return to Zero (non-NRZ) data signal; and a control circuit coupled to the plurality of sampling circuits, wherein the control circuit is configured to provide one or more control signals indicating whether to decrease or increase a frequency of a clock signal associated with the non-NRZ data signal based on the non-NRZ data signal.

In an embodiment, the plurality of sampling circuits is further configured to receive different clock signals, the different clock signals comprising a first clock signal, a second clock signal, and a third clock signal, and wherein the frequency of the clock signal is a frequency of one of the different clock signals.

In an embodiment, the second clock signal has a first delay of 180 degrees with respect to the first clock signal.

In an embodiment, the third clock signal has a second delay with respect to the second clock signal, and wherein the second delay is between zero degree and 180 degrees.

In an embodiment, the apparatus further comprises a first delay buffer coupled to at least one of the plurality of sampling circuits, and wherein the first delay buffer is configured to provide the second clock signal by delaying the first clock signal by 180 degrees.

In an embodiment, the apparatus further comprises a second delay buffer coupled to the first delay buffer, wherein the second delay buffer is configured to provide the third clock signal by delaying the second clock signal by an amount between zero degree and 180 degrees.

In an embodiment, the plurality of sampling circuits are further configured to provide a plurality of sampled data signals by sampling the non-NRZ data signal according to the different clock signals.

In an embodiment, the plurality of sampling circuits comprises a first sampling circuit, a second sampling circuit, and a third sampling circuit, wherein the first sampling circuit, the second sampling circuit, and the third sampling circuit are comparators when the non-NRZ data signal is an analog signal, wherein the first sampling circuit, the second sampling circuit, and the third sampling circuit are digital sampling circuits when the non-NRZ data signal is a digital signal, each of the digital sampling circuits comprising at least one D-type flip flop, wherein the first sampling circuit is configured to provide a first sampled data signal by sampling the non-NRZ data signal according to the first clock signal, and wherein the first sampling circuit comprises a first data input port configured to receive the non-NRZ data signal, a first trigger input port configured to receive the first clock signal, and a first data output port configured to output the first sampled data signal.

In an embodiment, the second sampling circuit is configured to provide a second sampled data signal by sampling the non-NRZ data signal according to the second clock signal, and wherein the second sampling circuit comprises a second data input port coupled to the first data input port, a second trigger input port coupled to an output port of the first delay buffer, and a second data output port configured to output the second sampled data signal.

In an embodiment, the third sampling circuit is configured to provide a third sampled data signal by sampling the non-NRZ data signal according to the third clock signal, and wherein the third sampling circuit comprises a third data input port coupled to the first data input port, a third trigger input port coupled to an output port of the second delay buffer, and a third data output port configured to output the third sampled data signal.

In an embodiment, the apparatus further comprises a synchronization circuit coupled to the plurality of sampling circuits, wherein the synchronization circuit is configured to provide a first synchronized signal, a second synchronized signal, and a third synchronized signal based on the first sampled data signal, the second sampled data signal, the third sampled data signal, and the first clock signal, wherein a time duration between any two transition edges selected from a group consisting of a first transition edge associated with the first synchronized signal, a second transition edge associated with the second synchronized signal, and a third transition edge associated with the third synchronized signal is equal to an integer number of a clock period, and wherein the clock period is inverse of a frequency of one of the different clock signals (e.g., the frequency of the first clock signal). Either of the first transition edge, the second transition edge, and the third transition edge may be a rising edge or a falling edge.

In an embodiment, the synchronization circuit comprises a first digital sampling circuit, a second digital sampling circuit, and a third digital sampling circuit, each of the first digital sampling circuit, the second digital sampling circuit, and the third sampling circuit comprising at least one D-type flip flop, wherein a data input port of the first digital sampling circuit is coupled to the first data output port, and a trigger input port of the first digital sampling circuit is coupled to the first trigger input port.

In an embodiment, a data input port of the second digital sampling circuit is coupled to the second data output port, and a trigger input port of the second digital sampling circuit is coupled to the first trigger input port.

In an embodiment, a data input port of the third digital sampling circuit is coupled to the third data output port, and a trigger input port of the third digital sampling circuit is coupled to the first trigger input port.

In an embodiment, the apparatus further comprises a characterization signal generation circuit coupled to the synchronization circuit, wherein the characterization signal generation circuit is configured to generate a first characterization signal, a second characterization signal, and a third characterization signal based on the first sampled data signal, the first synchronized signal, the second synchronized signal, and the third synchronized signal.

In an embodiment, the characterization signal generation circuit comprises a first XOR operator configured to provide a first XOR signal by performing an XOR operation on the first sampled data signal and the second synchronized signal, wherein the characterization signal generation circuit further comprises a second XOR operator configured to provide a second XOR signal by performing the XOR operation on the first synchronized signal and the second synchronized signal, wherein the characterization signal generation circuit further comprises a third XOR operator configured to provide a third XOR signal by performing the XOR operation on the first synchronized signal and the third synchronized signal, wherein the characterization signal generation circuit further comprises a fourth XOR operator configured to provide a fourth XOR signal by performing the XOR operation on the first sampled data signal and the third synchronized signal, and wherein each of the first XOR operator, the second XOR operator, the third XOR operator, and the fourth XOR operator comprises at least one XOR gate.

In an embodiment, the characterization signal generation circuit further comprises a first AND gate configured to provide a first characterization signal by performing an AND operation on the first XOR signal and the third XOR signal, wherein a first input port of the first AND gate is coupled to an output port of the first XOR operator, and wherein a second input port of the first AND gate is coupled to an output port of the third XOR operator.

In an embodiment, the characterization signal generation circuit further comprises a second AND gate configured to provide a second characterization signal by performing the AND operation on the second XOR signal and the third XOR signal, wherein a first input port of the second AND gate is coupled to an output port of the second XOR operator, and wherein a second input port of the second AND gate is coupled to the output port of the third XOR operator.

In an embodiment, the characterization signal generation circuit further comprises a third AND gate configured to provide a third characterization signal by performing the AND operation on the first XOR signal and the fourth XOR signal, wherein a first input port of the third AND gate is coupled to the output port of the first XOR operator, and wherein a second input port of the third AND gate is coupled to the output port of the fourth XOR operator.

In an embodiment, the one or more control signals comprise: a first control signal indicating whether to decrease the frequency of the one of the different clock signals; and a second control signal indicating whether to increase the frequency of the one of the different clock signals.

In an embodiment, the control circuit is configured to generate the first control signal and the second control signal based on temporal occurrences of a first binary logic level among the first characterization signal, the second characterization signal, and the third characterization signal.

In an embodiment, the control circuit is configured to generate the first control signal having the first binary logic level and generate the second control signal having a second binary logic level indicating to decrease the frequency of the one of the different clock signals when the first binary logic level occurs in the third characterization signal, followed by at least two consecutive second characterization signals, and followed by the first characterization signal, and wherein the first binary logic level is different from the second binary logic level.

In an embodiment, the control circuit is configured to generate the first control signal having a second binary logic level and generate the second control signal having the first binary logic level indicating to increase the frequency of the one of the different clock signals when the first binary logic level occurs in the first characterization signal, followed by at least two consecutive second characterization signals, and followed by the third characterization signal, and wherein the first binary logic level is different from the second binary logic level.

In an embodiment, the control circuit comprises an R-S latch circuit coupled to a first sub-control circuit and a second sub-control circuit, wherein the first sub-control circuit configured to generate the first control signal, and wherein the second sub-control circuit configured to generate the second control signal.

In an embodiment, a first input port of the R-S latch circuit is coupled to the output port of the third AND gate, a second input port of the R-S latch circuit is coupled to the output port of the first AND gate, wherein an output port of the R-S latch circuit is coupled to the first sub-control circuit, and wherein an inverted output port of the R-S latch circuit is coupled to the second sub-control circuit.

In an embodiment, the first sub-control circuit comprises an OR gate, a fourth D-type flip flop, an AND gate, and a fifth D-type flip flop, wherein a first input port of the OR gate is coupled to the output port of the third AND gate, wherein a second input port of the OR gate is coupled to the output port of the first AND gate, wherein a data input port of the fourth D-type flip flop is coupled to the first input port of the OR gate, wherein a trigger input port of the fourth D-type flip flop is coupled to the first trigger input port of the first sampling circuit, wherein an input port of the AND gate is coupled to the output port of the second AND gate, a trigger input port of the fifth D-type flip flop is coupled to the output port of the R-S latch circuit, and wherein an output port of the fifth D-type flip flop is configured to output the first control signal.

In an embodiment, the second sub-control circuit comprises an OR gate, a fourth D-type flip flop, an AND gate, and a fifth D-type flip flop, wherein a first input port of the OR gate is coupled to the output port of the first AND gate, wherein a second input port of the OR gate is coupled to the output port of the third AND gate, wherein a data input port of the fourth D-type flip flop is coupled to the first input port of the OR gate, wherein a trigger input port of the fourth D-type flip flop is coupled to the first trigger input port of the first sampling circuit, wherein an input port of the AND gate is coupled to the output port of the second AND gate, wherein a trigger input port of the fifth D-type flip flop is coupled to the inverted output port of the R-S latch circuit, and wherein an output port of the fifth D-type flip flop is configured to output the second control signal.

In an embodiment, there is provided an apparatus comprising: a plurality of sampling circuits configured to generate a plurality of sampled signals by sampling a data signal according to different clock signals; and a control circuit coupled to the plurality of sampling circuits, wherein the control circuit is configured to provide one or more control signals indicating whether to decrease or increase a frequency of one of the different clock signals based on the plurality of sampled signals.

In an embodiment, the data signal is a non-Non Return to Zero (non-NRZ) data signal.

In an embodiment, the different clock signals comprise a first clock signal, a second clock signal, and a third clock signal.

In an embodiment, the second clock signal has a first delay of 180 degrees with respect to the first clock signal.

In an embodiment, the third clock signal has a second delay with respect to the second clock signal, the second delay being between zero degree and 180 degrees.

In an embodiment, the apparatus further comprises a first delay buffer coupled to at least one of the plurality of sampling circuits, and wherein the first delay buffer is configured to provide the second clock signal by delaying the first clock signal by 180 degrees.

In an embodiment, the apparatus further comprises a second delay buffer coupled to the first delay buffer, and wherein the second delay buffer is configured to provide the third clock signal by delaying the second clock signal by an amount between zero degree and 180 degrees.

In an embodiment, the plurality of sampling circuits comprise a first sampling circuit, a second sampling circuit, and a third sampling circuit, wherein the first sampling circuit is configured to provide a first sampled data signal by sampling the data signal according to the first clock signal, and wherein the first sampling circuit comprises a first data input port configured to receive the data signal, a first trigger input port configured to receive the first clock signal, and a first data output port configured to output the first sampled data signal.

In an embodiment, the second sampling circuit is configured to provide a second sampled data signal by sampling the data signal according to the second clock signal, and wherein the second sampling circuit comprises a second data input port coupled to the first data input port, a second trigger input port coupled to an output port of the first delay buffer, and a second data output port configured to output the second sampled data signal.

In an embodiment, the third sampling circuit is configured to provide a third sampled data signal by sampling the data signal according to the third clock signal, and wherein the third sampling circuit comprises a third data input port coupled to the first data input port, a third trigger input port coupled to an output port of the second delay buffer, and a third data output port configured to output the third sampled data signal.

In an embodiment, the apparatus further comprises a synchronization circuit coupled to the plurality of sampling circuits, wherein the synchronization circuit is configured to provide a first synchronized signal, a second synchronized signal, and a third synchronized signal based on the first sampled data signal, the second sampled data signal, the third sampled data signal, and the first clock signal, wherein a time duration between any two transition edges selected from a group consisting of a first transition edge associated with the first synchronized signal, a second transition edge associated with the second synchronized signal, and a third transition edge associated with the third synchronized signal is equal to an integer number of a clock period, and wherein the clock period is inverse of the frequency of one of the different clock signals (e.g., the frequency of the first clock signal). Either of the first transition edge, the second transition edge, and the third transition edge may be a rising edge or a falling edge.

In an embodiment, the apparatus further comprises a characterization signal generation circuit coupled to the synchronization circuit, wherein the characterization signal generation circuit is configured to generate a first characterization signal, a second characterization signal, and a third characterization signal based on the first sampled data signal, the first synchronized signal, the second synchronized signal, and the third synchronized signal.

In an embodiment, the one or more control signals comprise: a first control signal indicating whether to decrease the frequency of the one of the different clock signals; and a second control signal indicating whether to increase the frequency of the one of the different clock signals.

In an embodiment, the control circuit is configured to generate the first control signal and the second control signal based on temporal occurrences of a first binary logic level among the first characterization signal, the second characterization signal, and the third characterization signal.

In an embodiment, the control circuit is configured to generate the first control signal having the first binary logic level and generate the second control signal having a second binary logic level indicating to decrease the frequency of one of the different clock signals when the first binary logic level occurs in the third characterization signal, followed by at least two consecutive second characterization signals, and followed by the first characterization signal, and wherein the first binary logic level is different from the second binary logic level.

In an embodiment, the control circuit is configured to generate the first control signal having a second binary logic level and generate the second control signal having the first binary logic level indicating to increase the frequency of the one of the different clock signals when the first binary logic level occurs in the first characterization signal, followed by at least two consecutive second characterization signals, and followed by the third characterization signal, and wherein the first binary logic level is different from the second binary logic level.

In an embodiment, there is provided a method comprising: generating a plurality of sampled signals by sampling a data signal according to different clock signals; and providing one or more control signals indicating whether to decrease or increase a frequency of one of the different clock signals based on the plurality of sampled signals.

In an embodiment, the data signal is a non-Non Return to Zero (non-NRZ) data signal.

In an embodiment, the different clock signals comprise a first clock signal, a second clock signal, and a third clock signal.

In an embodiment, the method further comprises providing the second clock signal by delaying the first clock signal by 180 degrees.

In an embodiment, the method further comprises providing the third clock signal by delaying the second clock signal by an amount between zero degree and 180 degrees.

In an embodiment, the generating the plurality of sampled signals by sampling the data signal according to the different clock signals comprises: generating a first sampled data signal by sampling the data signal according to the first clock signal; generating a second sampled data signal by sampling the data signal according to the second clock signal; and generating a third sampled data signal by sampling the data signal according to the third clock signal.

In an embodiment, the method further comprises providing a first synchronized signal, a second synchronized signal, and a third synchronized signal based on the first sampled data signal, the second sampled data signal, the third sampled data signal, and the first clock signal, wherein a time duration between any two transition edges selected from a group consisting of a first transition edge associated with the first synchronized signal, a second transition edge associated with the second synchronized signal, and a third transition edge associated with the third synchronized signal is equal to an integer number of a clock period, and wherein the clock period is inverse of the frequency of one of the different clock signals (e.g., the frequency of the first clock signal). Either of the first transition edge, the second transition edge, and the third transition edge may be a rising edge or a falling edge.

In an embodiment, the method further comprises generating a first characterization signal, a second characterization signal, and a third characterization signal based on the first sampled data signal, the first synchronized signal, the second synchronized signal, and the third synchronized signal, wherein the generating the first characterization signal, the second characterization signal, and the third characterization signal comprises: generating a first XOR signal by performing an XOR operation on the first sampled data signal and the first synchronized signal; generating a second XOR signal by performing the XOR operation on the first synchronized signal and the second synchronized signal; generating a third XOR signal by performing the XOR operation on the first synchronized signal and the third synchronized signal; generating a fourth XOR signal by performing the XOR operating on the first sampled data signal and the third synchronized signal; generating the first characterization signal by performing an AND operation on the first XOR signal and the third XOR signal; generating the second characterization signal by performing the AND operation on the second XOR signal and the third XOR signal; and generating the third characterization signal by performing the AND operation on the first XOR signal and the fourth XOR signal.

In an embodiment, the one or more control signals comprise: a first control signal indicating whether to decrease the frequency of the one of the different clock signals; and a second control signal indicating whether to increase the frequency of the one of the different clock signals.

In an embodiment, the providing the first control signal and the providing the second control signal comprise providing the first control signal and the second control signal based on temporal occurrences of a first binary logic level among the first characterization signal, the second characterization signal, and the third characterization signal.

In an embodiment, the method further comprises: generating the first control signal having the first binary logic level; and generating the second control signal having a second binary logic level indicating to decrease the frequency of one of the different clock signals when the first binary logic level occurs in the third characterization signal, followed by at least two consecutive second characterization signals, and followed by the first characterization signal, and wherein the first binary logic level is different from the second binary logic level.

In an embodiment, the method further comprises: generating the first control signal having a second binary logic level; and generating the second control signal having the first binary logic level indicating to increase the frequency of the one of the different clock signals when the first binary logic level occurs in the first characterization signal, followed by at least two consecutive second characterization signals, and followed by the third characterization signal, and wherein the first binary logic level is different from the second binary logic level.

In an embodiment, there is provided a machine-readable tangible and non-transitory medium having information, wherein the information, when read by a hardware processor system, causes the hardware processor system to perform following: generating a plurality of sampled signals by sampling a data signal according to different clock signals; and providing one or more control signals indicating whether to decrease or increase a frequency of one of the different clock signals based on the plurality of sampled signals.

In an embodiment, the data signal is a non-Non Return to Zero (non-NRZ) data signal.

In an embodiment, the different clock signals comprise a first clock signal, a second clock signal, and a third clock signal.

In an embodiment, the information, when read by the hardware processor system, further causes the hardware processor system to provide the second clock signal by delaying the first clock signal by 180 degrees.

In an embodiment, the information, when read by the hardware processor system, further causes the hardware processor system to provide the third clock signal by delaying the second clock signal by an amount between zero degree and 180 degrees.

In an embodiment, the generating the plurality of sampled signals by sampling the data signal according to the different clock signals comprises: generating a first sampled data signal by sampling the data signal according to the first clock signal; generating a second sampled data signal by sampling the data signal according to the second clock signal; and generating a third sampled data signal by sampling the data signal according to the third clock signal.

In an embodiment, the one or more control signals comprise: a first control signal indicating whether to decrease the frequency of the one of the different clock signals; and a second control signal indicating whether to increase the frequency of the one of the different clock signals.

In an embodiment, there is provided an apparatus comprising: a plurality of sampling circuits configured to receive a non-Non Return to Zero (non-NRZ) data signal; and a signal generator coupled to the plurality of sampling circuits, wherein the signal generator is configured to generate a recovered clock signal based on the non-NRZ data signal, a frequency of the recovered clock signal being within a threshold range associated with a frequency of the non-NRZ data signal or a division of the frequency of the non-NRZ data signal.

In an embodiment, the plurality of sampling circuits is further configured to receive different clock signals, and wherein the different clock signals comprise a first clock signal, a second clock signal, and a third clock signal.

In an embodiment, the second clock signal has a first delay of 180 degrees with respect to the first clock signal.

In an embodiment, the third clock signal has a second delay with respect to the second clock signal, the second delay being between zero degree and 180 degrees.

In an embodiment, the apparatus further comprises a first delay buffer coupled to at least one of the plurality of sampling circuits, and wherein the first delay buffer is configured to provide the second clock signal by delaying the first clock signal by 180 degrees.

In an embodiment, the apparatus further comprises a second delay buffer coupled to the first delay buffer, and wherein the second delay buffer is configured to provide the third clock signal by delaying the second clock signal by an amount between zero degree and 180 degrees.

In an embodiment, the plurality of sampling circuits are further configured to generate a plurality of sampled signals by sampling the non-NRZ data signal according to the different clock signals, wherein the apparatus further comprises a control circuit coupled to the plurality of sampling circuits, and wherein the control circuit is configured to: provide a first control signal indicating whether to decrease a frequency of one of the different clock signals based on the plurality of sampled signals; and provide a second control signal indicating whether to increase the frequency of the one of the different clock signals based on the plurality of sampled signals.

In an embodiment, the plurality of sampling circuits comprise a first sampling circuit, a second sampling circuit, and a third sampling circuit, wherein the first sampling circuit is configured to provide a first sampled data signal by sampling the non-NRZ data signal according to the first clock signal, and wherein the first sampling circuit comprises a first data input port configured to receive the data signal, a first trigger input port configured to receive the first clock signal, and a first data output port configured to output the first sampled data signal.

In an embodiment, the second sampling circuit is configured to provide a second sampled data signal by sampling the non-NRZ data signal according to the second clock signal, and wherein the second sampling circuit comprises a second data input port coupled to the first data input port, a second trigger input port coupled to an output port of the first delay buffer, and a second data output port configured to output the second sampled data signal.

In an embodiment, the third sampling circuit is configured to provide a third sampled data signal by sampling the non-NRZ data signal according to the third clock signal, and wherein the third sampling circuit comprises a third data input port coupled to the first data input port, a third trigger input port coupled to an output port of the second delay buffer, and a third data output port configured to output the third sampled data signal.

In an embodiment, the signal generator is a voltage controlled oscillator.

In an embodiment, there is provided an apparatus comprising: a plurality of sampling circuits configured to generate a plurality of sampled signals by sampling a data signal according to different clock signals; and a signal generator coupled to the plurality of sampling circuits, wherein the signal generator is configured to generate a recovered clock signal based on the plurality of sampled signals, a frequency of the recovered clock signal being within a threshold range associated with a frequency of the data signal or a division of the frequency of the data signal.

In an embodiment, the different clock signals comprise a first clock signal, a second clock signal, and a third clock signal.

In an embodiment, the second clock signal has a first delay of 180 degrees with respect to the first clock signal.

In an embodiment, the third clock signal has a second delay with respect to the second clock signal, the second delay being between zero degree and 180 degrees.

In an embodiment, the apparatus further comprises a first delay buffer coupled to at least one of the plurality of sampling circuits, and wherein the first delay buffer is configured to provide the second clock signal by delaying the first clock signal by 180 degrees.

In an embodiment, the apparatus further comprises a second delay buffer coupled to the first delay buffer, and wherein the second delay buffer is configured to provide the third clock signal by delaying the second clock signal by an amount between zero degree and 180 degrees.

In an embodiment, the apparatus further comprises a control circuit coupled to the plurality of sampling circuits, wherein the control circuit is configured to: provide a first control signal indicating whether to decrease a frequency of one of the different clock signals based on the plurality of sampled signals; and provide a second control signal indicating whether to increase the frequency of the one of the different clock signals based on the plurality of sampled signals.

In an embodiment, the plurality of sampling circuits comprise a first sampling circuit, a second sampling circuit, and a third sampling circuit, wherein the first sampling circuit is configured to provide a first sampled data signal by sampling the data signal according to the first clock signal, and wherein the first sampling circuit comprises a first data input port configured to receive the data signal, a first trigger input port configured to receive the first clock signal, and a first data output port configured to output the first sampled data signal.

In an embodiment, the second sampling circuit is configured to provide a second sampled data signal by sampling the data signal according to the second clock signal, and wherein the second sampling circuit comprises a second data input port coupled to the first data input port, a second trigger input port coupled to an output port of the first delay buffer, and a second data output port configured to output the second sampled data signal.

In an embodiment, the third sampling circuit is configured to provide a third sampled data signal by sampling the data signal according to the third clock signal, and wherein the third sampling circuit comprises a third data input port coupled to the first data input port, a third trigger input port coupled to an output port of the second delay buffer, and a third data output port configured to output the third sampled data signal.

In an embodiment, the signal generator is a voltage controlled oscillator.

In an embodiment, the data signal is a non-Non Return to Zero (non-NRZ) data signal.

In an embodiment, there is provided a method comprising: providing one or more control signals indicating whether to decrease or increase a frequency of a clock signal associated with a non-NRZ data signal based on the non-NRZ data signal.

In an embodiment, the method further comprises receiving the non-NRZ data signal and different clock signals, wherein the one or more control signals are provided based on the non-NRZ data signal and the different clock signals.

In an embodiment, the clock signal is one of the different clock signals, the different clock signals comprising a first clock signal, a second clock signal, and a third clock signal.

In an embodiment, the second clock signal has a first delay of 180 degrees with respect to the first clock signal.

In an embodiment, the third clock signal has a second delay with respect to the second clock signal, and wherein the second delay is between zero degree and 180 degrees.

In an embodiment, the method further comprises providing the second clock signal by delaying the first clock signal by 180 degrees.

In an embodiment, the method further comprises providing the third clock signal by delaying the second clock signal by an amount between zero degree and 180 degrees.

In an embodiment, the method further comprises generating a plurality of sampled signals by sampling the non-NRZ data signal according to the different clock signals, the generating comprises: generating a first sampled data signal by sampling the non-NRZ data signal according to the first clock signal; generating a second sampled data signal by sampling the non-NRZ data signal according to the second clock signal; and generating a third sampled data signal by sampling the non-NRZ data signal according to the third clock signal.

In an embodiment, the method further comprises providing a first synchronized signal, a second synchronized signal, and a third synchronized signal based on the first sampled data signal, the second sampled data signal, the third sampled data signal, and the first clock signal, wherein a time duration between any two transition edges selected from a group consisting of a first transition edge associated with the first synchronized signal, a second transition edge associated with the second synchronized signal, and a third transition edge associated with the third synchronized signal is equal to an integer number of a clock period, and wherein the clock period is inverse of the frequency of one of the different clock signals (e.g., the frequency of the first clock signal). Either of the first transition edge, the second transition edge, and the third transition edge may be a rising edge or a falling edge.

In an embodiment, the method further comprises generating a first characterization signal, a second characterization signal, and a third characterization signal based on the first sampled data signal, the first synchronized signal, the second synchronized signal, and the third synchronized signal, wherein the generating the first characterization signal, the second characterization signal, and the third characterization signal comprises: generating a first XOR signal by performing an XOR operation on the first sampled data signal and the first synchronized signal; generating a second XOR signal by performing the XOR operation on the first synchronized signal and the second synchronized signal; generating a third XOR signal by performing the XOR operation on the first synchronized signal and the third synchronized signal; generating a fourth XOR signal by performing the XOR operating on the first sampled data signal and the third synchronized signal; generating the first characterization signal by performing an AND operation on the first XOR signal and the third XOR signal; generating the second characterization signal by performing the AND operation on the second XOR signal and the third XOR signal; and generating the third characterization signal by performing the AND operation on the first XOR signal and the fourth XOR signal.

In an embodiment, the one or more control signals comprise: a first control signal indicating whether to decrease the frequency of the one of the different clock signals; and a second control signal indicating whether to increase the frequency of the one of the different clock signals.

In an embodiment, the first control signal and the second control signal are provided based on temporal occurrences of a first binary logic level among the first characterization signal, the second characterization signal, and the third characterization signal.

In an embodiment, the method further comprises: generating the first control signal having the first binary logic level; and generating the second control signal having a second binary logic level indicating to decrease the frequency of one of the different clock signals when the first binary logic level occurs in the third characterization signal, followed by at least two consecutive second characterization signals, and followed by the first characterization signal, and wherein the first binary logic level is different from the second binary logic level.

In an embodiment, the method further comprises: generating the first control signal having a second binary logic level; and generating the second control signal having the first binary logic level indicating to increase the frequency of the one of the different clock signals when the first binary logic level occurs in the first characterization signal, followed by at least two consecutive second characterization signals, and followed by the third characterization signal, and wherein the first binary logic level is different from the second binary logic level.

In an embodiment, there is provided a method comprising: generating a recovered clock signal based on a non-NRZ data signal, a frequency of the recovered clock signal being within a threshold range associated with a frequency of the non-NRZ data signal or a division of the frequency of the non-NRZ data signal.

In an embodiment, the method further comprises receiving the non-NRZ data signal and different clock signals, the different clock signals comprising a first clock signal, a second clock signal, and a third clock signal.

In an embodiment, the second clock signal has a first delay of 180 degrees with respect to the first clock signal.

In an embodiment, the third clock signal has a second delay with respect to the second clock signal, and wherein the second delay is between zero degree and 180 degrees.

In an embodiment, the method further comprises generating a plurality of sampled signals by sampling the non-NRZ data signal according to the different clock signals, the generating comprises: generating a first sampled data signal by sampling the non-NRZ data signal according to the first clock signal; generating a second sampled data signal by sampling the non-NRZ data signal according to the second clock signal; and generating a third sampled data signal by sampling the non-NRZ data signal according to the third clock signal.

In an embodiment, the method further comprises providing a first synchronized signal, a second synchronized signal, and a third synchronized signal based on the first sampled data signal, the second sampled data signal, the third sampled data signal, and the first clock signal, wherein a time duration between any two transition edges selected from a group consisting of a first transition edge associated with the first synchronized signal, a second transition edge associated with the second synchronized signal, and a third transition edge associated with the third synchronized signal is equal to an integer number of a clock period, and wherein the clock period is inverse of the frequency of one of the different clock signals (e.g., the frequency of the first clock signal). Either of the first transition edge, the second transition edge, and the third transition edge may be a rising edge or a falling edge.

In an embodiment, the method further comprises generating a first characterization signal, a second characterization signal, and a third characterization signal based on the first sampled data signal, the first synchronized signal, the second synchronized signal, and the third synchronized signal, wherein the generating the first characterization signal, the second characterization signal, and the third characterization signal comprises: generating a first XOR signal by performing an XOR operation on the first sampled data signal and the first synchronized signal; generating a second XOR signal by performing the XOR operation on the first synchronized signal and the second synchronized signal; generating a third XOR signal by performing the XOR operation on the first synchronized signal and the third synchronized signal; generating a fourth XOR signal by performing the XOR operating on the first sampled data signal and the third synchronized signal; generating the first characterization signal by performing an AND operation on the first XOR signal and the third XOR signal; generating the second characterization signal by performing the AND operation on the second XOR signal and the third XOR signal; and generating the third characterization signal by performing the AND operation on the first XOR signal and the fourth XOR signal.

In an embodiment, the method further comprises providing one or more control signals indicating whether to decrease or increase one of the different clock signals, the one or more control signals comprising: a first control signal indicating whether to decrease the frequency of the one of the different clock signals; and a second control signal indicating whether to increase the frequency of the one of the different clock signals.

In an embodiment, the first control signal and the second control signal are provided based on temporal occurrences of a first binary logic level among the first characterization signal, the second characterization signal, and the third characterization signal.

In an embodiment, the method further comprises: generating the first control signal having the first binary logic level; and generating the second control signal having a second binary logic level indicating to decrease the frequency of one of the different clock signals when the first binary logic level occurs in the third characterization signal, followed by at least two consecutive second characterization signals, and followed by the first characterization signal, and wherein the first binary logic level is different from the second binary logic level.

In an embodiment, the method further comprises: generating the first control signal having a second binary logic level; and generating the second control signal having the first binary logic level indicating to increase the frequency of the one of the different clock signals when the first binary logic level occurs in the first characterization signal, followed by at least two consecutive second characterization signals, and followed by the third characterization signal, and wherein the first binary logic level is different from the second binary logic level.

Figure 22:
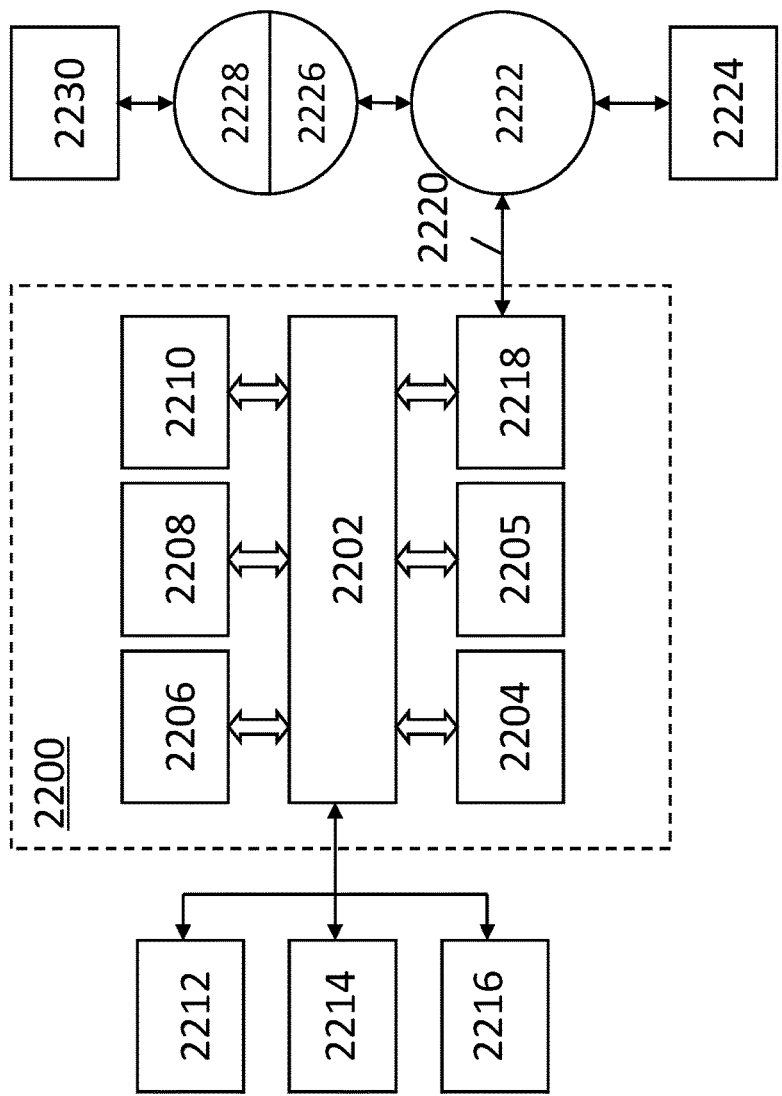
FIG. 22 depicts a general computer architecture on which the disclosure can be implemented.

Referring to FIG. 22, a computer system 2200 is shown. The computer system 2200 includes a bus 2202 or other communication mechanism to communicate information, and a processor 2204 (or multiple processors 2204 and 2205) coupled with bus 2202 to process information. In an embodiment, the computer system 2200 includes a main memory 2206, such as a random access memory (RAM) or other dynamic storage device, coupled to the bus 2202 to store information and instructions to be executed by the processor 2204. The main memory 2206 may be used to store temporary variables or other intermediate information during execution of instructions to be executed by the processor 2204. In an embodiment, the computer system 2200 includes a read only memory (ROM) 2208 or other static storage device coupled to the bus 2202 to store essentially static information and instructions for the processor 2204. In an embodiment, a storage device 2210, such as a solid state drive, magnetic disk or optical disk, is provided and coupled to the bus 2202 to store information and instructions.

The computer system 2200 may be coupled via the bus 2202 to a display 2212, such as a cathode ray tube (CRT) or flat panel or touch panel display, to display information to a computer user. In an embodiment, an input device 2214, including or providing alphanumeric and other keys, is coupled to the bus 2202 to communicate information and command selections to the processor 2204. Another type of user input device is a cursor control 2216, such as a mouse, a trackball, or cursor direction keys, to communicate direction information and command selections to the processor 2204 and to control cursor movement on the display 2212. A touch panel (screen) display may also be used as an input device.

The computer system 2200 may be suitable to implement methods as described herein in response to the processor 2204 executing one or more sequences of one or more instructions contained in, e.g., the main memory 2206. Such instructions may be read into main memory 2206 from another computer-readable medium, such as the storage device 2210. In an embodiment, execution of sequences of instructions contained in the main memory 2206 causes the processor 2204 to perform process steps described herein. One or more processors in a multi-processing arrangement may be employed to execute the sequences of instructions contained in the main memory 2206. In an embodiment, a hard-wired circuitry may be used in place of or in combination with software instructions. Thus, embodiments are not limited to any specific combination of hardware circuitry and software.

The term "computer-readable medium" as used herein refers to any medium that participates in providing instructions to the processor 2204 for execution. Such a medium may take many forms, including but not limited to, non-volatile media, volatile media, and transmission media. Non-volatile media include, for example, solid state, optical or magnetic disks, such as the storage device 2210. Volatile media include dynamic memory, such as the main memory 2206. Non-volatile and volatile media are considered non-transitory. Non-transitory transmission media include coaxial cables, copper wire and fiber optics, including the wires that comprise the bus 2202. Transmission media can also take the form of acoustic or light waves, such as those generated during RF and infrared (IR) data communications. Common forms of computer-readable media include, for example, a floppy disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, a solid state disk or any other memory chip or cartridge, a carrier wave as described herein, or any other medium from which a computer can read.

Various forms of computer readable media may be involved in carrying one or more sequences of one or more instructions to the processor 2204 for execution. For example, the instructions may initially be borne on a magnetic disk of a remote computer. The remote computer can load the instructions into its dynamic memory and send the instructions over communications medium (e.g., by line or wireless). The computer system 2200 can receive the transmitted data and place the data on the bus 2202. The bus 2202 carries the data to the main memory 2206, from which the processor 2204 retrieves and executes the instructions. The instructions received by the main memory 2206 may optionally be stored on the storage device 2210 either before or after execution by the processor 2204.

The computer system 2200 may also include a communication interface 2218 coupled to the bus 2202. The communication interface 2218 provides a two-way data communication coupling to a network link 2220 that is connected to a local network 2222. For example, the communication interface 2218 may be an integrated services digital network (ISDN) card or a modem to provide a data communication connection to a corresponding type of line. As another example, the communication interface 2218 may be a local area network (LAN) card to provide a data communication connection to a compatible LAN. Wireless links may also be implemented. In any such implementation, the communication interface 2218 sends and receives electrical, electromagnetic or optical signals that carry digital data streams representing various types of information.

The network link 2220 typically provides data communication through one or more networks to other data devices. For example, the network link 2220 may provide a connection through the local network 2222 to a host computer 2224 or to data equipment operated by an Internet Service Provider (ISP) 2226. The ISP 2226 in turn provides data communication services through the worldwide packet data communication network, commonly referred to as the internet 2228. The local network 2222 and the internet 2228 both use electrical, electromagnetic or optical signals that carry digital data streams. The signals through the various networks and the signals on the network link 2220 and through the communication interface 2218, which carry the digital data to and from the computer system 2200, are exemplary forms of carrier waves transporting the information.

The computer system 2200 can send messages and receive data, including program code, through the network(s), the network link 2220, and the communication interface 2218. In the internet example, a server 2230 might transmit a requested code for an application program through the internet 2228, the ISP 2226, the local network 2222 and the communication interface 2218. In accordance with one or more embodiments, one such downloaded application implements a method as described herein. The received code may be executed by the processor 2204 as it is received, and/or stored in the storage device 2210, or other non-volatile storage for later execution. In this manner, the computer system 2200 may obtain application code.

An embodiment may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the optical vector analyzer. The controllers may each or in combination have any suitable configuration for receiving, processing, and sending signals.

One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Those skilled in the art will recognize that the present disclosure is amenable to a variety of modifications and/or enhancements. For example, although the implementation of various components described above may be embodied in a hardware device, it can also be implemented as a firmware, firmware/software combination, firmware/hardware combination, or a hardware/firmware/software combination.

While the foregoing description and drawings represent embodiments of the present disclosure, it will be understood that various additions, modifications, and substitutions may be made therein without departing from the spirit and scope of the principles of the present disclosure as defined in the accompanying claims. One skilled in the art will appreciate that the present disclosure may be used with many modifications of form, structure, arrangement, proportions, materials, elements, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the present disclosure being indicated by the appended claims and their legal equivalents, and not limited to the foregoing description.

What is claimed is:

1. An apparatus comprising:
   a plurality of sampling circuits configured to generate a plurality of sampled signals by sampling a data signal according to different clock signals, the different clock signals comprising a first clock signal, a second clock signal, and a third clock signal;
   a first delay buffer coupled to a first one of the plurality of sampling circuits, the first delay buffer configured to provide the second clock signal based on the first clock signal, wherein the second clock signal has a first delay of 180 degrees with respect to the first clock signal;
   a second delay buffer coupled to a second one of the plurality of sampling circuits, the second delay buffer configured to provide the third clock signal, wherein the third clock signal has a second delay with respect to the second clock signal, the second delay being between zero degree and 180 degrees;
   a synchronization circuit coupled to the plurality of sampling circuits, wherein the synchronization circuit is configured to provide a plurality of synchronized signals based on the plurality of sampled signals and one of the different clock signals, wherein a time duration between any two transition edges corresponding to any two of the plurality of synchronized signals is equal to an integer number of a clock period, wherein the clock period is inverse of a frequency of the one of the different clock signals, and wherein one of the any two transition edges is a rising edge or a falling edge; and
   a signal generator coupled to the synchronization circuit, wherein the signal generator is configured to generate a recovered clock signal based on the plurality of synchronized signals, a frequency of the recovered clock signal being within a threshold range associated with a frequency of the data signal or a division of the frequency of the data signal.

2. The apparatus of claim 1, wherein the first delay buffer is configured to provide the second clock signal by delaying the first clock signal by 180 degrees.

3. The apparatus of claim 2, wherein the second delay buffer is further coupled to the first delay buffer, and wherein the second delay buffer is configured to provide the third clock signal by delaying the second clock signal by an amount between zero degree and 180 degrees.

4. The apparatus of claim 3, further comprising a control circuit coupled to the plurality of sampling circuits, wherein the control circuit is configured to:
   provide a first control signal indicating whether to decrease a frequency of one of the different clock signals based on the plurality of sampled signals; and
   provide a second control signal indicating whether to increase the frequency of the one of the different clock signals based on the plurality of sampled signals.

5. The apparatus of claim 4, wherein the plurality of sampling circuits comprise a first sampling circuit, a second sampling circuit, and a third sampling circuit, wherein the first sampling circuit is configured to provide a first sampled data signal by sampling the data signal according to the first clock signal, and wherein the first sampling circuit comprises a first data input port configured to receive the data signal, a first trigger input port configured to receive the first clock signal, and a first data output port configured to output the first sampled data signal.

6. The apparatus of claim 5, wherein the second sampling circuit is configured to provide a second sampled data signal by sampling the data signal according to the second clock signal, and wherein the second sampling circuit comprises a second data input port coupled to the first data input port, a second trigger input port coupled to an output port of the first delay buffer, and a second data output port configured to output the second sampled data signal.

7. The apparatus of claim 6, wherein the third sampling circuit is configured to provide a third sampled data signal by sampling the data signal according to the third clock signal, and wherein the third sampling circuit comprises a third data input port coupled to the first data input port, a third trigger input port coupled to an output port of the second delay buffer, and a third data output port configured to output the third sampled data signal.

8. The apparatus of claim 7, wherein the signal generator is a voltage controlled oscillator.

9. The apparatus of claim 8, wherein the data signal is a non-Non Return to Zero (non-NRZ) data signal.

10. The apparatus of claim 9, wherein the synchronization circuit is configured to provide a first synchronized signal, a second synchronized signal, and a third synchronized signal based on the first sampled data signal, the second sampled data signal, the third sampled data signal, and the first clock signal, wherein a second time duration between any two transition edges selected from a group consisting of a first transition edge associated with the first synchronized signal, a second transition edge associated with the second synchronized signal, and a third transition edge associated with the third synchronized signal is equal to a second integer number of the clock period, and wherein one of the first transition edge, the second transition edge, and the third transition edge is a rising edge or a falling edge.

11. The apparatus of claim 10, wherein the synchronization circuit comprises a first digital sampling circuit, a second digital sampling circuit, and a third digital sampling circuit, each of the first digital sampling circuit, the second digital sampling circuit, and the third sampling circuit comprising at least one D-type flip flop, wherein a data input port of the first digital sampling circuit is coupled to the first data output port, and a trigger input port of the first digital sampling circuit is coupled to the first trigger input port.

12. The apparatus of claim 11, wherein a data input port of the second digital sampling circuit is coupled to the second data output port, and a trigger input port of the second digital sampling circuit is coupled to the first trigger input port.

13. The apparatus of claim 12, wherein a data input port of the third digital sampling circuit is coupled to the third data output port, and a trigger input port of the third digital sampling circuit is coupled to the first trigger input port.

14. The apparatus of claim 13, further comprising a characterization signal generation circuit coupled to the synchronization circuit, wherein the characterization signal generation circuit is configured to generate a first characterization signal, a second characterization signal, and a third characterization signal based on the first sampled data signal, the first synchronized signal, the second synchronized signal, and the third synchronized signal.

15. The apparatus of claim 14, wherein the characterization signal generation circuit comprises a first XOR operator configured to provide a first XOR signal by performing an XOR operation on the first sampled data signal and the second synchronized signal, wherein the characterization signal generation circuit further comprises a second XOR operator configured to provide a second XOR signal by performing the XOR operation on the first synchronized signal and the second synchronized signal, wherein the characterization signal generation circuit further comprises a third XOR operator configured to provide a third XOR signal by performing the XOR operation on the first synchronized signal and the third synchronized signal, wherein the characterization signal generation circuit further comprises a fourth XOR operator configured to provide a fourth XOR signal by performing the XOR operation on the first sampled data signal and the third synchronized signal, and wherein each of the first XOR operator, the second XOR operator, the third XOR operator, and the fourth XOR operator comprises at least one XOR gate.

16. The apparatus of claim 15, wherein the characterization signal generation circuit further comprises a first AND gate configured to provide a first characterization signal by performing an AND operation on the first XOR signal and the third XOR signal, wherein a first input port of the first AND gate is coupled to an output port of the first XOR operator, and wherein a second input port of the first AND gate is coupled to an output port of the third XOR operator.

17. The apparatus of claim 16, wherein the characterization signal generation circuit further comprises a second AND gate configured to provide a second characterization signal by performing the AND operation on the second XOR signal and the third XOR signal, wherein a first input port of the second AND gate is coupled to an output port of the second XOR operator, wherein a second input port of the second AND gate is coupled to the output port of the third XOR operator, and wherein the characterization signal generation circuit further comprises a third AND gate configured to provide a third characterization signal by performing the AND operation on the first XOR signal and the fourth XOR signal, wherein a first input port of the third AND gate is coupled to the output port of the first XOR operator, and wherein a second input port of the third AND gate is coupled to the output port of the fourth XOR operator.

* * * * *